(12) United States Patent
Dewaele et al.

(10) Patent No.: US 12,170,037 B2
(45) Date of Patent: Dec. 17, 2024

(54) ALIGNMENT FOR TILES OF TILED DISPLAYS

(71) Applicant: BARCO N.V., Kortrijk (BE)

(72) Inventors: Tom Adriaan Gerard Dewaele, Antwerp (BE); Nico Michael Naas, Karlsruhe (DE)

(73) Assignee: BARCO N.V., Kortrijk (BE)

( * ) Notice: Subject to any disclaimer, the term of this patent is extended or adjusted under 35 U.S.C. 154(b) by 420 days.

(21) Appl. No.: 17/298,665

(22) PCT Filed: Nov. 29, 2019

(86) PCT No.: PCT/EP2019/083169
§ 371 (c)(1),
(2) Date: May 31, 2021

(87) PCT Pub. No.: WO2020/109598
PCT Pub. Date: Jun. 4, 2020

(65) Prior Publication Data
US 2022/0022330 A1 Jan. 20, 2022

Related U.S. Application Data

(60) Provisional application No. 62/772,690, filed on Nov. 29, 2018.

(51) Int. Cl.
*G09F 9/302* (2006.01)
*F16M 11/04* (2006.01)
(Continued)

(52) U.S. Cl.
CPC ......... *G09F 9/3026* (2013.01); *F16M 11/048* (2013.01); *F16M 11/10* (2013.01);
(Continued)

(58) Field of Classification Search
CPC .... G09F 9/3026; G09F 3/32; G09F 2300/026; F16M 11/04; F16M 11/16; F16M 11/048;
(Continued)

(56) References Cited

U.S. PATENT DOCUMENTS 3,894,445 A 7/1975 Rowe
7,055,271 B2 6/2006 Lutz et al.
(Continued)

FOREIGN PATENT DOCUMENTS

CA 2912044 A1 5/2016
CN 102402909 A 4/2012
(Continued)

OTHER PUBLICATIONS

Office Action and Search Report issued in Taiwanese Application No. 107128845, dated Feb. 23, 2022, with English translation.
(Continued)

*Primary Examiner* — Moshe Wilensky
(74) *Attorney, Agent, or Firm* — HSML P. C.

(57) ABSTRACT

Tiled displays having display tiles, are described as well as methods of making and/or operating tiled displays and tiles. Methods and devices are described for a tiled display having tiles lying in an X-Y plane, the methods and devices being for setting or adjusting the position of neighbouring tiles in a tiled display to reduce differences in the Z direction between tiles of a tiled display, whereby the tiles lie in the X-Y plane.

18 Claims, 37 Drawing Sheets

(51) Int. Cl.
  *F16M 11/10* (2006.01)
  *F16M 11/18* (2006.01)
  *F16M 13/02* (2006.01)
  *H05K 5/00* (2006.01)
  *H05K 5/02* (2006.01)
(52) U.S. Cl.
  CPC ............ *F16M 11/18* (2013.01); *F16M 13/02* (2013.01); *H05K 5/0017* (2013.01); *H05K 5/0021* (2013.01); *H05K 5/0217* (2013.01)
(58) Field of Classification Search
  CPC ........ F16M 11/10; F16M 11/18; F16M 13/02; H05K 5/0017; H05K 5/0021; H05K 5/0217; G06F 3/147; G06F 3/1446; G06F 3/32
  See application file for complete search history.

(56) References Cited

U.S. PATENT DOCUMENTS

| | | |
|---|---|---|
| 7,869,198 B1 | 1/2011 | Nearman et al. |
| 8,384,616 B2 | 2/2013 | Elliott et al. |
| 8,992,110 B2 | 3/2015 | Decroos et al. |
| 9,886,877 B2 | 2/2018 | Furihata et al. |
| 2003/0217495 A1 | 11/2003 | Nagamine et al. |
| 2005/0081414 A1 | 4/2005 | Lutz |
| 2006/0236329 A1 | 10/2006 | Sugiura et al. |
| 2009/0295174 A1 | 12/2009 | Corrales et al. |
| 2012/0224311 A1 | 9/2012 | Sutherland et al. |
| 2014/0259634 A1 | 9/2014 | Cox et al. |
| 2015/0267907 A1 | 9/2015 | Thompson et al. |
| 2017/0003570 A1 | 1/2017 | Harris et al. |
| 2017/0033154 A1 | 2/2017 | Lan et al. |
| 2017/0083273 A1 | 3/2017 | Kim et al. |
| 2017/0127539 A1 | 5/2017 | Drabant et al. |
| 2020/0057594 A1 | 2/2020 | Nakano |

FOREIGN PATENT DOCUMENTS

| | | |
|---|---|---|
| CN | 102959606 A | 3/2013 |
| CN | 203465906 U | 3/2014 |
| CN | 104723074 A | 6/2015 |
| CN | 105940440 A | 9/2016 |
| CN | 106463083 A | 2/2017 |
| CN | 206194304 U | 5/2017 |
| CN | 206282554 U | 6/2017 |
| DE | 102015001531 A1 | 8/2016 |
| EP | 2636937 B1 | 7/2016 |
| EP | 3059725 A1 | 8/2016 |
| GB | 2528029 A | 1/2016 |
| TW | I474298 B | 2/2015 |
| TW | M597496 U | 6/2020 |
| WO | 2009152524 A2 | 12/2009 |
| WO | 2013192614 A2 | 12/2013 |
| WO | 2019034786 A1 | 2/2019 |

OTHER PUBLICATIONS

International Search Report and Written Opinion issued in PCT/EP2019/083169, mailed Jul. 24, 2020, 19 pages provided.
Communication issued in European Application No. 18762780.7, dated Mar. 17, 2023.
Examination Report issued in Indian Application No. 202117024900, dated Jan. 24, 2023, with English translation.
Office Action issued in U.S. Appl. No. 17/931,342, dated Jan. 17, 2023.
Extended European Search Report for European Application No. 17186982.9, dated Nov. 6, 2017.
International Search Report and Written Opinion for related PCT Application No. PCT/EP2018/072352, dated Dec. 4, 2018.
Office Action in corresponding Chinese Application No. 201821339222.6, dated Apr. 23, 2019, with brief English translation.
Office Action in corresponding Taiwan Application No. 10840597860, dated May 2, 2019, with brief English translation.
International Preliminary Report on Patentability in corresponding PCT Application No. PCT/EP2018/072352, dated Dec. 3, 2019.
Office Action in corresponding Chinese Application No. 202020379761.3, dated Oct. 12, 2020, with English translation.
Office Action in U.S. Appl. No. 16/305,122 dated Aug. 24, 2021.
Office Action issued in corresponding Chinese Application No. 201911198453.9, dated Oct. 27, 2022, with English machine translation.
Office Action issued in corresponding Chinese application No. 201810947213.3, dated Apr. 26, 2021, with English translation, 32 pages provided.
Office Action issued in corresponding Chinese Application No. 201810947213.3, dated Mar. 15, 2022, with English translation.
Commuication issued in corresponding European Patent Application No. 19817609.1, dated Jul. 26, 2023, 5 pages.
Office Action issued in Taiwanese Application No. 108143738, dated Feb. 19, 2024, with machine translation.

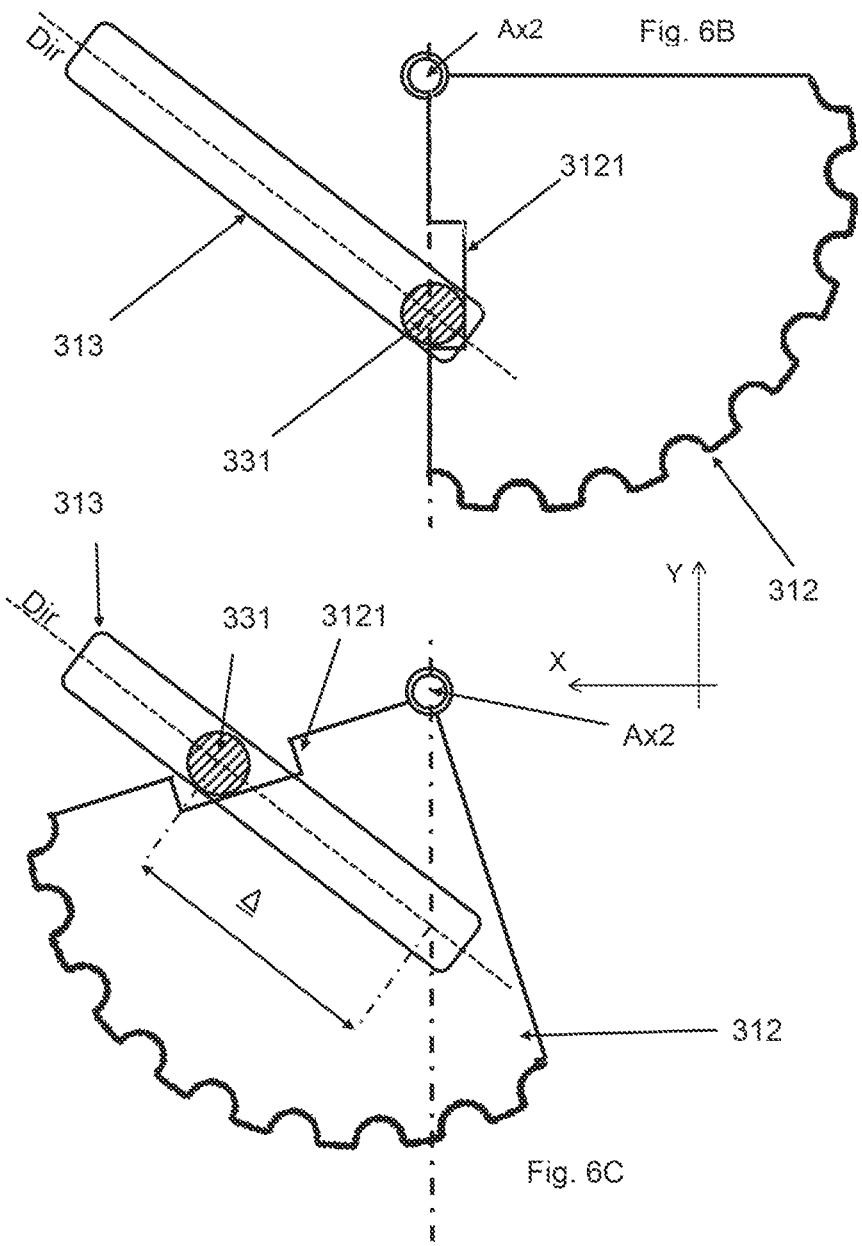

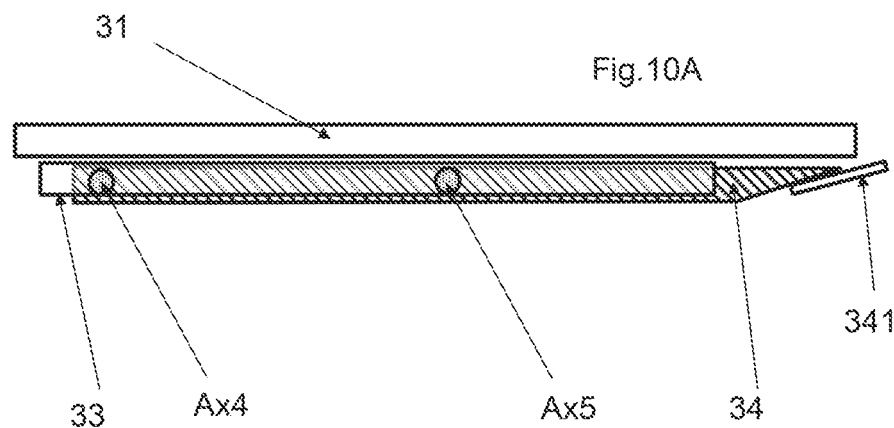
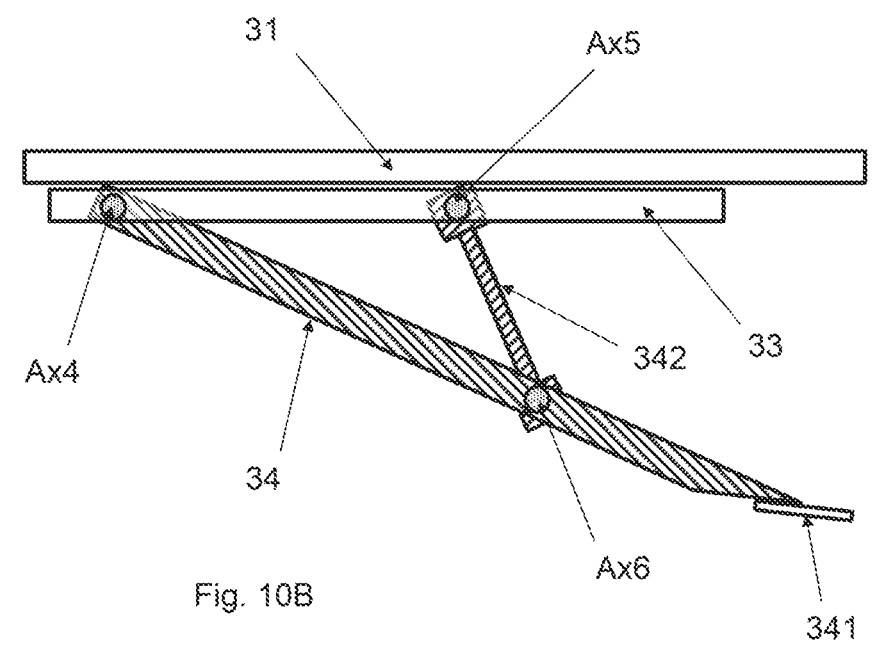

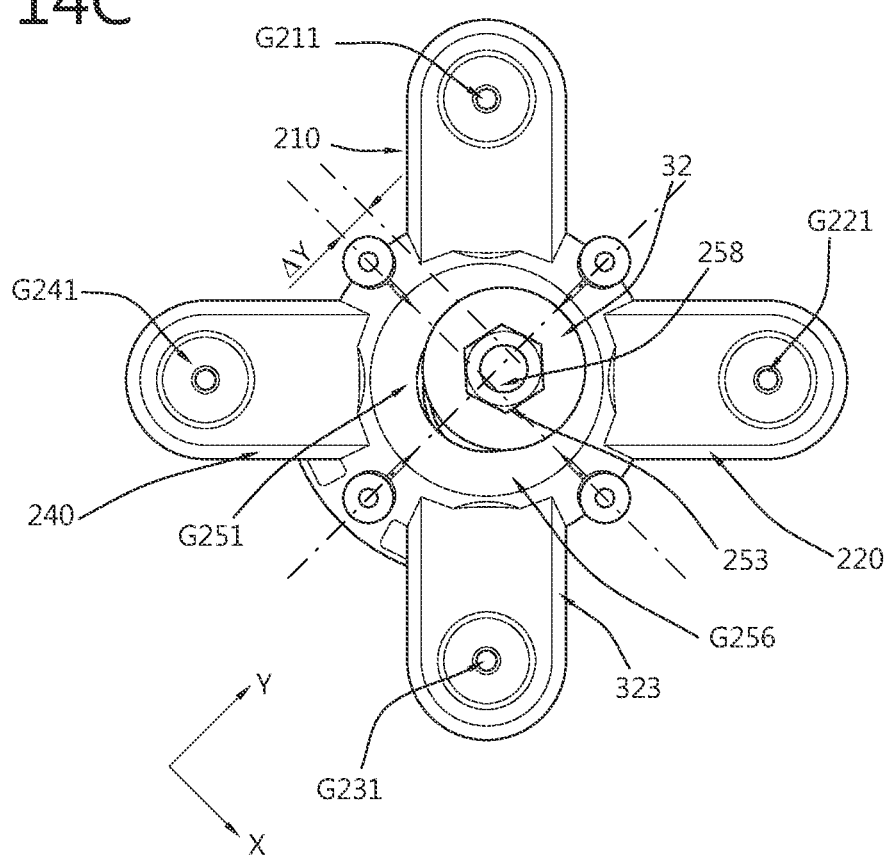

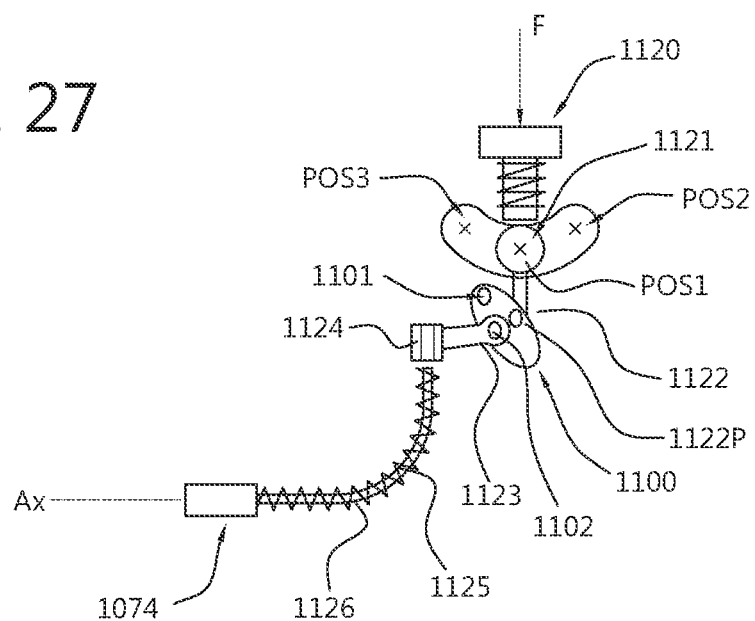
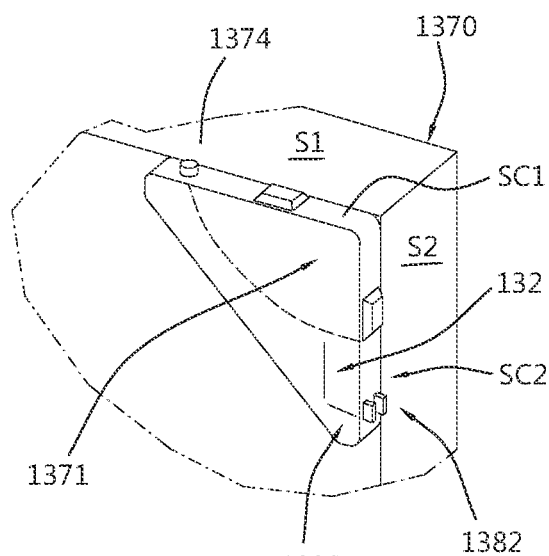
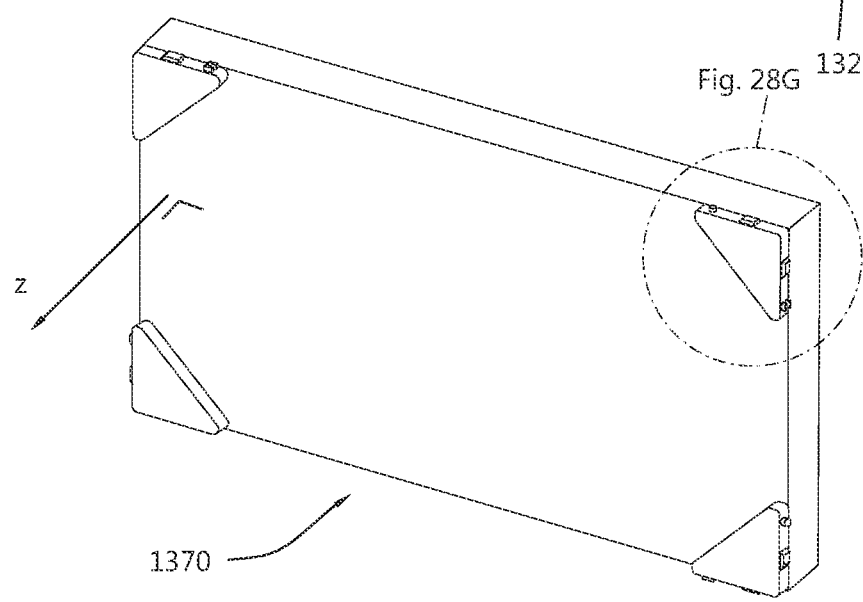

Fig. 28B
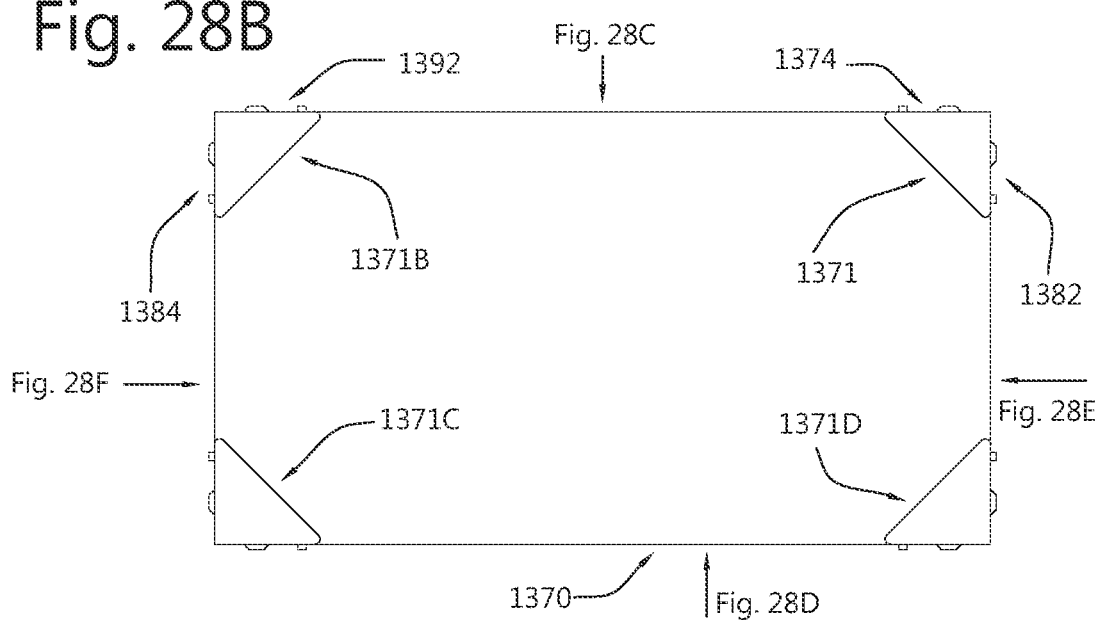
Fig. 28C
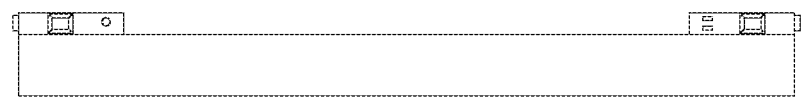
Fig. 28D
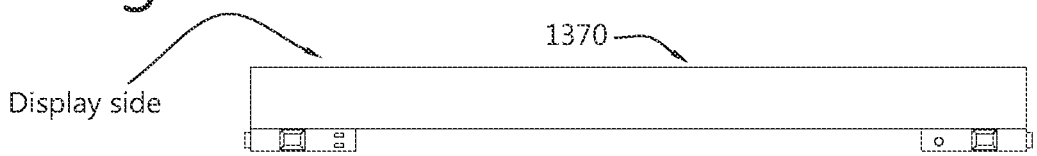
Fig. 28E         Fig. 28F
 

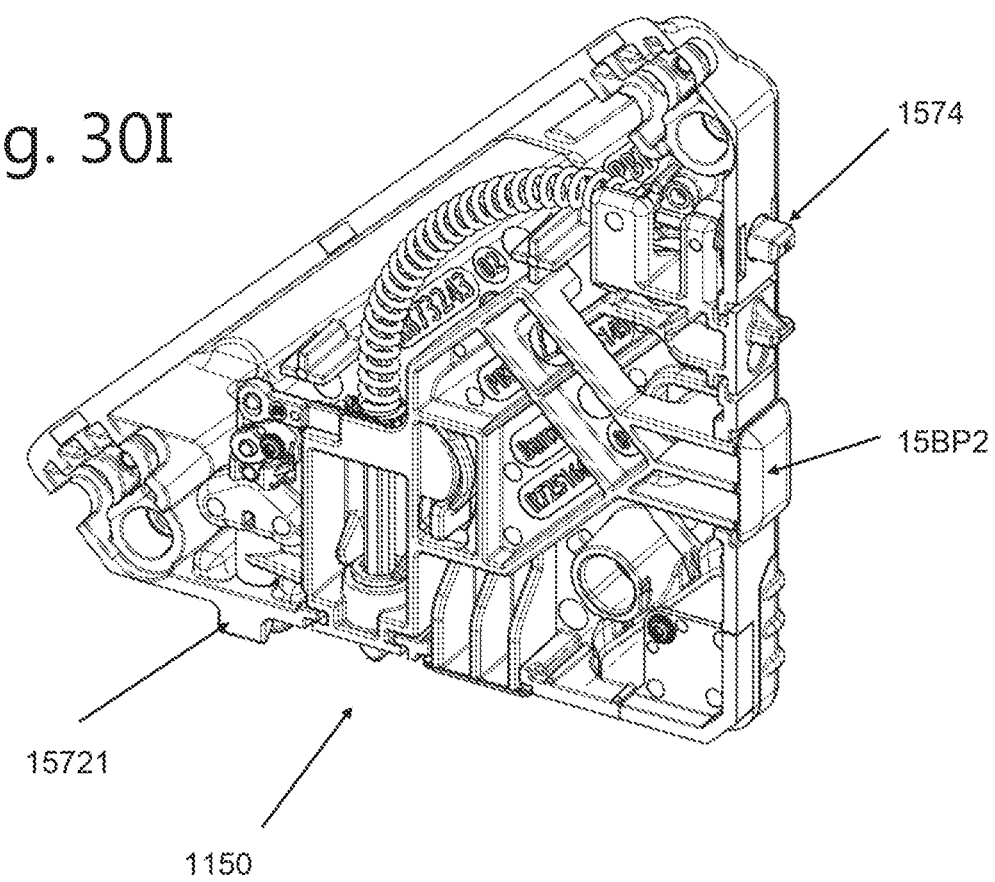

ALIGNMENT FOR TILES OF TILED DISPLAYS

The present invention relates to tiled displays, to display tiles, to methods of making and/or operating tiled displays and tiles, to methods and devices for a tiled display having tiles lying in an X-Y plane (Y being vertical), the methods and devices being for adjusting the position of neighbouring tiles in a tiled display to reduce differences in the Z direction between tiles of a tiled display. The present invention also relates to adjustable supports for display tiles, as well as arrays of display tiles that have adjustable supports.

BACKGROUND

The problem of the alignment of the tiles in a tiled display is well known in the art. Alignment of the tiles is important to avoid introducing visual artefacts in the images displayed by the tiled display. Not only must tiles be parallel but the space between them, the seam, must have the same width throughout the tiled display.

The width of the seam may vary in function of the position on the tiled display because of e.g. tolerances in the dimensions of the profiles or beams that are assembled to form a support structure for the tiles of the tiled display.

Tiles can e.g. be fastened to the support structure by means of bolts and nuts. Tolerances on the position of the holes through which the bolts have to engage can also contribute to the variation of the seams.

It is possible, that the beams of the support structure may not be perfectly aligned which will have an impact on the alignment of the tiles. This will also contribute to variation of the width of the seam along a side of the same tile.

While several solutions exist to align the tiles of a tiled display, they either require complex mechanical connections between tiles as in U.S. Pat. No. 8,384,616 B2 or are time consuming to install and adjust.

The regularity of the seam existing between display tiles in a tiled display is important to avoid visual artefacts. The regularity of the seam is a function of the alignment of the display tile. Techniques and apparatuses to align display tiles in tiled displays are known in the art. For instance, U.S. Pat. No. 8,384,616 B2 describes how clips and receptacles are used to align adjacent display tiles with a high accuracy.

These and similar tile alignment techniques suppose that the LED themselves are properly aligned with the tile itself.

The LEDs are soldered to a LED board and the LED board is fastened to a carrier board. Aligning the LED board and the carrier board is usually done by means of one or more reference pin(s). The reference pin(s) is/are used to align the LED board with one or more references (e.g. a corner) of the carrier board. Unfortunately, there are tolerances on the position of the LEDs with respect to the LED board on which they are soldered and therefore, aligning the LED board perfectly with the carrier board by means of reference pins on the LED board does not mean that the LED themselves will be perfectly aligned with the carrier board. As a result, even if adjacent LED tiles are perfectly aligned, the relative position of the LEDs on different LED tiles may vary across a tiled display, thereby introducing visual artefacts.

Another problem not addressed by the clips and receptacles used in the prior art is the "z-coordinate" or position of the LED in a direction perpendicular to the plane of the LED board. Variation of the z position of the LED from tile to tile is the source of visual artefacts when the direction of a viewer's gaze is not perpendicular to the plane of a tiled display.

What is needed is a solution to adjust the distance between the top of the LEDs on the LED board and a reference, e.g. the back surface of the carrier board.

It is known in the art to adjust the distance between two objects fastened together with e.g. screws and bolts by adding washers between the two objects. The problem with this technique is that varying the distance between two objects is only possible by multiples of the thickness of the washers if off-the shelf washers are used or that the washers have to be machined for every LED board in function of the actual distance between the LED and the LED board. This is neither practical nor economical.

A similar problem exists with tiled liquid crystal display panels. As the size of the seam between panels decreases, it becomes more and more important to have adjacent panels as co-planar as possible.

At the same time that adjacent tiles must be aligned to a higher degree of precision, it must be possible to easily service the panels. It is thus important to have fastening and alignment mechanisms that are compatible with the mechanism used to access the electronics supplying power, control and data signals to the liquid crystal panel.

Four general approaches can be found in the prior art that address servicing of tiled displays.

The first is the front access via display faces (see FIG. 1A).

This is a relatively new approach where the entire sign face hinges open to reveal the components. This design has initially appealed to many customers and manufacturers trying to find an innovative solution for service and repair. The main issue is panel door size limitation. Beyond a certain size, the weight of the panel can become a danger to the technician servicing the display. In particular, if the display is mounted along a facade of a building several meters or even tens of meters above the ground.

The second approach is front access doors (see FIG. 1B). This approach is similar to the access face approach but uses smaller doors over multiple sections of a sign. For safety reasons, it is better to limit the weight of each section to a few kilograms. In addition, the hinge and the door movement requires a minimum size of the seam around the door.

A third approach is Rear Access Doors. This approach cannot be applied to LED displays mounted on the façade of a building.

The fourth approach is front access LED Panels.

Individual LED modules or panels can be removed from the tiled display to access the components.

Examples of front access LED panels can be found in e.g. U.S. Pat. No. 7,055,271 B2 "Electronic display module having a four-point latching system for incorporation into an electronic sign and process".

When one of the tiles must be removed for inspection, maintenance and/or be replaced, the solution proposed in U.S. Pat. No. 7,055,271 makes use of a tool to trigger a release mechanism. When triggered, the release mechanism allows the tile to be moved outside of the plane of the tiled display either by rotation or translation. This gives direct access to the structure behind the display tile and in particular the fastening means with which the tile is fastened to the support structure of the tiled display. Whether it is two or four bars along which the display tile can slide, or hinges to rotate the tile away from the tiled display as on FIG. 1B; the release mechanism adds to the weight of the display and is not compatible with display tiles that must be bent.

As discussed in U.S. Pat. No. 9,886,877B2, it is known to the art that variation of the z position of the LEDs (or more generally the points at which light exits from a tile) from tile to tile, is a source of visual artefacts when the direction of a viewer's gaze is not along the normal to the plane of a tiled display.

U.S. Pat. No. 9,886,877B2 describes how to adjust the position of the LEDs of a display tile in a direction perpendicular to the plane of the tile, thereby minimizing variation from tile to tile.

Adjusting the relative position of LEDs on a LED board with respect to a carrier board will improve the alignment of tiles in tiled displays. Nevertheless, the end result still depends on the precise alignment of the respective carrier boards with respect to each other.

US20170083273 "display device and multi display device comprising the same" describes a display device comprising a display panel P with a panel support frame PSF. The panel support frame has a plurality of guide protrusions GP inserted at predetermined locations. Each of the plurality of guide protrusions includes an insertion groove open to receive a guide member configured to connect the display device with another display device.

FIG. 16 shows a first display module DM1 (with a display panel DP1 and a Panel Support frame PSF1) and a second display module DM2 (with a display panel DP2 and a Panel Support frame PSF2) that are tiled together. FIG. 17 shows a cross section along the line IV IV' of FIG. 16. A connection member CM connects the first display module DM1 and the second display module DM2 with each other. The connection member CM is coupled to the guide protrusions GP1 and GP2 provided in each of the first display module DM1 and the second display module DM2. In this case, as illustrated on FIG. 18 which shows a cross section of DM1 only, the guide protrusion GP has an insertion groove IG, and the connection member CM is inserted into the insertion groove IG.

As can be seen on the cross section on FIG. 17, using a connection member CM will help align the display surfaces of both DM1 and DM2. In other words, if the display panels DM1 and DM2 are identical, once they are connected by at least two connection members along their common side, their display surfaces are co-planar.

The connection member CM connects the first display module DM1 and the second display module DM2 with each other. The connection member CM is inserted into the guide protrusions GP provided in each of the first display module DM1 and the second display module DM2.

As illustrated on FIGS. 18 and 19, the guide protrusion GP and the coupling member CM fit each other and impose a strong kinetic coupling. With a single cylinder shaped coupling member CM and a matching insertion groove IG, the display panel DM2 loses 3 degrees of freedom once coupled to the display panel DM1. With 2 coupling members, the display panel DM2 has lost 6 degrees of freedom and its position in space is entirely determined. If more than 2 display panels must be tiled together and aligned with each other by means of coupling members as described above, this will mean that the system can end up being overconstrained or overdefined.

Let us model a display module DM as a rectangular parallelepiped as on FIG. 20. The position in space of the display module DM is determined by 6 degrees of freedom or DOFs. One could use e.g. the coordinates (x1, y1, z1) of a vertex V1 of the rectangular parallelepiped and the Euler angles or the coordinates (x1, y1, z1) and (x2, y2, z2) of two vertices V1 and V2 of the rectangular parallelepiped. Once the DOF are determined, the coordinates of all the points of the rectangular parallelepiped are determined.

If for instance, the face F1 of the rectangular parallelepiped is parallel to the plane Oxy and if the vertices V1 and V2 are in the plane Oxy (i.e. if z1=0 and z2=0) all the other points of F1 (like e.g. V3) are such that z3=0 and z4=0 as well. The only possibility to have z3≠0 is to deform the parallelepiped DM. FIG. 21 illustrates what would happen if an adjacent tile has its face F1' outside of the plane Oxy (i.e. the points of F1' are such that their z coordinate is >0): either it will be impossible to engage the coupling member if it is rigid or the coupling member and/or one the display tile will deform. This will induce stresses in the support frame and in the display panel. Display panels being made of glass, the stress can be high enough to crack the glass. If neither the coupling member nor the display tiles can deform, it will be impossible to tile the display tiles in the Oxy plane.

The offset Off between the adjacent display surfaces cannot be excluded. Tolerances can stack-up in different parts of the tiles display leading to an over-constrained/over-defined mechanical system.

Once engaged in the guide protrusions, the connection member will restrict the relative motion not only in the z direction but in the x and y direction as well. It may be advantageous to still be able to displace adjacent tiles in a plane parallel to the display plane e.g. for maintenance purposes as described in patent application PCT/EP2018/072352 "Adjustable Support Structure for Display Tile".

Situations where mechanical stress in the display panels must be reduced or avoided and/or when adjacent tiles must be displaced, connection members CM as described in US20170083273 are not practical.

Granted patent EP2636937 B1 discloses the use of kinematic pairs in a large-sized display screen coordinating device in six degrees of freedom. It comprises three identical mechanical arms disposed equidistantly and parallel to one another. In each mechanical arm, a column pivoting kinematic pair that can pivot about axis Y is provided respectively at the top and bottom ends of the vertically provided support column; one end of a tension arm is provided on a side face of the vertical support column via a tension arm pivoting kinematic pair; a first pivoted arm is fitted and connected to the free end of the tension arm via a first pivoting kinematic pair; a second pivoted arm is fitted and connected to the free end of the first pivoted arm via a second pivoting kinematic pair; a third pivoted arm is fitted and connected to the free end of the second pivoted arm via a third pivoting kinematic pair; and the third pivoted arm is fitted and connected to a display screen via a display screen pivoting kinematic pair.

The art needs improvement.

SUMMARY OF THE INVENTION

It is a purpose of the present invention to provide an alignment device and/or a method for adjusting adjacent display tiles in a direction perpendicular to the display plane of a tiled display. Embodiments of the present invention provide more than one such alignment device and/or method.

The display tiles can form a flat surface for the display or, optionally, the display tiles can form a curved surface. It is a separate purpose of the invention to provide improved means and methods to access display tiles in a tiled display and/or to maintain them.

It is helpful to define a co-ordinate system for the display such as three orthonormal axes X, Y, Z with the Y axis being aligned with the vertical, the X axis being aligned with the horizontal so that the planes of the display tiles are parallel to or lie in an XY plane. The Z axis extends out of the display tile at 90° to the XY plane.

In a first aspect, embodiments of the present invention relate to each display tile (500) of a tiled display (which can include an alignment device in the Z direction) being fastened to a support structure by means of at least one second support substructure (33) to which the display tile can be fastened, the at least one second support substructure (33) being characterized in that it is linked to the support structure by means of a first mechanism allowing movements of the display tile in a plane parallel to the nominal plane (XY) of the tiled display.

The movements of the display tile in a plane parallel to the nominal plane (XY) of the tiled display can be independent of the presence or absence of adjacent display tiles.

Embodiments of the present invention comprise support substructures (e.g. 31, 33, 34) each for fastening or assisting the fastening of a display tile (500) to a support structure of a tiled display (which can include an alignment device in the Z direction), adjacent display tiles in the tiled display being separated by a nominal seam, the second support substructure (33) being characterized in that it is linked to the support structure by means of a first mechanism allowing movements of each display tile in a plane parallel to the nominal plane (XY) of the tiled display to form a gap (D or G) between adjacent display tiles obtained by moving one or more display tiles from a first position (P1) to a second position (P2).

A second mechanism can fix the position of the second support substructure (33) in the second position. The gap (D or G) is set larger than the nominal seam.

Hence, the movement of the second support substructure (33) relatively to the support structure is meant to create a space or gap D or G between adjacent tiles. The gap D or G is larger than the nominal seam. By increasing the space or gap D or G between adjacent tiles, it is easier to access mechanisms positioned behind the display surface and that, when activated, will release a display tile (500) and allow it to either be replaced by another display tile and/or taken away for maintenance and/or storage. The gap D or G is obtained by moving one or more display tiles from a first position (P1) to a second position (P2).

The movement of one or more display tiles from a first position to a second position can include a vertical movement and/or a horizontal movement. A preferred movement is at an angle to the vertical (Y axis) such as an angle in the range 10° to 80° or 20° to 70° or 30° to 60° or 40° to 50° e.g. 45°.

The support structure can be an assembly or network of trusses. The support structure can be a wall; the wall can be fitted with trusses to which the support substructures can be fastened.

The first mechanism can be driven by e.g. a motor. Alternatively, the first mechanism can be driven by a crank or key operated by a human operator.

The first mechanism can include means to transform a rotary movement of a motor or manually operated crank into a translation of the second support substructure 33, e.g. from the first position (P1) to the second position (P2) e.g. a first movement at an angle to the vertical (Y axis) such as an angle in the range 10° to 80° or 20° to 70° or 30° to 60° or 40° to 50° e.g. 45°.

In particular, the first mechanism can comprise a driver such as a gear wheel which drives an actuator such as a quadrant gear (312) and a pin (331) or similar. When the driver is moved such as when the gear wheel is rotated, the actuator such as the quadrant gear exerts a force on the second support substructure (33) by the intermediary of the pin (331).

In particular, the first mechanism can comprise a gear wheel such as a quadrant gear (312) and a pin (331) or similar. When rotated, the gear wheel such as the quadrant gear exerts a force on the second support substructure (33) by the intermediary of the pin (331).

The first mechanism can include one or more guiding means that will limit the direction and/or amplitude of the movement of the second support substructure (33). The movement of the second support substructure can be a movement at an angle to the vertical (Y axis) such as an angle in the range 10° to 80° or 20° to 70° or 30° to 60° or 40° to 50° e.g. 45°.

The first mechanism can comprise a release mechanism. When it is released, the first mechanism cannot, for example, maintain the position of the second support substructure (33) on its own when a force has to be applied to the second support substructure (33) and/or the display tile (500) it supports.

In a further aspect of the invention, each display tile has one or more contact elements (510, 520, 530, and 540) with which it can interact mechanically with an adjacent display tile, in particular with a display tile positioned above it. This is particularly advantageous when no electrical motor is used to power the first mechanism. In particular, the contact elements can transmit a force from the lowest display tile in a column to all the other display tiles in the same column (i.e. in the column of display tiles the tiles lie one above the other so that they are arranged vertically along the Y axis in or being parallel to a display plane X-Y).

In a further aspect of embodiments of the present invention, a second mechanism can fix the position of the second support substructure (33), e.g. in a raised position i.e. a vertically raised position along the vertical axis (Y axis). The second mechanism can fix the position of the second support substructure (33) using a latch mechanism, e.g. by pushing a pin (332) or driver fastened to the second support substructure (33). In particular the second mechanism can comprise a lever or hammer (316) that can take two positions: in a first position (H1) (see FIG. 7A), the lever or hammer cannot prevent free movement of the pin (332) or driver; and in a second position (H2) (see FIG. 7B), the lever or hammer can prevent free movement of the pin (332) or driver. This is advantageous if a display tile must be kept in its second position (P2) without power dissipation (e.g. if a motor were used) or without the need for a continued human intervention (e.g. keeping applying a force on a mechanism). Also it is advantageous if the display tile can be kept in its second position (P2) independently of the position of other display tiles i.e. allowing some movements in or parallel to the display plane X-Y e.g. vertical and/or horizontal movements or movements perpendicular to the display plane (i.e. along the Z direction).

In a further aspect of embodiments of the present invention, each display tile of the tiled display is fastened or mated to an intermediary third support substructure, the intermediary third support substructure being characterized in that it comprises a mechanism for moving the display tile outside of the display plane (XY), i.e. along a Z direction.

It can be another purpose of the present invention to provide first improved means and methods to align the display tiles in a tiled display. Such an alignment mechanism (32) can be used with a first support substructure (31) each for fastening a display tile (500) to a support structure of a tiled display, adjacent display tiles in the tiled display being separated by a nominal seam, the second support substructure (33) being characterized in that it is linked to the support structure by means of a first mechanism allowing movements of each display tile in a plane parallel to the nominal display plane (XY) of the tiled display to form a gap (D or G) between adjacent display tiles obtained by moving one or more display tiles from a first position (P1) to a second position (P2) and a second mechanism fixing the position of the at least one second support substructure (33) in the second position, wherein the gap (D or G) is larger than the nominal seam. The movements from a first position (P1) to a second position (P2) can be vertical and/or horizontal. A preferred movement is at an angle to the vertical such as an angle in the range 10° to 80° or 20° to 70° or 30° to 60° or 40° to 50° e.g. 45°.

The alignment mechanism can comprise an element with a central section, the central section having arms that are fastened to the central section, the arms radiating out from the central section.

For example, the arms can be positioned symmetrically around the central section and optionally two consecutive arms can be separated by an angle of 90°.

A hole in each of the arms can be adapted to receive a fastener such as a pin or screw to be fastened to the second support substructure.

A first element (258) together with the alignment mechanism (32) can be screwed onto the first fastening bolt (250) (see, for example, FIGS. 13A and 13B).

The means for displacement of the alignment mechanism in the direction parallel to the axis of the first fastening bolt (250) can be means for rotation of the first fastening bolt (250).

The alignment mechanism (32) is preferably free to rotate around the first element (258) until a nut (253) is fastened.

The first fastening bolt (250) and the first element (258) can go through a spring-loaded section (G252) that allows movement in orthogonal directions of the alignment mechanism (32) around the first element (258) within the limits of an opening (G251). The spring-loaded section (G252) in absence of other higher forces can enable self-centering of the alignment mechanism (32) around the first fastening bolt (250).

The alignment mechanism (32) can be tilted with respect to the first fastening bolt as long as the nut (253) is not fastened.

The alignment mechanism (32) can be moveable relative to the first fastening bolt (250) with all 6 degrees of freedom before being fixed relatively to the first fastening bolt.

The alignment mechanism (32) can be fastened relative to the first element (258) by a tightened nut (253) thus clamping discs (254, 255) in the central section (G256) and in between first element (258) and nut (253) through the opening (G251).

The first element (258) can be fastened on the bolt with a counter nut which is put on the bolt (250) directly below the first element (258).

Allowed translational and angular displacements of the first fastening bolt (250) within the opening (G251) by the spring-loaded section (G252) can allow installed adjacent tiles not to have an increase of the seam around panels in spite of tolerances on the position of the bolt holes used to fasten the tiles.

A first support substructure (31) can be fastened to the alignment mechanism (32) with a single bolt (257) fastened in one of geometries (G211, G221, G231, G241).

The first support substructure (31) has a mating section (G120) corresponding to an arm (220) of the alignment mechanism (32).

The walls (G121 and G122) of the mating section on both sides of the arm (220) can be adapted to prevent rotation of the arm (220) around the axis of the single bolt (257).

Pin shaped geometries on each arm (G222 on 220) can fit each into a hole in extensions (130 and 140) of the first support substructure (31), thus positioning the support structure (100) in relation to the alignment mechanism (32) as well as in relation to any adjacent support structures.

The hole for the single bolt (257) is positioned in each of the arms (210, 220, 230, 240) within the pin shaped geometry (G221 within pin G222 in arm 220).

Bolt shaped geometries are fixed on the alignment mechanism (32) on top of the pins and to substitute the single bolts (257) with nuts.

In the case of a tiled display wall incorporating n*m display tiles (500) and (n+1)*(m+1) alignment mechanisms (32), at the outer circumference of the tiled display wall at least two out of the four holes (G211, G221, G231, G241) of each alignment mechanism (32) are not used to keep a support structure (100) fixed.

The at least two out of the four holes are used when adding further support structures (100) to the tiled display wall.

A tiled display can be connected to the support structure described above.

Separate and independent stand-alone embodiments of the present invention, described with reference to FIGS. 22 to 32B, describe a different alignment device. This alignment device according to embodiments of the present invention can have an advantage to provide a simple mechanism or method to align adjacent display tiles in a direction perpendicular to the display plane of a tiled display (Z direction). In Cartesian co-ordinates (with orthonormal axes X, Y, Z), the tiles lie in an X-Y display plane or are parallel to an X-Y plane wherein the perpendicular to the display X-Y plane is in the Z direction.

In this aspect of the present invention, a tiled display has a first and a second display tile. The first and second display tiles each have a side or a plurality of sides. The display tiles may be rectangular having four major sides, two major sides being parallel to each other and orthogonal to two other major sides, these two other major sides also being parallel to each other. A side of the first display tile comprises a first body of a first kinematic pair and a second body of a second kinematic pair. A side of the second display tile has a second body of the first kinematic pair and a first body of the second kinematic pair. The tiled display is characterized in that the first and second kinematic pairs can impose a constraint on the relative movement of the first body and the second body in a direction perpendicular to the X-Y display plane. They can be deactivated independently of each other.

In the tiled display the display tiles can be rectangular having four corners and a display surface, each corner of the four corners of the display tile having one of first to fourth corner elements that can be fastened to one of the first to fourth corners. The rectangular display tile can have sides S1 and S2 that are perpendicular to each other and meet to form one of the first to fourth corners of the display tile and one of the first to fourth corner elements has a first side SC1 aligned with a side S1 of the display tile and a second side SC2 aligned with a side S2 of the display tile, the first side SC1 of the corner element having a second body of a first kinematic pair and the second side SC2 has the first body of another kinematic pair, each of the first to fourth corner elements when fastened to one of the first to fourth corners of the display tile 1370 has a first body and a second body of different kinematic pairs and a built in mechanism to determine the position of the second body.

The built-in mechanism can have an actuator located within the first body, in a space where the second body of the other kinematic pair can fit.

The first to fourth corner elements (1371, 1371B to D) and an alignment mechanism can constrain the displacement of each display tile in a direction perpendicular to the plane of the surfaces of the display tiles without overdefining the tiling of two or more display tiles.

If a kinematic pair is active, it can facilitate the alignment of a display surface of a first tile with a display surface of an adjacent second tile.

The first body can have a first element and a second element on the first side that delimit a space in between them, and into which space the second body can fit.

The first and second elements can be plate-like elements or rectangular parallelepipeds, which extend away from the respective first and second sides.

The first and second elements can extend parallel to a display surface of a first tile, and both can extend in a direction perpendicular to the direction Z.

The actuator can be a user operable actuator for transmitting a force when operated to a first force transmitter when the actuator is in a first position.

The tiled display can include means to transmit the force to a second force transmitter which further transmits the force to a rack, the rack being adapted to translate and to force the rotation of a pinion.

The pinion can be coupled by means of a coupling to the second body of a kinematic pair.

When the pinion is rotated, the second body can also be rotated around an axis.

A resilient device can be provided for returning the second body to its initial position when no force is applied to the actuator.

A kinematic pair can be deactivated by placing the second body in a second position.

The position of the first force transmitter can be in a second or third position and it cannot transmit the force F applied on the actuator such as the push button and the second body will not rotate.

Under the action of gravity, the first force transmitter can occupy either a second or third position and the actuator cannot transmit a force and the second body of a corner element is in the active position: a kinematic pair restricts the relative movement of a first tile and an adjacent second tile.

Or under the action of gravity, the first force transmitter occupies its natural position and can transmit a force and a kinematic pair does not restrict the relative movement of first and second tiles.

In embodiments of the present invention a kinematic pair can have two bodies, and one side of a display tile can have an element of a first kinematic pair and an element of another kinematic pair.

When two tiles are placed side-by-side, e.g. to form a tiled display:
The first element of a first tile can form a kinematic pair with a second element of the second tile, and
The second element of the first tile can form a kinematic pair with a first element of the second tile.

Each of the kinematic pairs can be deactivated independently of the other, e.g. along the same seam of the tiled display, between the first tile and the second tile.

Two different elements of kinematic pairs on the sides of the display tiles is advantageous when activation/deactivation is determined by the tiling and gravity.

It is an advantage of that aspect of the invention that, when the tiling arrangement of several display tiles is overdefined or overconstrained, one or more kinematic pairs can be deactivated to avoid introducing mechanical stress and/or to prevent the alignment of the tiles in the X-Y display plane.

Embodiments of the present invention provide a method of aligning an array of display tiles of a tiled display, the method comprising fastening a first support substructure of a display tile to a support structure by means of an alignment mechanism, and aligning adjacent display tiles with the alignment mechanism, wherein the tiled display comprises a first and a second display tile, the first and second display tiles lying in a display plane and each having a first and second side respectively, wherein the alignment mechanism comprises a first body of a first kinematic pair and a second body of a second kinematic pair being formed in the first side of the first display tile and a second body of the first kinematic pair and a first body of the second kinematic pair being formed in the second side of the second display tile, wherein the first and second kinematic pairs can impose a constraint on the relative movement of the first body and the second body in a direction perpendicular to the display plane. The kinematic pairs can be deactivated independently of each other.

This method can make use of support substructures each for fastening a display tile (500) to a support structure of a tiled display, adjacent display tiles in the tiled display being separated by a nominal seam, a second support substructure (33) being characterized in that it is linked to the support structure by means of a first mechanism allowing movements of each display tile in a plane parallel to the nominal plane (XY) of the tiled display to form a gap (G) between adjacent display tiles obtained by moving one or more display tiles from a first position (P1) to a second position (P2) and a second mechanism fixing the position of the second support substructure (33) in the second position, wherein the gap (G) is larger than the nominal seam.

The first mechanism can be driven by e.g. a motor or a hand crank or a key.

The first mechanism can include means to transform a rotary movement into a translation of the second support substructure.

The first mechanism can comprise an actuator such as quadrant gear (312) and a driver such as a pin (331), the actuator such as the quadrant gear being for exerting a force on the second support substructure (33) by the intermediary of the driver such as the pin (331).

The first mechanism can comprise guiding means to help controlling the direction and/or amplitude of the movement of the second support substructure.

The first mechanism can comprise or work with a release mechanism.

The display tile has one or more contact elements (510, 520, 530, and 540) for exerting a force on an adjacent display tile.

The contact elements (510, 520, 530, and 540) can self-align a display tile with an adjacent display tile.

The second mechanism can comprise a lever or hammer (316) that can take two positions and a driver such as a pin (332) fastened to the second support substructure: in a first position (FIG. 7A), the hammer or lever cannot prevent free movement of the pin (332); and in a second position (H2), the hammer or lever can prevent free movement of the driver such as the pin (332).

The display tile (500) can be fastened or mated to the second support substructure (33) by the intermediary of a third support substructure (34), the third support substructure (34) comprising a mechanism for moving the display tile outside of the display plane (XY).

A tiled display can comprise any of the support substructures according to the present invention.

The tiled display can comprise second support substructures (33) which are fastened to the support structure by the intermediary of a first support substructure (31) which is fastened to the support structure by means of an alignment mechanism (32), the alignment mechanism being for aligning adjacent display tiles.

The present invention can provide a method for manipulating display tiles (500), each display tile (500) being fastened to a support structure of a tiled display using a first support substructure (31), adjacent display tiles in the tiled display being separated by a nominal seam, the second support substructure (33) being mechanically linked to the support structure, the method comprising:

moving one or more display tiles in a first movement plane in or parallel to the nominal plane (XY) of the tiled display to form a gap (D or G) between adjacent display tiles obtained by moving one or more display tiles from a first position (P1) to a second position (P2) and fixing the position of the second support substructure (33) in the second position, wherein the gap (D or G) is larger than the nominal seam. The first movement can be driven by a motor or a hand crank or a key.

The first movement can include a transformation from a rotary movement into a translation of the second support substructure.

The method can include guiding the first movement to help controlling the direction and/or amplitude of the first movement.

The method can include self-aligning the display tile using one or more contact elements (510, 520, 530, and 540) for exerting a force on an adjacent display tile.

The method can include fastening or mating the display tile (500) to the second support substructure (33) by the intermediary of a third support substructure (34), further comprising a further movement for moving the display tile outside of the display plane (XY), i.e. along the Z direction.

Embodiments of the present invention can provide a first support substructure for use in fastening a tiled display having an array of display tiles, to a support structure, the first support substructure being for fastening to the support structure by means of an alignment mechanism (32), the alignment mechanism being for aligning adjacent display tiles, further comprising a first fastening bolt (250) perpendicular to the first support structure, further comprising means for displacement of the alignment mechanism (32) in the direction parallel to the axis of the first fastening bolt (250).

The alignment mechanism can comprise an element with a central section, the central section having arms that are fastened to the central section, the arms radiating out from the central section.

The arms can be positioned symmetrically around the central section and, optionally, two consecutive arms are separated by an angle of 90°.

A hole in each of the arms can receive a pin or screw to be fastened to the second support sub structure.

Embodiments also provide a method wherein the tiled display comprises a first and a second display tile, the first and second display tiles lying in a display plane and each having a first and second side respectively, wherein a first body of a first kinematic pair and a second body of a second kinematic pair are formed in the first side of the first display tile and a second body of the first kinematic pair and a first body of the second kinematic pair are formed in the second side of the second display tile, the tiled display is characterized in that the first and second kinematic pairs can impose a constraint on the relative movement of the first body and the second body in a direction perpendicular to the display plane and in that they can be deactivated independently of each other.

The tiled display can comprise a first and a second display tile, the first and second display tiles lying in a display plane and each having a first and second side respectively, wherein a first body of a first kinematic pair and a second body of a second kinematic pair are formed in the first side of the first display tile and a second body of the first kinematic pair and a first body of the second kinematic pair are formed in the second side of the second display tile, the tiled display is characterized in that the first and second kinematic pairs can impose a constraint on the relative movement of the first body and the second body in a direction perpendicular to the display plane.

The kinematic pairs can be deactivated independently of each other.

Definitions

DOF (Degree Of Freedom). Number of independent motions that are allowed to the body or, in case of a mechanism made of several bodies, number of possible independent relative motions between the bodies of the mechanism.

Kinematic pair. A kinematic pair is a connection between two bodies that imposes constraints on their relative movement. There are types of pairs having relative motion of the parts of the pair or being defined by the type of contact between the elements of a pair, or types determined by the mechanical restraint the pairs are subjected to.

Overdetermined. An overdetermined system must satisfy more constraints than there are degrees of freedom. Synonyms: overconstrained, overdefined.

Vectors will be denoted by an underlined symbol. For instance $\underline{1x}$, $\underline{1y}$, $\underline{1z}$ or $\underline{ex}$, $\underline{ey}$, $\underline{ez}$ will denote unit vectors of an orthonormal coordinate system x, y, z.

In particular, the acceleration of gravity $\underline{g}$ is such that $\underline{g} = -g\,\underline{1y}$ where g is the amplitude of the acceleration of gravity.

Align or alignment. To be in or come into precise adjustment or correct relative position.

Nominal. According to plan or expectations. In particular, the nominal display plane (or nominal plane of the tiled display) is the ideal planar surface across which images are to be displayed. The nominal display plane is expected to comprise the display surface of each of the display tiles of the tiled display. For instance, in the example of FIG. 2 and FIG. 4, the nominal display plane is the XY plane. The nominal display surface is the surface formed by the sum of the display surface of the tiles T1 to T9 (the tiles being symbolized by 9 rectangles on FIG. 4).

Display tile. Unless otherwise described, a display tile is part of a fixed format display in which many tiles show individual parts of an image. The tiles are usually rectangular with two times two sides parallel to each other and four corners. Such display tiles can be LED or OLED displays, LCD displays, plasma displays, as known to the skilled person.

BRIEF DESCRIPTION OF THE FIGURES

FIG. 6B shows a detail of an example of first mechanism when the second support substructure (33) and the display tile are in the first position P1.

FIG. 6C shows a detail of an example of first mechanism when the second support substructure (33) and the display tile are in the second position P2.

FIGS. 10A, 10B, 10C and 10D show a cross section of the mechanism to move the tile out of the display plane X-Y in different positions.

FIG. 14A to 14C show view of the alignment mechanism and how it can induce translational and rotational adjustments.

FIG. 27 shows an example of a force transmitting chain of elements according to an embodiment of the present invention.

FIGS. 28A, 28B, 28C, 28D, 28E, 28F and 28G show an example of a display tile according to an embodiment of the present invention.

FIG. 30I shows a different perspective of an entire mechanism according to an embodiment of the present invention whereby a bumper element is visible on the same side as the second body.

DETAILED DESCRIPTION OF EMBODIMENTS

Figure 1A:
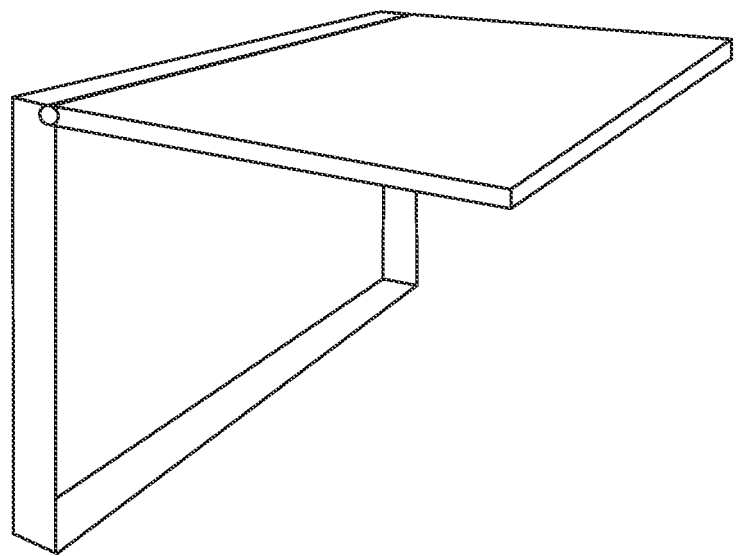
FIG. 1A shows an example of front access solution according to the art.
Figure 1B:
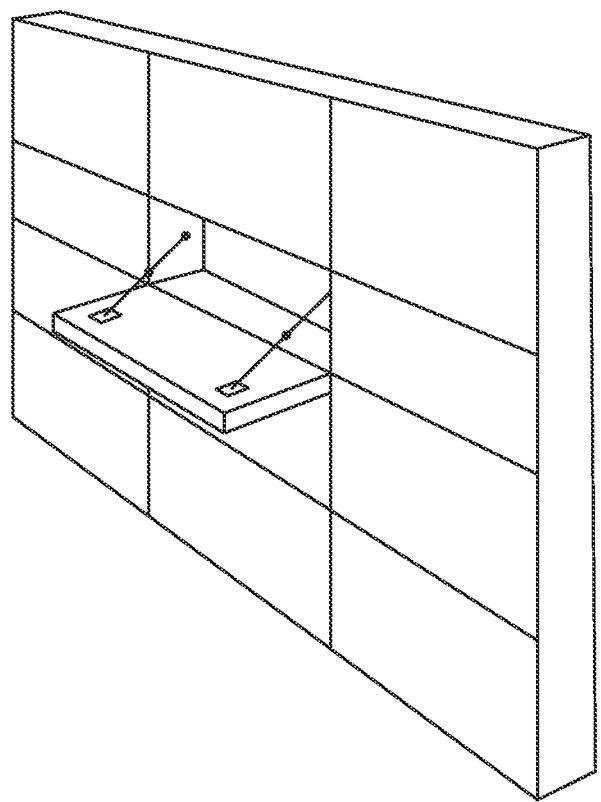
FIG. 1B shows a second example of front access solution according to the art.
Figure 2:
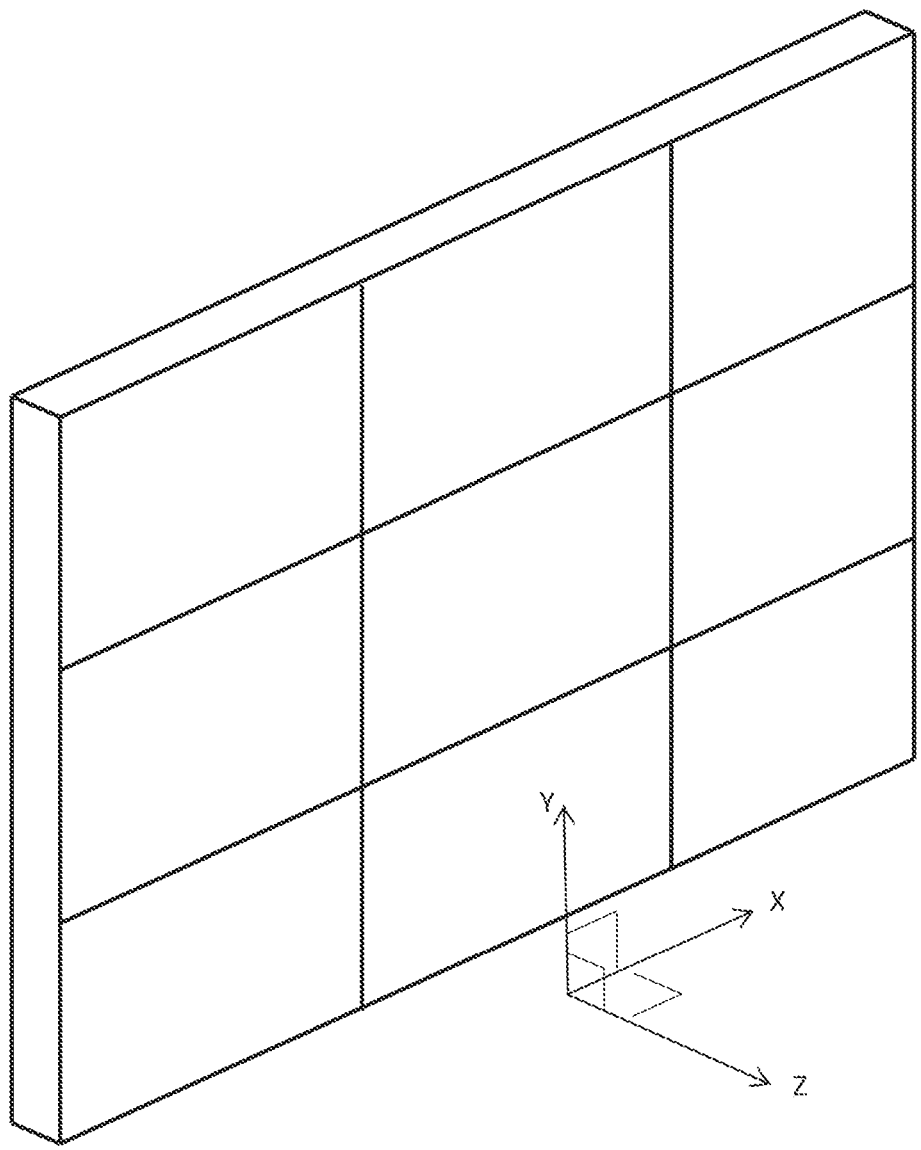
FIG. 2 shows the display surfaces of a tiled display with 9 display tiles. The axis X, Y and Z are orthonormal. The X and Y axis are in the nominal plane of the display surface.
Figure 3:
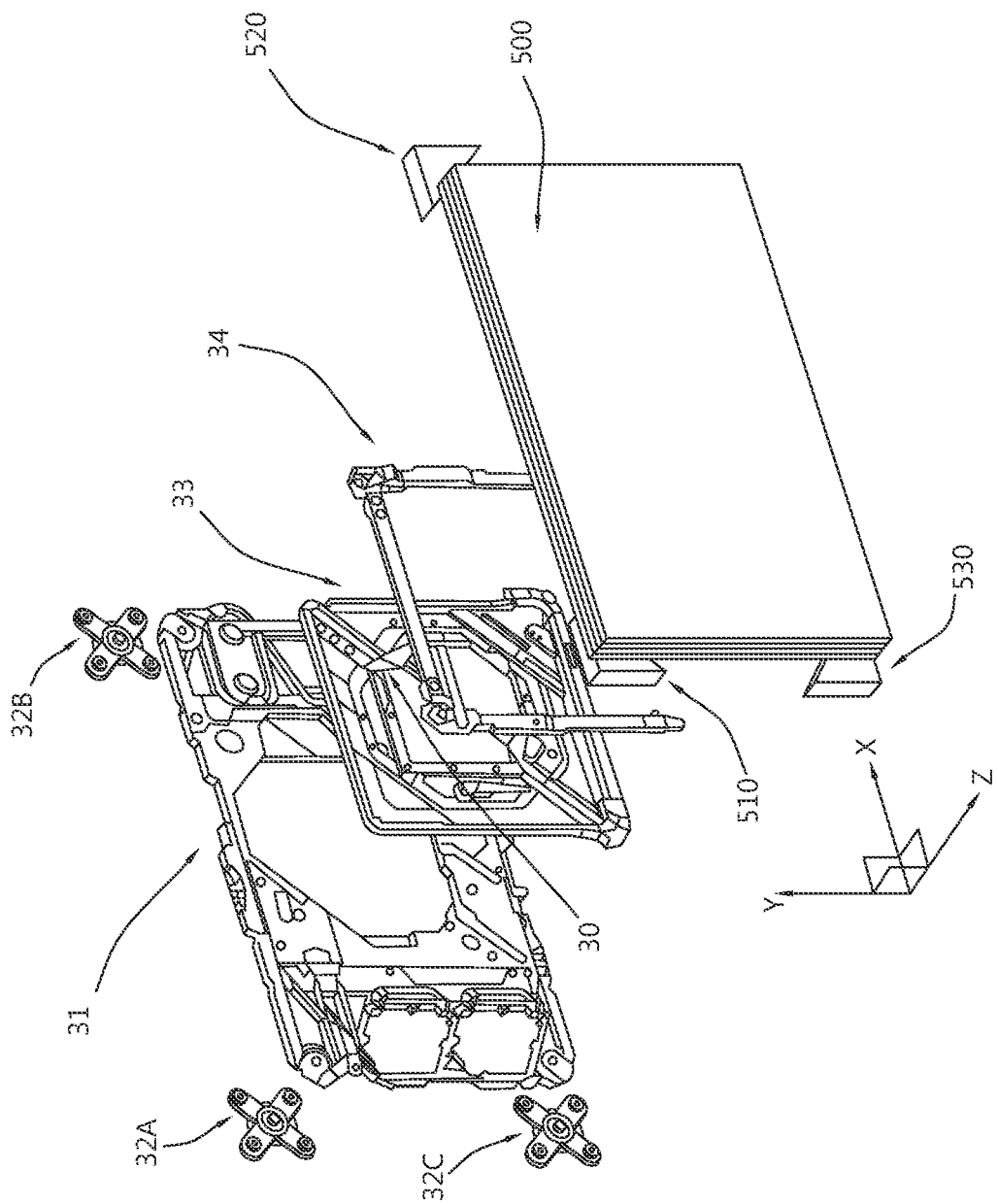
FIG. 3 shows an exploded view of the various support substructures according to the invention together with a display tile 500 in landscape orientation.

FIG. 3 shows an exploded view of the various support substructures according to some of the embodiments of the present invention together with a display tile 500 in landscape orientation. The display tile can be aligned with other tiles of a tiled display and easily accessed for maintenance and repair.

A first support substructure 31 can be fastened to e.g. a wall (not shown on FIG. 3) and/or a network of trusses by the intermediary of an alignment mechanism (32A, 32B, 32C, 32D). The trusses can themselves be fastened to a wall or they can form a self-supporting structure. The alignment mechanism comprises cross shaped components such as four of them: 32A, 32B, 32C, 32D. The alignment mechanism allows the alignment of adjacent display tiles with respect to each other both in the X, Y and Z directions.

A second support substructure 33 is supported by the first support substructure 31. The second support substructure 33 can move with respect to the first support substructure 31.

The movements of the second support substructure (33) with respect to the first support substructure (31) can be limited in amplitude and/or direction as will later be described. In particular, the movement of the second support substructure is done in a direction parallel to the display plane XY. The movement of the second support substructure (33) relatively to the first support substructure (31) is meant to create a space or gap D or G between adjacent tiles, the gap D or G being larger than the nominal seam. By increasing the space or gap D or G between adjacent tiles, it is easier to access mechanisms positioned behind the display surface and that, when activated, will release a display tile (500) and allow it to either be replaced by another display tile and/or taken away for maintenance and/or storage.

The movement of the second support substructure (33) can be controlled by a motor (e.g. rotary or linear). The motor can be controlled by control signals sent to e.g. the electronics usually associated with a display tile. Alternatively, the movement can be controlled by a hand crank as will be described in detail later.

To further facilitate access to the fastening means that fasten a display tile to the support structure a third support substructure 34 can be used. The third support substructure 34 is supported by the second support substructure 33. The third support substructure 34 can move with respect to the second support substructure 33.

The movement of the third support substructure (34) has a component perpendicular to the display plane XY. The movement of the third support substructure with respect to the second support substructure (33) can be a translation, a rotation or a combination of both.

A series of mechanism can be used to trigger and/or control the movements of the second and third support substructures. These mechanisms can be particularly relevant when no motor is used to modify the position of the display tiles.

In a first example of embodiment, as previously mentioned the Y axis can be parallel to the direction of the local field of gravity: $\underline{g} = -g \cdot \underline{1_y}$, i.e. the vertical.

A first mechanism can move a tile from a first position P1 (a nominal position) to a second position P2 (a position it has e.g. during maintenance). The movement from a first position P1 (e.g. a rest or a nominal position) to a second position P2 can include a movement vertically and/or horizontally. A preferred movement is at an angle to the vertical such as an angle in the range 10 to 80° or 20 to 70°—or 30 to 60° or 40 to 50° e.g. 45°.

A second mechanism can prevent a tile from returning to its first position P1. This can be advantageous when e.g. accessing the mechanisms to release a display tile requires a gap between that display tile and all the adjacent display tiles. So this can be a gap on every side of the display tile.

A third mechanism is used to control the movement of a tile and to position it in a third position or service position.

These mechanisms will be described and how they operate in the context of a tiled display comprising 9 display tiles (T1, T2, T3, . . . , T9) assembled in 3 rows of 3 adjacent display tiles. The present invention is not limited to 9 displays.

Figure 4:
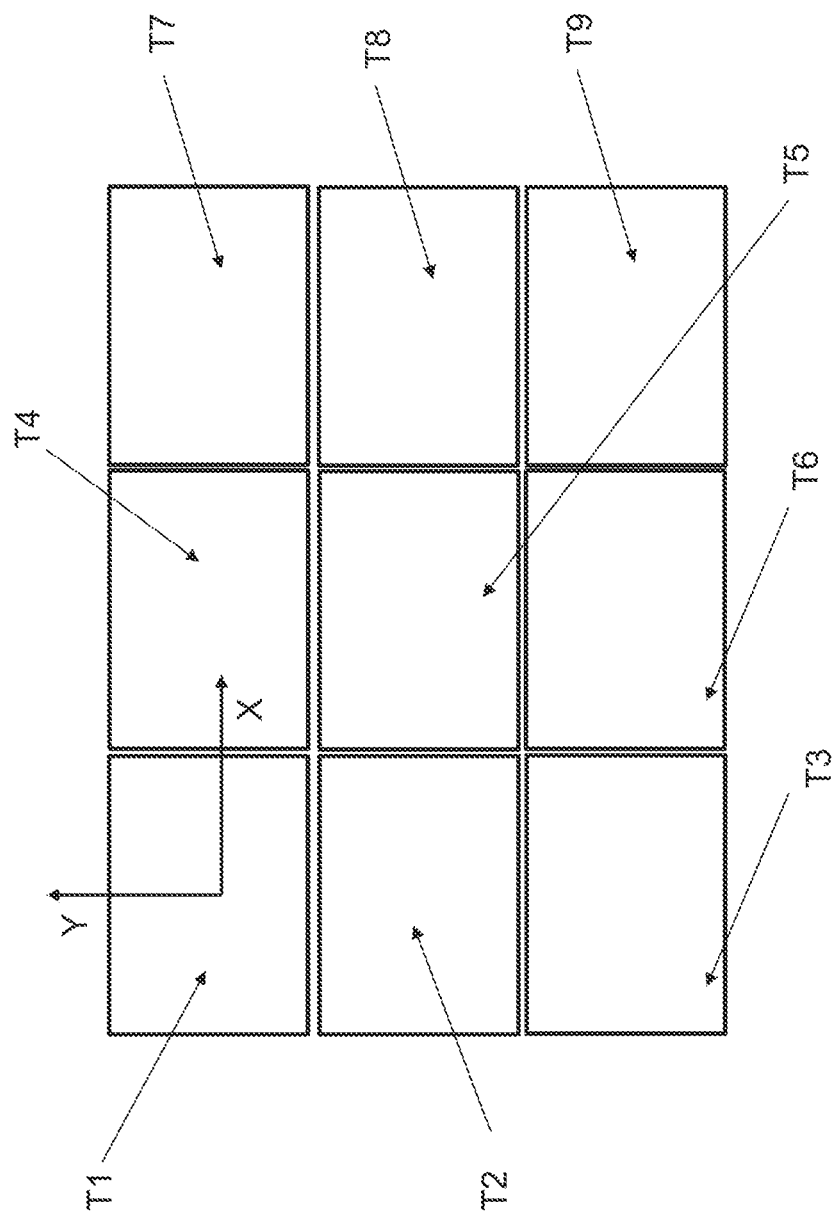
FIG. 4 shows the relative position of the 9 display tiles (example of 3 rows and 3 columns of display tiles) in normal use (all tiles are in their first position P1).

FIG. 4 shows the relative position of the 9 display tiles (example of 3 rows and 3 columns of display tiles) in normal use, i.e. the tiles are in their nominal positions. The nominal position of the display panels or tiles T1 to T9 is in the same plane X-Y as illustrated. The distance between two display tiles is the nominal seam separating the tiles of the tiled display. The nominal seam can for example be chosen between 0 mm and 2 mm or more.

The nominal seam width can be the minimum seam width available with these tiles.

Figure 5:
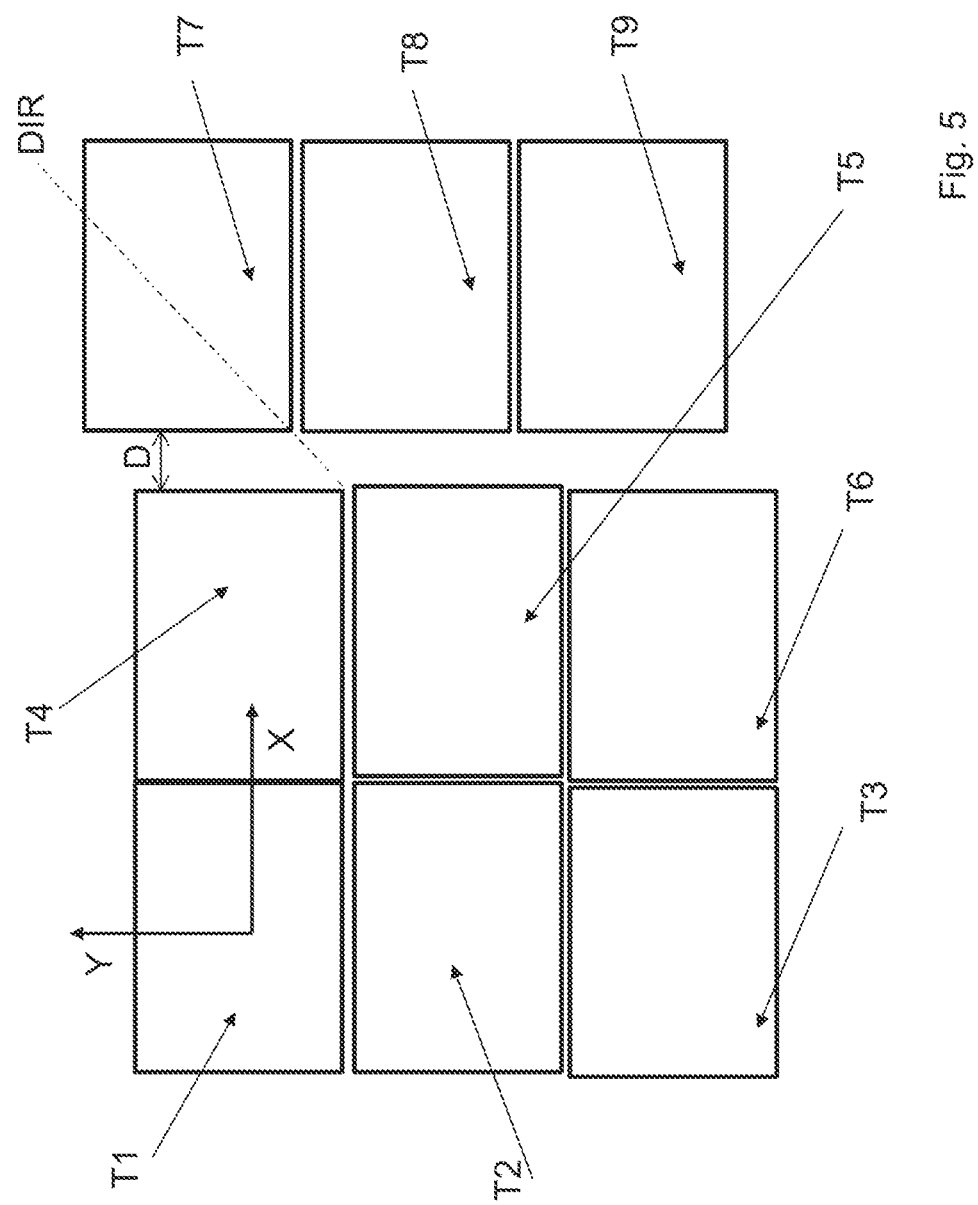
FIG. 5 shows the relative position of the 9 display tiles (example of 3 rows and 3 columns of display tiles) when the tiles (T7, T8, T9) of the third column have been moved to their second position P2.

To access the support and alignment mechanism that will allow to fasten/unfasten a display tile to the tiled display, a first mechanism can be activated and triggers a first movement positioning the display tiles T7, T8, and T9 as shown in FIG. 5. As shown in FIG. 4 tiles T1 to T9 are arranged in rows and columns. In FIG. 5 tiles T1 to T6 are in their nominal positions having small seams. A column formed by tiles T7 to T9 has moved along a direction DIR which can be a movement vertically and/or horizontally, but it is preferred if the movement is at an angle to the vertical such as an angle in the range 10 to 80° or 20 to 70°—or 30 to 60° or 40 to 50° e.g. 45°. This movement has created a gap D between two columns of displays (between T4-6 and T7-9). This movement could also have been carried out for column T4 to T6 or T1 to T3.

Figure 8:
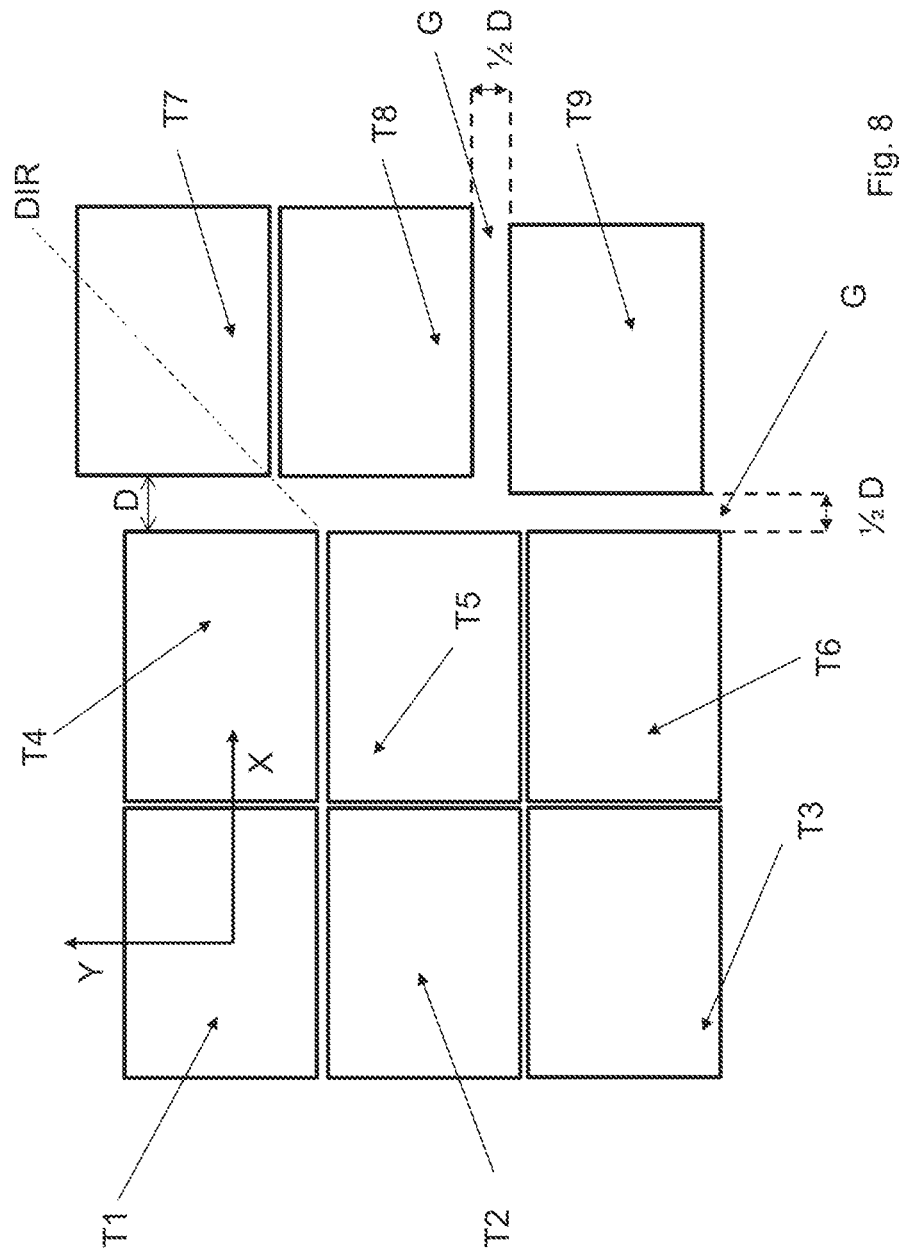
FIG. 8 shows the relative position of display tiles when a tile (T9) is in a third position (P3).

The positions of the display tiles as shown in FIG. 8 can be reached by means of a first translation along a direction DIR (which makes e.g. at an angle with respect to a principal direction of the display) away from the nominal position. The angle to the vertical of the movement can be in the range 10 to 80° or 20 to 70°—or 30 to 60° or 40 to 50° e.g. 45°.

Figure 12:
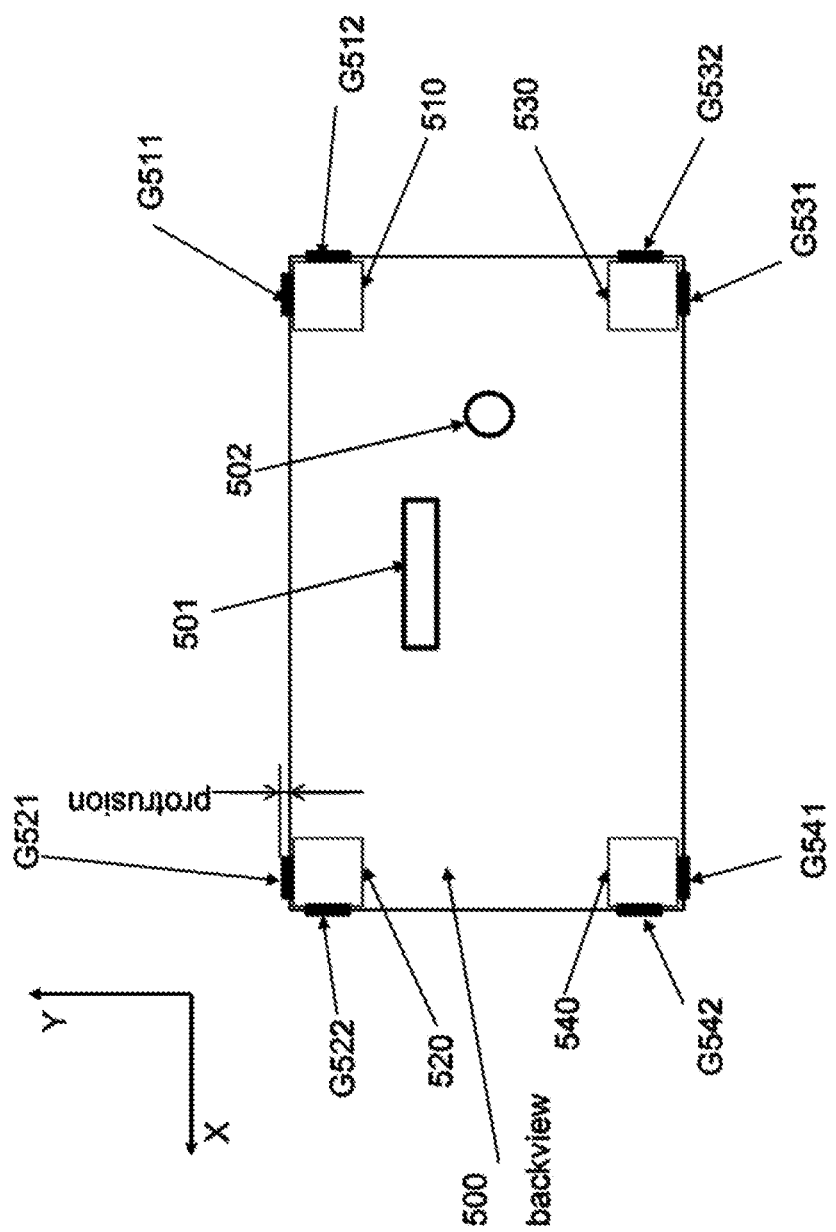
FIG. 12 shows a schematic representation of the position of connectors on the back of a display tile.

The first movement can be common to all tiles in the same column. In the example of FIGS. 4 and 5, the tiles T7, T8 and T9 move together. This can for instance be achieved by driving several tiles (T7 to T9) of a column simultaneously or by applying a force on the lowest tile of the column (T9) and the lower tile will transmit the force to the other tiles (T7 and 8) of the column e.g. by pushing on contact elements (510, 520, 530, 540), which are illustrated in FIG. 12 (contact element 540 is hidden by display tile 500). Elements 510, 520, 530, 540 are installed on the display tile 500 so as to contact the surfaces of neighboring contact elements of adjacent display tiles. They can slightly protrude from the circumference of the display itself. The size of this protrusion defines the width of the seam between adjacent tiles when in their nominal working position and is preferably below one mm. In particular, the size of the protrusion can be the same for all contact surfaces (i.e. the sides of a contact element that contacts the corresponding sides of a neighboring contact element). In a particular case, when the contact surfaces do not protrude but are flush with the perimeter (or outer limits) of the display itself, the seam between adjacent tiles is absent.

Figure 6A:
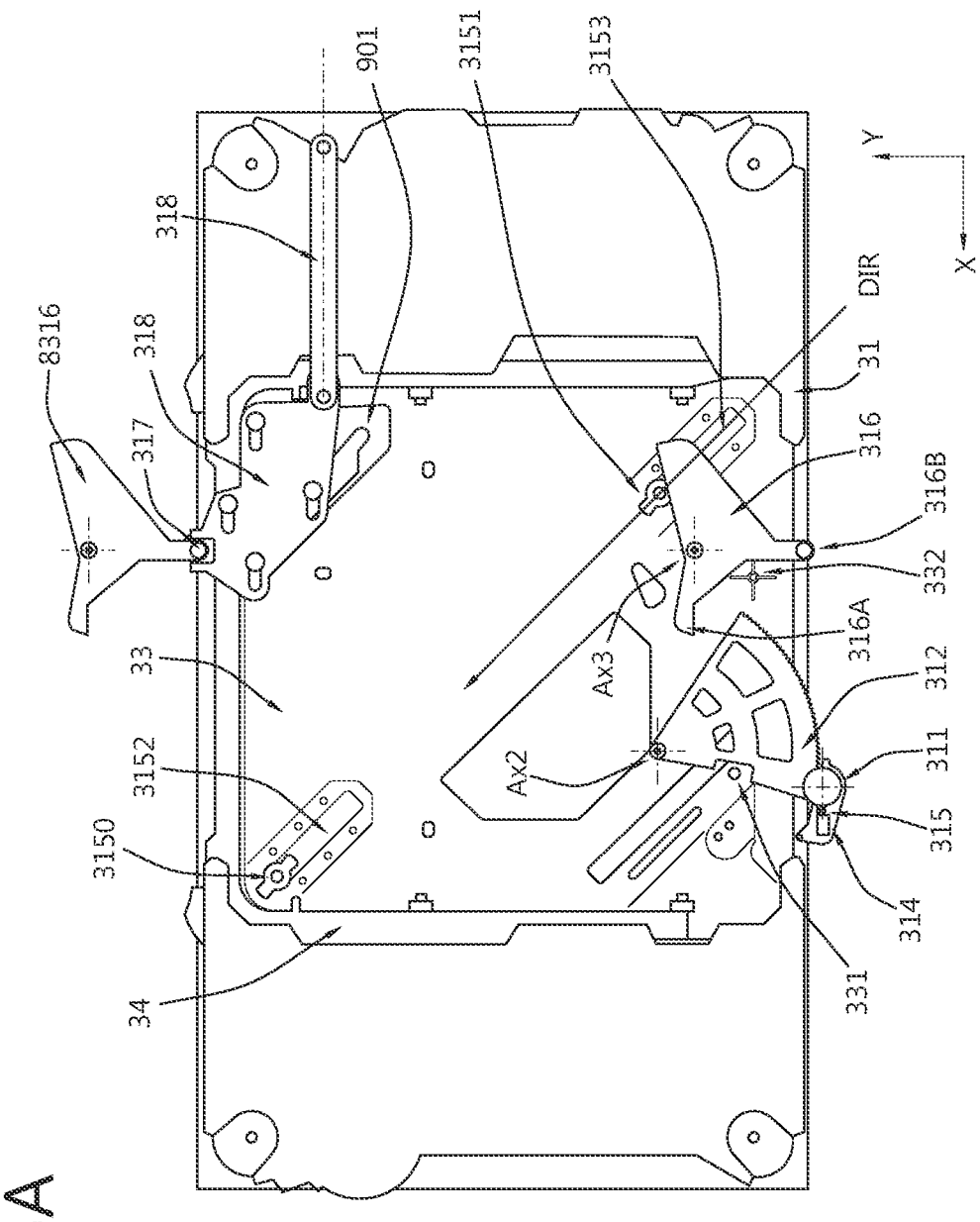
FIG. 6A shows a plane view of the different support substructures and the first and second mechanisms. The view is as seen from the back of the first support substructure.

FIGS. 6A, B and C illustrate an embodiment of a mechanism to move a tile such as tile T9 from the position it has in FIG. 4 to the position it has in FIG. 5. Whereby the movement is at an angle to the vertical or Y direction shown in FIG. 6A. The angle to the vertical can be such as an angle in the range 10 to 80° or 20 to 70°—or 30 to 60° or 40 to 50° e.g. 45°.

FIG. 6A shows a plane view of the different support substructures and the first and second mechanisms. The view is as seen from the back of the first support substructure (31).

As seen on FIG. 6A, the first mechanism contains a gearwheel 311. The gearwheel 311 can rotate around an axis of rotation Ax1 that is fixed with respect to the first support substructure 31. The axis of rotation Ax1 is preferably perpendicular to the X-Y-plane (the plane of the display surface). The gearwheel 311 is linked mechanically to a quadrant gear 312. The quadrant gear 312 has an axis of rotation Ax2 that is fixed with respect to the first support substructure 31. When the gearwheel is rotated it rotates the quadrant gear 312.

The quadrant gear 312 can interact with the second support substructure 33 by the intermediary of a driver such as e.g. a pin 331 fastened to the second support substructure 33 as is illustrated on FIGS. 6B and 6C. The position of the driver such as pin 331 relative to the second support substructure is constrained by a first guide such as e.g. a groove 313 in the second support substructure 33, as exemplified on FIGS. 6B and 6C. The first guide such as groove 313 imposes a movement along the direction DIR and can limit the maximum amplitude of the movement of the second support substructure. The direction DIR can be at an angle to the vertical such as an angle in the range 10 to 80° or 20 to 70°—or 30 to 60° or 40 to 50° e.g. 45°. Alternatively, as exemplified on FIG. 6A, movements of the second support substructure 33 with respect to the first support substructure 31 can be constrained by a second guide such as by guiding rails and ball bearings. The ball bearings 3150 and 3151 are fastened to the first support substructure 31 and engage in a guide or opening 3152 or 3153. Other guiding mechanisms are possible.

The driver such as pin 331 engages in a notch 3121 in quadrant gear 312. When quadrant gear 312 rotates (e.g. from its initial position on FIG. 6A or 6B to a position as represented on FIG. 6C), it pushes against the driver such as pin 331. Driver such as pin 331 being fastened to the second support substructure 33, results in any displacement of the driver such as pin 331 being accompanied by a displacement Δ of the entire second support substructure 33. The displacement Δ is done parallel to the direction Dir.

The gearwheel 311 is in contact with a locking element 315, whose position is fixed with respect to the first support substructure 31 to prevent the second support substructure 33 to drop back along the direction DIR. A release agent such as pin 314 (part of the locking mechanism 315) can release the quadrant gear when pushed. The quadrant gear is then free to return to its resting or nominal position as in FIGS. 6A and 6B.

The gearwheel 311 can be driven by e.g. a hand crank, a key or a motor (like e.g. an electric motor) or any other suitable means. The locking element 315 and release agent such as release pin 314 are particularly useful when the gearwheel 311 is driven by a hand crank. With a high enough gear ratio, an electric motor can easily generate enough torque to keep a display tile in the second position P2 without excessively dissipating power and optionally without the help of the locking element.

An advantage of using an electrical motor do change the position of a display tile is that it can limit the number of mechanisms required to access a display tile. In particular, when using one electrical motor per display tile, the second and third mechanisms described further below may not necessarily be needed although they may still be used advantageously to e.g. make the use of less powerful motors possible and/or decrease the power dissipation.

As the second support substructure of tile T9 moves upwards, it pushes on the second support substructure of tile T8 which in turns moves upwards. As it moves upwards, the second support substructure of tile T8 pushes on the second support substructure of the tile T7 which in turn move upwards along the direction DIR. The direction DIR can be at an angle to the vertical such as an angle in the range 10 to 80° or 20 to 70°—or 30 to 60° or 40 to 50° e.g. 45°. As described earlier, the force pushing a tile upwards can be transmitted from a lower tile to a higher tile by means of contact elements (510, 520, 530 and 540 in the example of FIG. 3).

The first mechanism can be used to create a first gap (D) between two columns of tiles (T4 to 6 and T7 to 9) as seen on FIG. 5. In some embodiments of the invention, this first gap (D) may be sufficient to access a release mechanism that will give access to the fastening means used to fasten a display tile to the support structure of the tiled display. The space D between two columns of tiles (T4, T5, T6) and (T7, T8, T9) is larger than the nominal seam. D can be as large as e.g. 10 to 15 cm and is a size which gives access to e.g. a lever or a switch which when activated will trigger a mechanism that will push a display tile outside of the nominal display plane, i.e. in the Z direction. For instance, a linear motor can push a tile outside of the nominal display plane along a direction perpendicular (Z direction) to the nominal display plane (XY).

It may be advantageous to generate a gap G all around the display tile that must be accessed for maintenance as is e.g. the case for tile T9 on FIG. 8. This can be advantageous if e.g. the release mechanism requires a movement outside of the nominal display plane that requires a gap between along a horizontal side of a display tile, or if no electric motors can be used to push the tile outside of the display plane etc. In other words, a gap G all around the display tile gives more freedom to use different release mechanisms, different connection means to connect a display tile to power and control signals etc.

To describe how to access the release mechanism of a display tile (500) in those cases, let us consider the example of tile T9.

T9 can be separated from tile T8 by letting it drop back, in direction of its initial or first position P1. The desired position for tile T9 can for instance be as illustrated on FIG. 8. Tiles T1 to T6 are in their nominal rest position. Tiles T7 to T9 have been moved at an angle DIR to create a gap D between part column T7 and 8 and column T4 to T6. The direction DIR can be at an angle to the vertical such as an angle in the range 10 to 80° or 20 to 70°—or 30 to 60° or 40 to 50° e.g. 45°. Tile T9 has left its position in column T7-9 and has been moved so that it now forms a gap between tile T9 and tile 6 having a size less than D. The reason for the reduction sis the fact that tile T9 has a component of its movement which is horizontal thus reducing the gap, e.g. to D/2. A range for this gap can be any of 0.2 to 0.8 D, such as 0.4 to 0.6 D, e.g. D/2.

This position for tile T9 is a third fixed position P3 that a tile can assume within the display plane of the tiled display. Alternatively, T9 can move (or be moved) to its initial position P1 in which case T9 will be in its nominal or rest position.

In order to keep the tile T8 and/or T7 in the position they have in FIG. 5 (T8 and T7 are in their second position P2 in FIG. 5) if the tile T9 undergoes a second movement back towards its initial position which is shown in FIG. 4, a second mechanism is required. Indeed, if the force used to push a tile (such as T9) upwards from its nominal rest position is transmitted by means of e.g. contact elements (510, 520, 530 and 540), if tile T9 moves down, the tile T8 and T7 will follow unless another force keeps them in place. The purpose of this second mechanism is to be able to create a gap between two adjacent display tiles in the same column (i.e. between a display tile and the adjacent display tile above it). Tile T9 has been moved a gap between T8 and T9 which is smaller than D. A range for this gap can be any of 0.2 to 0.8 D, such as 0.4 to 0.6 D, e.g. D/2.

Figure 7A:
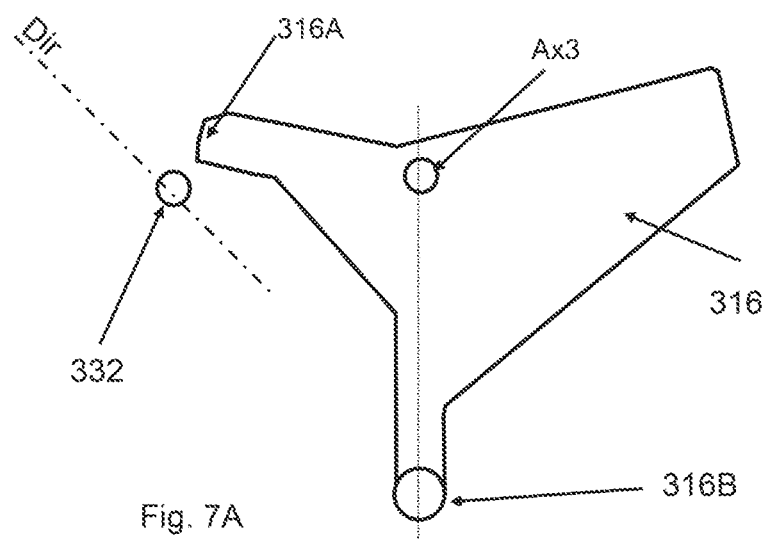
FIGS. 7A and 7B show details of a second mechanism in its first and second position.
Figure 7B:
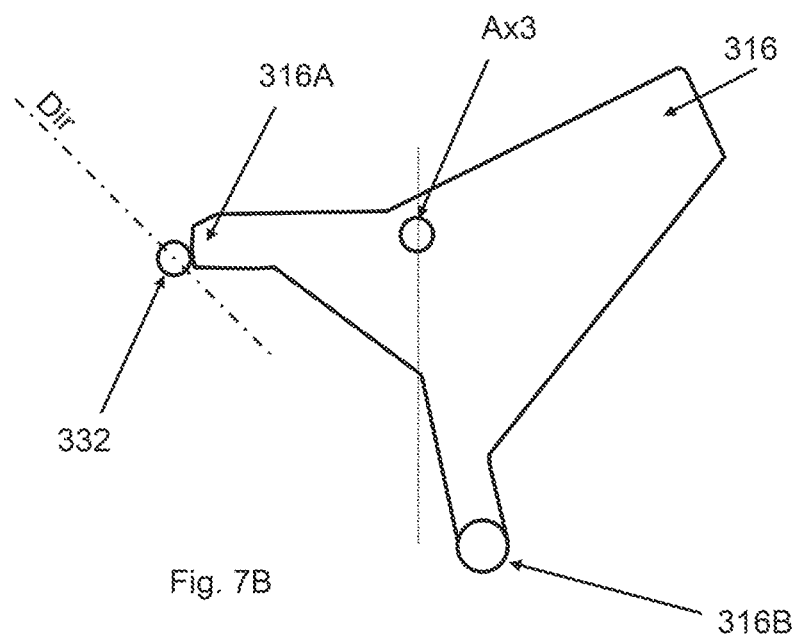

An embodiment of such a mechanism is illustrated on FIG. 6A, FIG. 7A and FIG. 7B.

The mechanism comprises a blocking member such as a hammer 316 that can rotate around an axis Ax3. The axis Ax3 can for instance be perpendicular to the display plane XY and have a fixed position with respect to the first support substructure 31.

In a first position (H1) (illustrated on FIGS. 6A and 7A), the blocking member such as the hammer 316 allows the second support substructure 33 to move along the direction DIR. The direction DIR can be at an angle to the vertical such as an angle in the range 10 to 80° or 20 to 70°—or 30 to 60° or 40 to 50° e.g. 45°. In particular, the head 316A of the blocking member such as hammer 316 is not in the way of a driver such as pin 332 fastened to the second support substructure 33.

In a second position H2 (illustrated on FIG. 7B), the head 316A of the hammer 316 is close to the position that the driver such as pin 332 can occupy along the direction Dir when the second support substructure 33 is moving back to its initial position (the position of support substructure 33 that corresponds to the position of the display tile on FIG. 4). If the quadrant gear is released, gravity will be free to bring the second support substructure 33 back to its lowest position but the head 316A of the blocking member such as hammer 316 exerts a force on the second support substructure 33 by the intermediary of the driver such as pin 332 thereby keeping the second support substructure 33 in a raised position.

The position of the blocking member such as the hammer 36 can be changed, e.g. by exerting a force on a lever or arm 316B. The blocking member such as hammer 316, its head 316A and the lever 316B can be cast as a single solid mechanical element.

A force can be exerted on the lever 316B by a notch 317 in a translating or gliding bar or plate 318 seen on FIG. 6A. As illustrated on FIG. 6A, the translating plate 318 and notch 317 of a tile e.g. T9 apply a force on the lever of the blocking member such as the hammer 316 associated with the tile right above e.g. tile T8.

Figure 11:
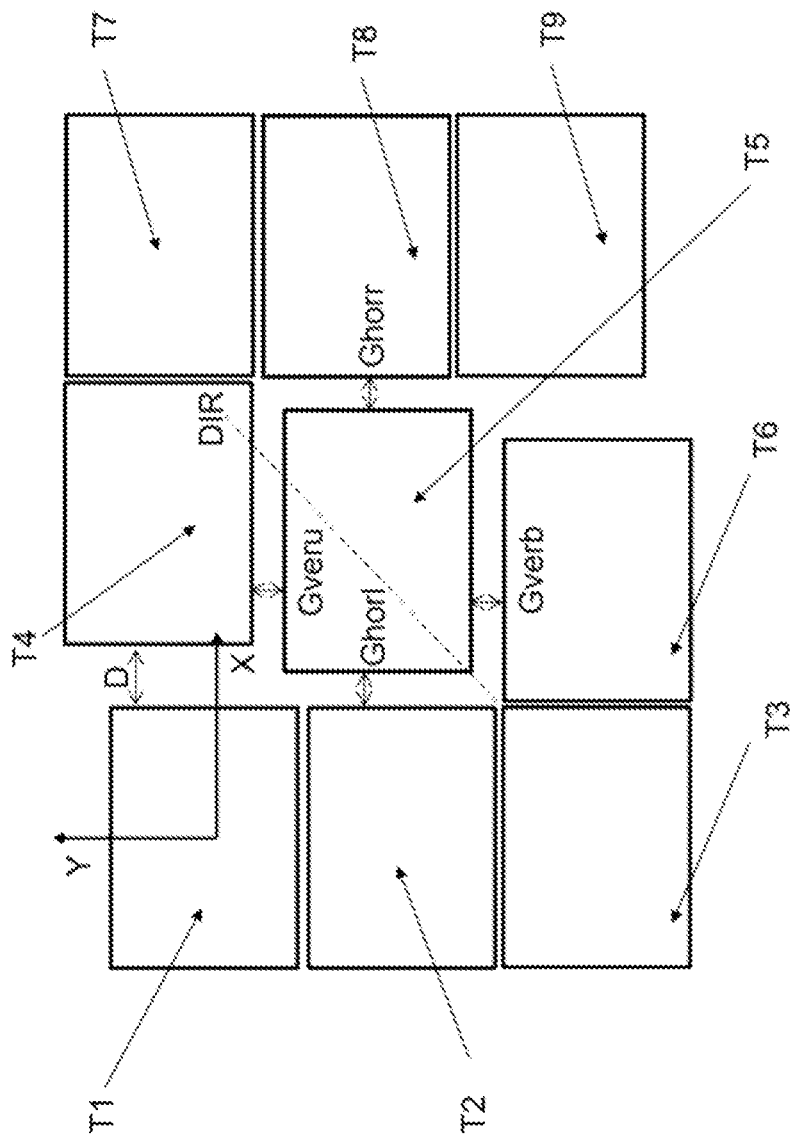
FIG. 11 shows to relative positions of the tiles of a 3×3 tiled display when a gap is created around the central tile (T5).

In some cases, it can be advantageous to prevent a tile like T9 to return entirely to its original position (P1) and to fix the tile in an intermediary or third position P3 between the first position P1 and the second position P2. FIG. 8 gives an example where tile T9 is maintained at a third position P3 mid-way between P1 and P2. FIG. 11 shows an embodiment where tiles T1 to T3 are in their nominal position (P1) and tile T5 is maintained at a third position P3 which is lower than position P2 but higher than P1. Tiles T4, T7, T8 and T9 have been moved to their second position (P2 with the help of a first mechanism) and T6 has been returned to its first nominal position P1. This creates a gap all around the display tile T5. This gives additional freedom to design a release mechanism that will bring a display tiles, T5 in this case, out of the plane of the display plane when the tile T5 must e.g. be replaced.

Keeping a tile like T9 in a third position P3 can be achieved e.g. by means of a third mechanism which is required to prevent the tile T9 returning to its lowest position P1. To service the tile T9, one may want to be able to access it all around as shown in FIG. 8 (depending on the mechanism used to take display tile out the display plane).

Figure 9A:
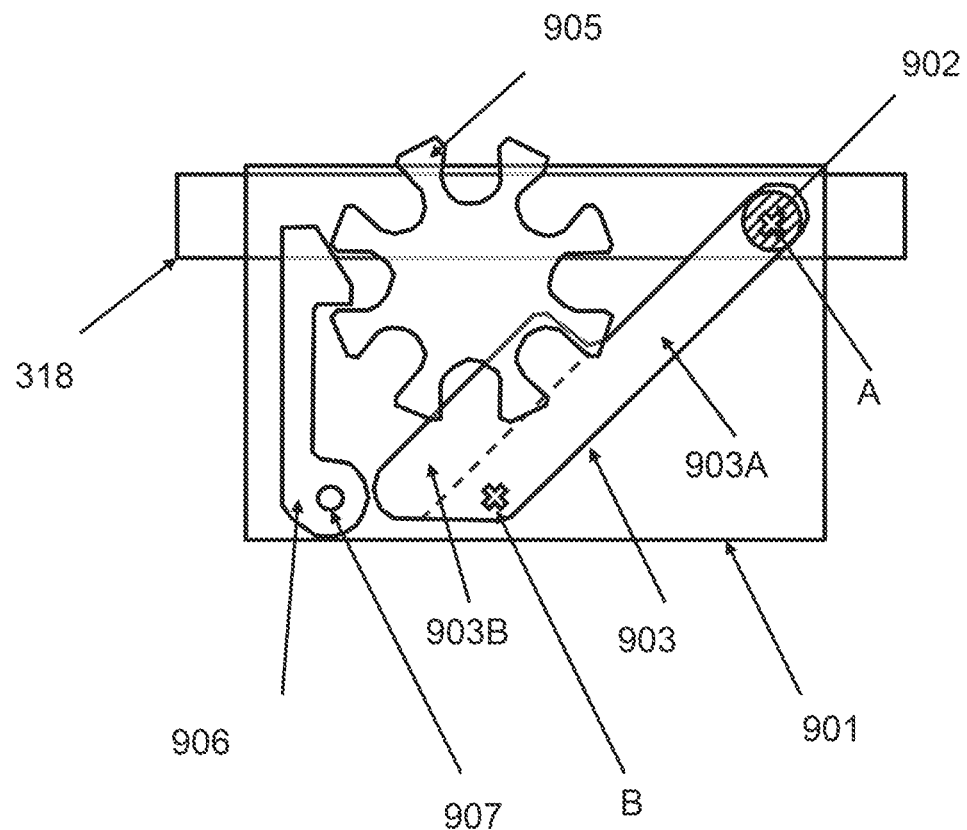
FIGS. 9A, 9B, 9C, 9D and 9E show details of a third mechanism to keep a display tile in a third position.

An embodiment of a third mechanism is shown in FIG. 9A. FIG. 9A shows the configuration of the third mechanism when the tile e.g. T9 is in its nominal position (P1 as in FIG. 4).

A plate 901 is fastened to the second support substructure 33. An opening 903 in the plate 901 determines a set of possible positions of the plate 901 with respect to the first support substructure 31. Alternatively, the opening 903 can be realized directly in the second support substructure.

A guide such as a pin 902 is fastened to a plate 318. The plate 318 can move along a single direction Dir 2 (left to right or right to left on FIG. 9A and hence horizontally, with respect to the first support substructure). In the example of FIG. 9A and FIG. 3, the direction Dir 2 is parallel to the lower and upper side of a tile e.g. T9 which corresponds to the horizontal direction (perpendicular to the local field of gravity).

The plate 318 can glide in guides formed in or fastened to the first support substructure 31.

The opening 903 can consist of two parts 903A and 903B (separated by a dashed line on FIG. 9A). If the pin 902 occupies a first position with respect to the first support substructure 31, the second support substructure can move farther away along the direction Dir (the amplitude of the movement can be as large as the distance between points A and B on FIG. 9A).

FIG. 9A shows the relative position of the plate 901 and the pin 902 when the tile (e.g. tile T8) is in its nominal position (i.e. in normal use as shown in FIG. 4).

Figure 9B:
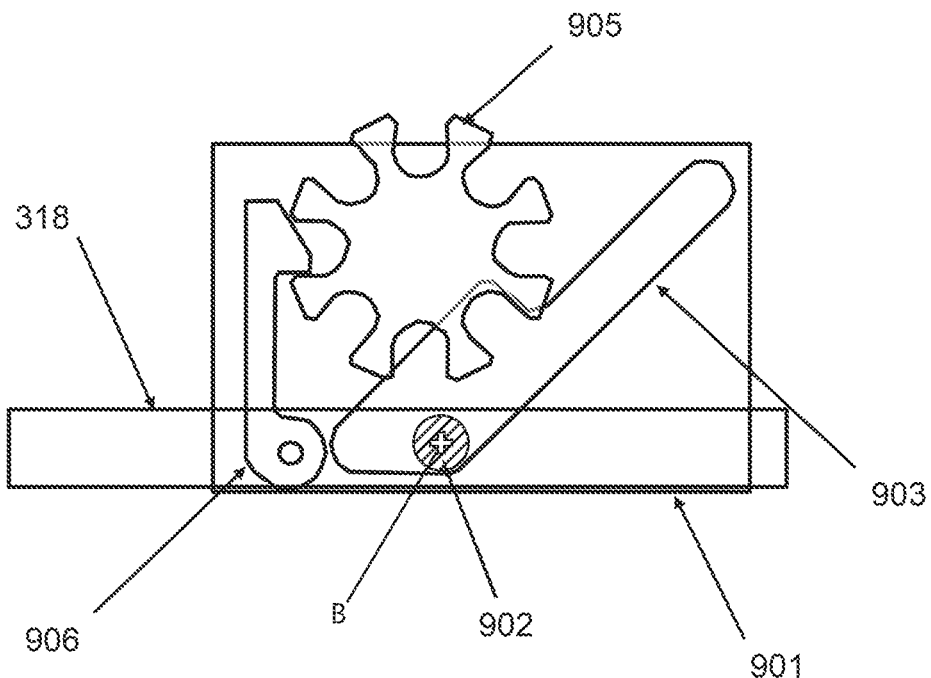

FIG. 9B shows the relative position of the plate 901 and the pin 902 when the tile (e.g. tile T8) has been raised as described earlier (i.e. as on FIG. 5).

Figure 9C:
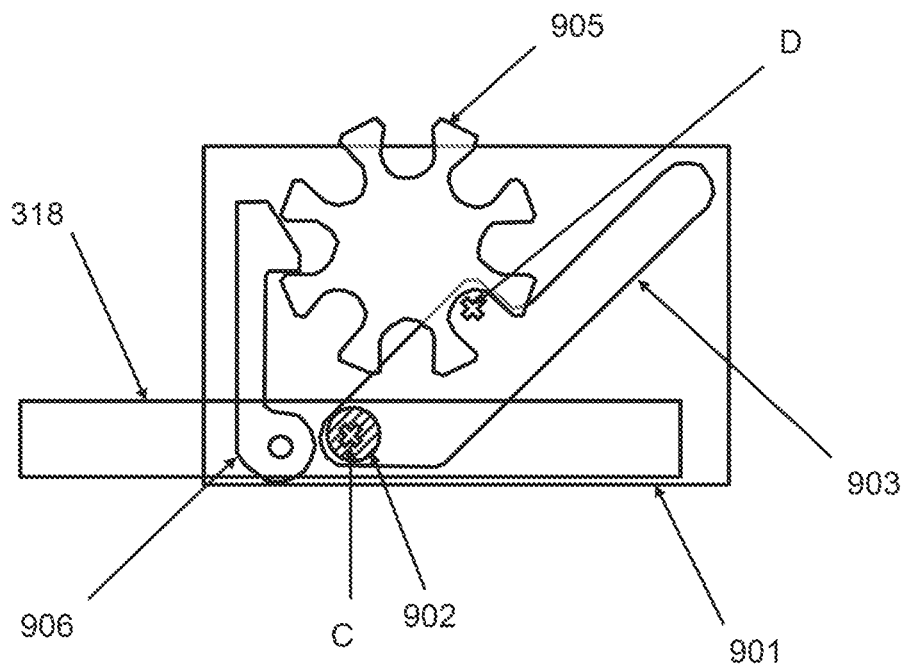
Figure 9D:
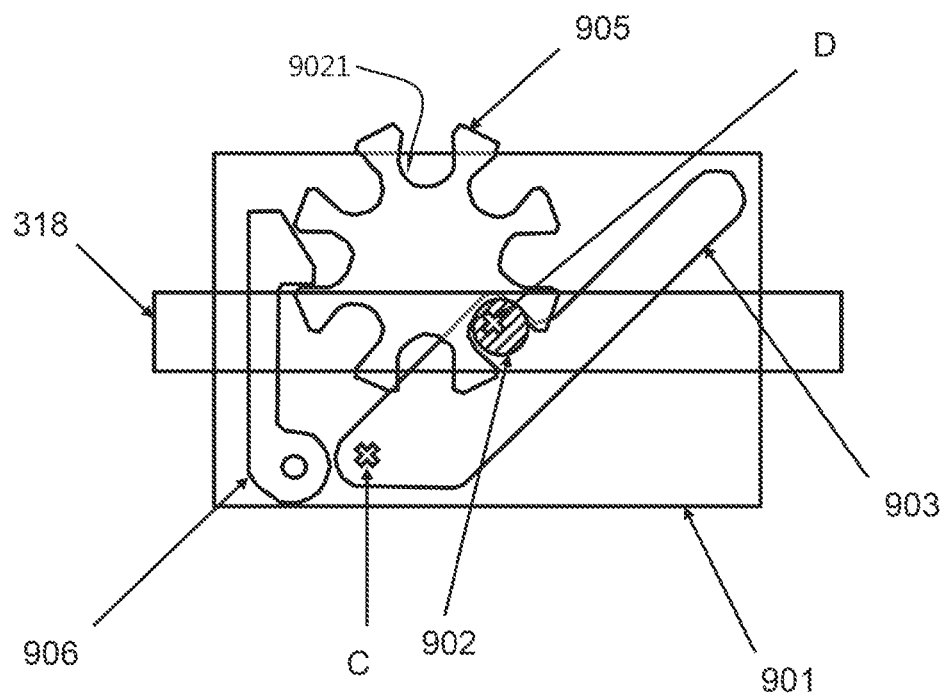

If the pin 902 occupies a position on the second part 903B of opening 903, the maximum amplitude of the movement for the second support substructure can be limited to the distance between points C and D on FIG. 9C. When the position of pin 902 is at point D (as in FIG. 9D) the plate 901 cannot glide further back and the tile (e.g. T9) remains at an intermediate position as in FIG. 8.

Figure 9E:
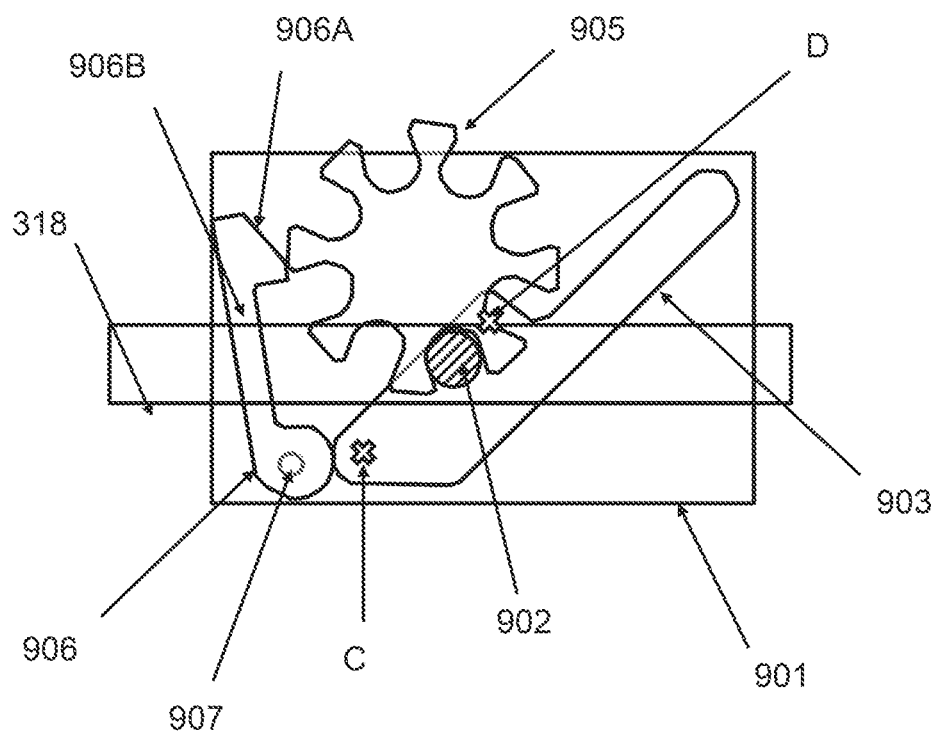

Once the pin 902 is in position C and the tile e.g. T9 falls back towards its original position P1, the pin 902 will be pushed into the space 9021 between two teeth of the cogwheel 905. The cogwheel 905 can rotate in a single direction. As can be seen on FIGS. 9C and 9D, the tip of hook 906 can be dislodged from the space between two teeth of the cogwheel only when the cogwheel rotates in a first direction When the cogwheel turn in the first direction, one of the teeth (upstream) of the hook can push on a slanted surface of the hook and dislodge the hook. In the opposite direction, the hook remains stuck in the space between two adjacent teeth, thereby preventing the wheel from actually turning. FIG. 9E shows how the hook can disengage from the cogwheel 905 while the plate 901 moves down under the action of gravity. As the plate 901 drops, the pin 902 enters the space between two teeth of the cogwheel 905 and by pushing on the side of a teeth, it makes the cogwheel move.

The position of pin 902 relative to the plate 901 can be switched from B (FIG. 9B) to C (FIG. 9C) by exerting a force on the plate 318 (the plate 318 glides from right to left between FIGS. 9B and 9C).

The movement of plate 318 (associated to a first tile e.g. T9) can be coupled to the movement of the lever used to change the position of the hammer associated to a second tile (e.g. T8). If the force exerted on the tile T9 is released, T9 will position itself as in FIG. 8 while T8 will keep its position (its motion being blocked by the hammer associated with tile T8). This coupling can be seen in the top right corner of FIG. 6A.

When an operator wishes to attend to e.g. tile T9, the operator can access the plate or lever 318 in the space between tile T9 and tile T6. By applying a force on the plate 318, the operator moves the pin 902 from a position B corresponding to FIG. 9B to position C on FIG. 9C. At the same time, the lever 318 modifies the configuration of the hammer 8316 associated with the tile T8.

By releasing the locking element 315 of tile T9, the quadrant gear 312 under the weight of the tile T9 is pushed back towards its original position until the pin 902 reaches position D and presses against the upper boundary of the opening 313B.

At that time, the configuration of the tiled display is as seen on FIG. 8.

There is now a space (less than D such as any of 0.2 to 0.8 D, such as 0.4 to 0.6 D, e.g. ½ D) between tile T8 and T9 that is larger than the original seam. The operator can access another lever to release the third support substructure 34. The third support substructure 34 is seen on FIGS. 3, 6A, 10 and 11.

When all tiles are in a position like illustrated in FIG. 8, elements of the mechanism behind the display tile T9 are accessible through the gap G both on the vertical and horizontal sides of the tile T9 (thereby giving more freedom to design the mechanism releasing a display tile).

Figure 10C:
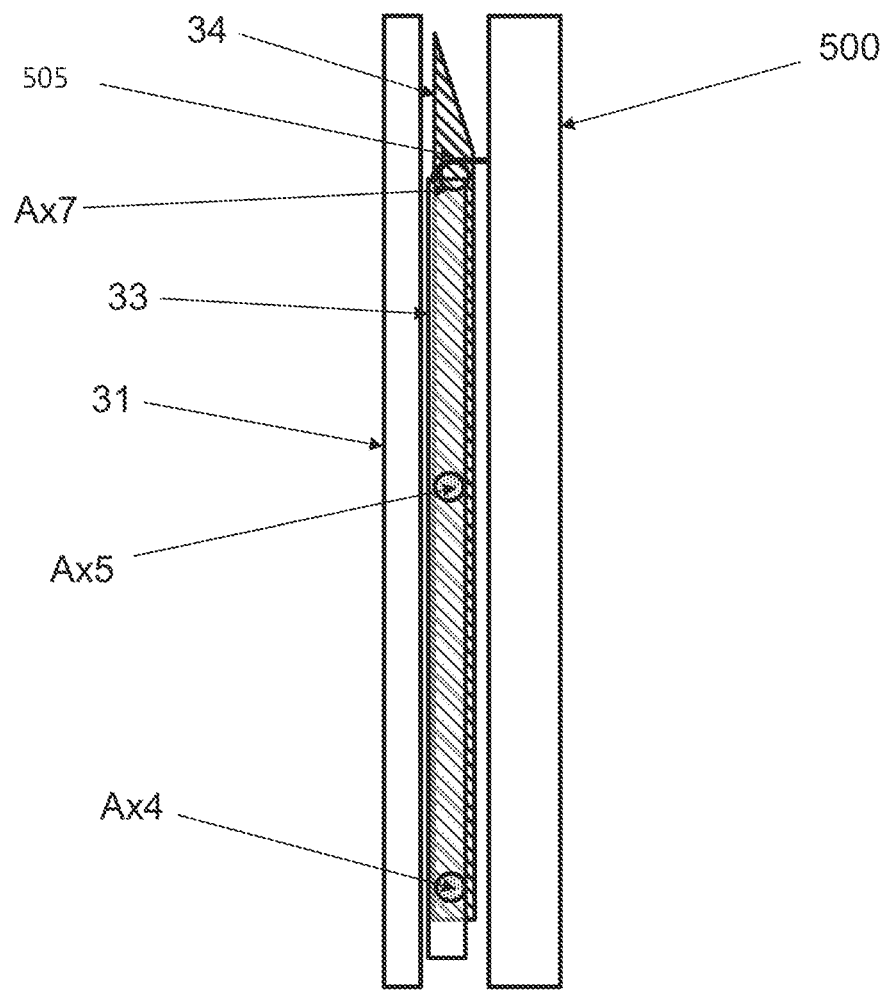

FIG. 10A shows a cross section of a further mechanism to move the tile out of the display plane X-Y. Element 341 can e.g. be a clip that can be reached through the gap between tiles T8 and T9. There can be more than one element 341 along the X direction. When element 341 is activated, it releases the support substructure 34, and then can rotate around an axis Ax4 as illustrated on FIG. 10B. The axis Ax4 is parallel to the display plane XY. In the embodiment being described, the axis of rotation Ax4 is parallel to the X axis of the coordinate system represented on e.g. FIG. 3. The display tile 500 (not shown in FIG. 10A or 10B) can be hung onto the third support substructure 34 along an axis of rotation parallel to Ax4. When the support substructure 34 rotates out of the display plane, under the action of the weight of the tile 500, the display tile 500 can remain parallel to the display plane (XY) in a resting position as illustrated on FIG. 10C. The display tile can e.g. hang onto an axis Ax7 fastened to the third support substructure 34. The axis Ax7 is parallel to the axis Ax4. The amplitude of the rotation around the axis Ax4, can be limited e.g. by an arm 342. The arm 342 has a first extremity that can rotate around a first axis of rotation Ax5 that is fixed to the second support substructure 33. The arm 342 has a second extremity that can rotate around a second axis of rotation Ax6 that is fixed to the third support substructure 34. In the embodiment of FIGS. 10A and 10B, the axis of rotation Ax5 and Ax6 are parallel to the axis of rotation Ax4. The length of the arm 342 and the position of the axis Ax5 and Ax6 determine the maximum amplitude of the rotation of the third support substructure 34 around the axis 34. Other mechanisms are possible to limit the amplitude of the rotation of the third support substructure 34 around axis Ax4.

Figure 10D:
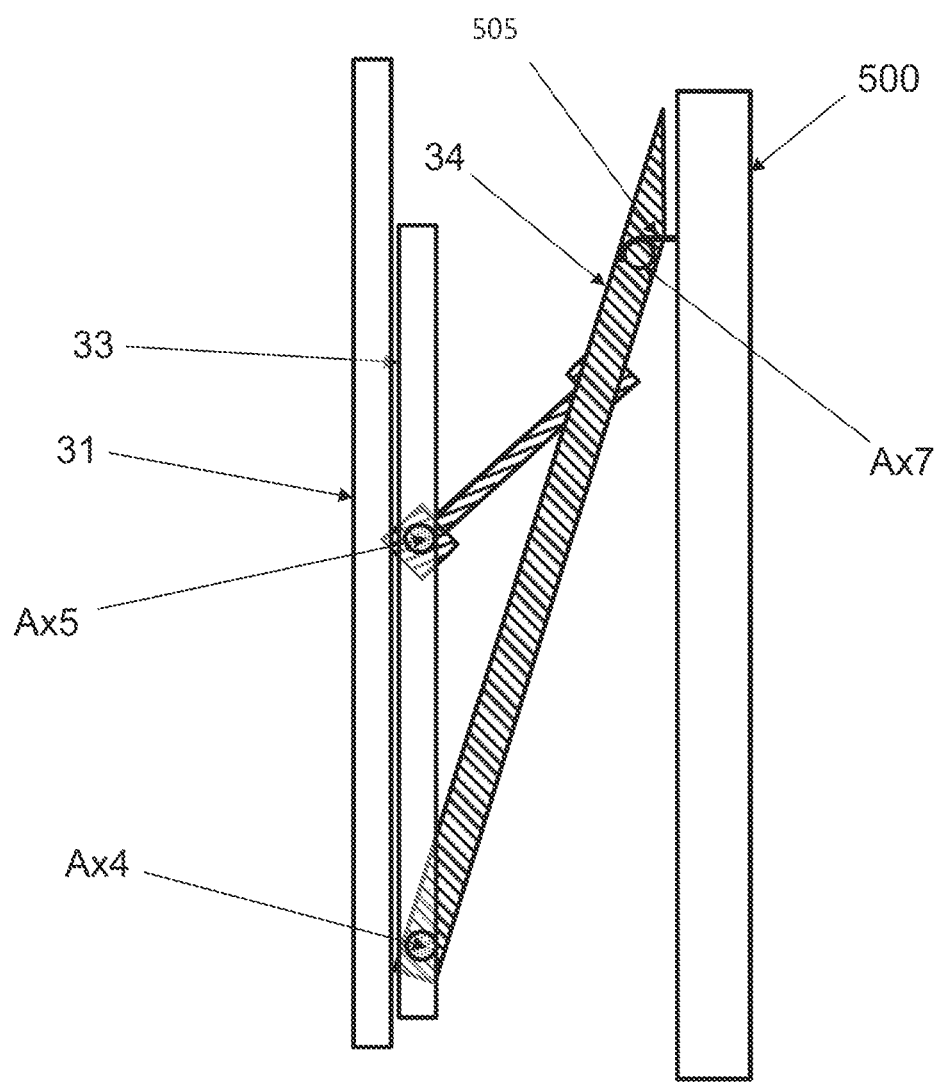

The cross sections on FIGS. 10C and 10D shows the position at rest of the display tile 500 with respect to the support substructures and in particular with respect to the third support substructure 34.

One or more hooks 501 fastened to the back of the display tile 500 are spread along the axis Ax7 around which the display tile 500 can rotate.

The display tile 500 has one or more connectors (e.g. 501 for data and control signals and 502 for power on FIG. 12) on its backside of the tile.

Connectors to connect electronic modules (like a Power Supply Unit 601 (PSU) and processing means 602) to control and supply power to the display tile 500 are preferably installed on the second support substructure 33. The PSU 601 and the processing means 602 can be fastened either to the first support substructure 31 or the second support substructure 33 as long as the electric connections (like cables) between the PSU and processing means on one hand and the connectors (603 and 604) on the second support substructure that will mate with the corresponding connectors 501 and 502 can accommodate the movement of the display tile from the first position P1 to the second position P2.

In another embodiment of the present invention, each display tile of a tiled display is fastened to a support structure by means of at least one support substructure (33) to which the display tile can be fastened, the at least one support substructure (33) being characterized in that it is linked to the support structure by means of a first mechanism allowing movements of the display tile in a plane parallel to the nominal plane of the tiled display. The at least one support substructure corresponds to the second support substructure 33 of the previous embodiment. In that case, each of the second support substructures is fastened to a common support structure without the need for a first support substructure 31. As in the previous embodiment, a driving mechanism can be provided to drive more than one display tile, e.g. the tiles that are positioned in column (in a direction parallel to the local vertical). Alternatively, each of the tiles can have its own driving mechanism (e.g. a motor that is activated wirelessly). For instance, for a tiled display comprising three columns, each column having three display tiles, activating the driving means of tile T8 will move tiles T8 and T7 away from the rest of the display tiles along the direction DIR. The difference with the previous embodiment being that tile T9 can keep its position. The movements imposed to tile T8 and T7 can be different. For instance, the motor associated to the first mechanism of tile T7 can bring the tile T7 to its second position P2 while at the same time the motor associated with the first mechanism of tile T8 will bring the tile T8 to its third position P3 thereby creating a gap all around the tile T8.

The advantage of the first support substructure 31 is that it can be used to correct tolerances affecting the support structure (i.e. a wall and/or a network of trusses) in order to improve the precision of the alignment of the display tiles not only in the X and Y direction but in the Z direction as well.

Means for aligning display tiles or other structures such as frames in the Z direction relate to a dependent or independent aspect of embodiments of the present invention. Aligning up to 4 adjacent tiles can be done by means of at least one alignment mechanism 32 (32A to D) which is shown in FIG. 3 (32A, 32B, 32C are visible and 32D is hidden). The alignment mechanism 32 shown in FIG. 3 may be used as a dependent alignment element with any of the embodiments described with reference to FIGS. 3 to 12. These combinations are herewith expressly incorporated into and disclosed in the present invention. The alignment mechanism 32 as described in detail with reference to FIGS. 13A to 15B can be used with any of the embodiments described with reference to FIGS. 3 to 12 and these combinations are expressly incorporated into and disclosed in the present invention. In particular, a support substructure (33) can be fastened to a support structure such as a wall by the intermediary of another support substructure (31) which is fastened to the support structure by means of the alignment mechanism (32). The alignment mechanism (32) can be used for aligning adjacent display tiles.

The alignment mechanism 32 shown in FIGS. 13A to 15B also relates to an independent device which can be used with a variety of frames or structures not just those described with reference to FIGS. 3 to 12.

In particular, these embodiments of the present invention (as shown in detail in FIGS. 13A to 15B and FIG. 3) can relate to a support substructure for use in fastening a tiled display having an array of display tiles, to a first support structure, the support substructure being for fastening to the support structure by means of an alignment mechanism (32), the alignment mechanism (32) being for aligning adjacent display tiles, further comprising a first fastening bolt (250) perpendicular to the first support substructure, further comprising means for displacement of the alignment mechanism (32) in the direction parallel to the axis of the first fastening bolt (250).

Figure 13A:
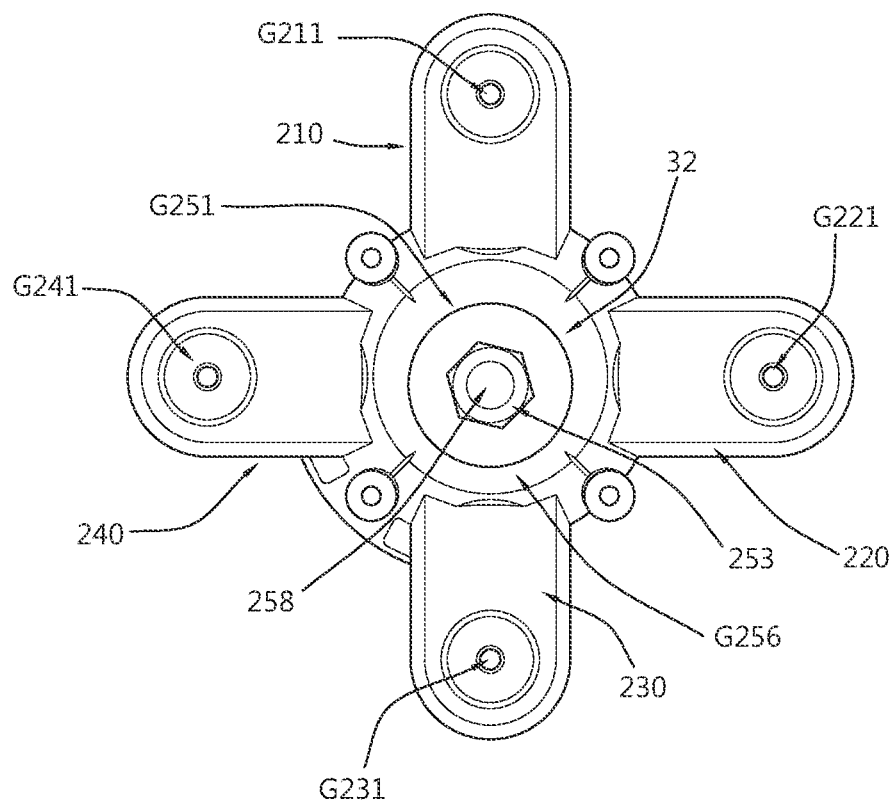
FIGS. 13A and 13B show views of an alignment mechanism (like 32A, 32B, 32C and 32D) to align adjacent display tiles.
Figure 13B:
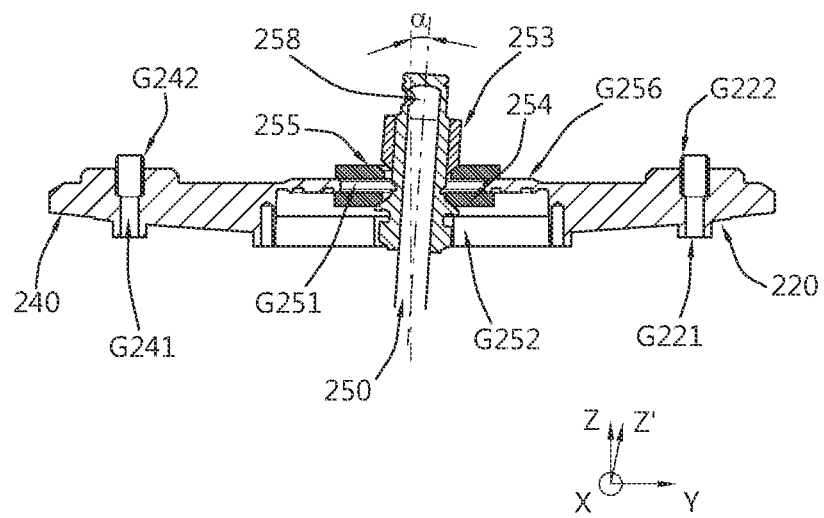

FIG. 13A shows a top view of alignment mechanism 32 and FIG. 13B shows a cross section in accordance with an embodiment of the present invention.

Alignment mechanism 32 comprises a central section G256. The central section G256 can e.g. be cylinder shaped. Arms 210, 220, 230 and 240 are fastened to the central section. Arms and central section can e.g. be machined in the same block of material (e.g. steel, aluminum, . . . ). In the preferred example of FIG. 13A, the arms are positioned symmetrically around the central section (two consecutive arms are separated by an angle of preferably 90°). Each arm of an alignment mechanism 32 can be fastened to a different first support substructure. In the example of FIG. 13A, a hole in each of the arms can receive a pin or screw to be fastened to a first support substructure 31 (hole G211 in arm 210, hole G221 in arm 220).

The alignment mechanism 32 can be fastened to a tiled display support structure (e.g. a wall). In the example of FIGS. 13A and 13B, this can be done by first fastening a bolt 250 preferably perpendicular to the tiled display support structure or wall (not shown in FIGS. 13A and 13B).

Elements 250 and 258 preferably have a matching thread. Element 258 together with the alignment mechanism 32 is screwed onto the bolt 250. Rotation of the element 258 around the bolt 250 hence allows displacements of the alignment mechanism in the direction parallel to the axis of the bolt 250. Especially preferred is a solution where alignment mechanism 32 is free to rotate around 258 until the nut 253 is fastened.

The bolt 250 and the carrier 258 are going through a preferably spring loaded section G252 that allows movement in the X and Y directions of the alignment mechanism 32 around the carrier 258 within the limits of the opening G251. The presence of a spring-loaded section G252 in absence of other higher forces enables self-centering of the alignment mechanism 32 around the bolt 250. The alignment mechanism can be tilted with respect to the bolt (the angle α can vary) as long as the nut 253 is not fastened.

Hence, the alignment mechanism can be moved relatively to the bolt 250 with all 6 degrees of freedom (3 translational and 3 rotational directions) before being fixed relatively to the bolt.

After the alignment mechanism 32 is put in the desired position, the carrier 258 is fastened on the bolt with a counter nut (not shown in FIG. 13B) which is put on the bolt 250 directly below the carrier 258. The alignment mechanism then is fastened relative to the carrier 258 by tightening the nut 253 thus clamping the discs 254 and 255 in the central section G256 and in between carrier 258 and nut 253 through the opening G251.

Figure 14A:
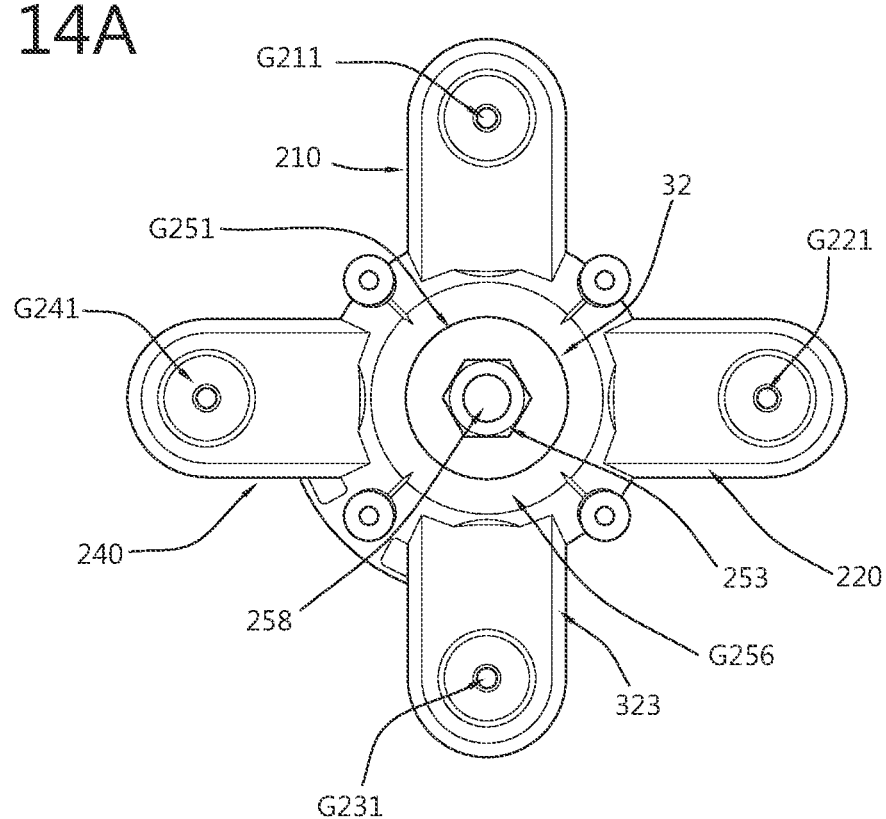
Figure 14B:
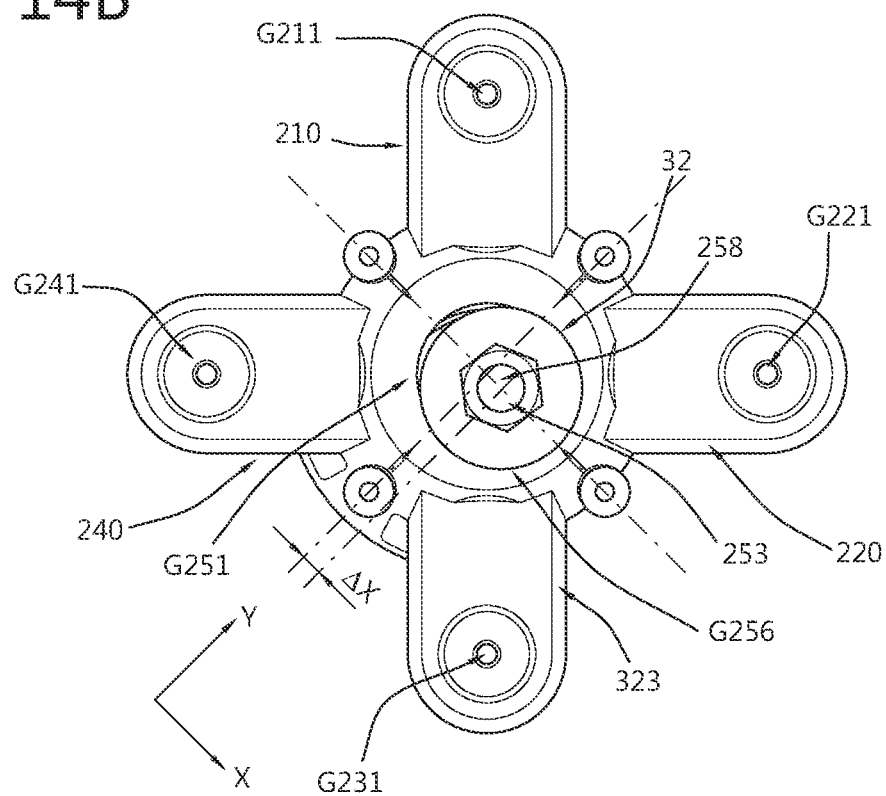

FIG. 14A shows a top view of the alignment mechanism with the alignment mechanism, the spring loaded section G326 and bolt 325 perfectly centered. FIGS. 14B and 14C illustrate how the alignment mechanism can move with respect to the bolt 250 and carrier 258.

FIG. 14C shows displacement ΔY of the alignment mechanism in the Y direction made possible by the spring loaded section G252.

The allowed translational and angular displacements of the bolt 250 within the opening G251 by the preferably spring loaded section G252 make it possible to install adjacent tiles without increasing the seam around the panels in spite of tolerances on the position of the bolt holes used to fasten the tiles to e.g. a wall.

Figure 15A:
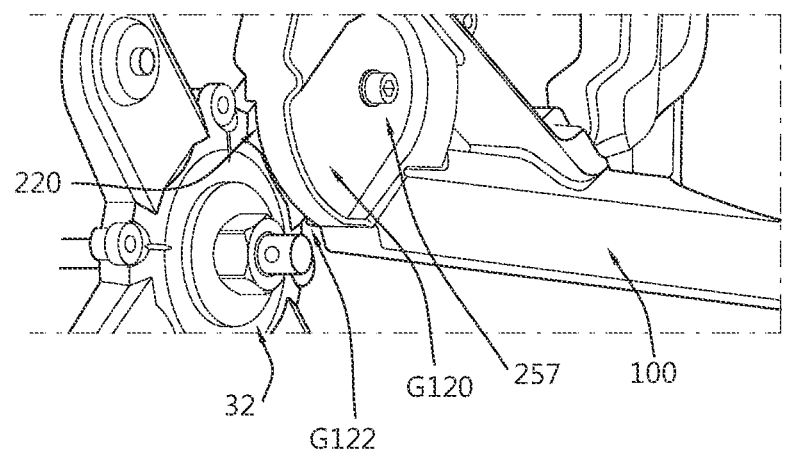
FIGS. 15A and 15B show view of an adjustment mechanism and the first support substructure (31).
Figure 15B:
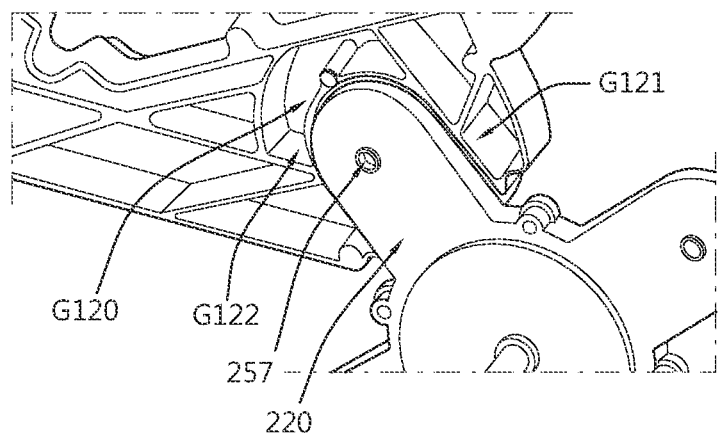
Figure 16:
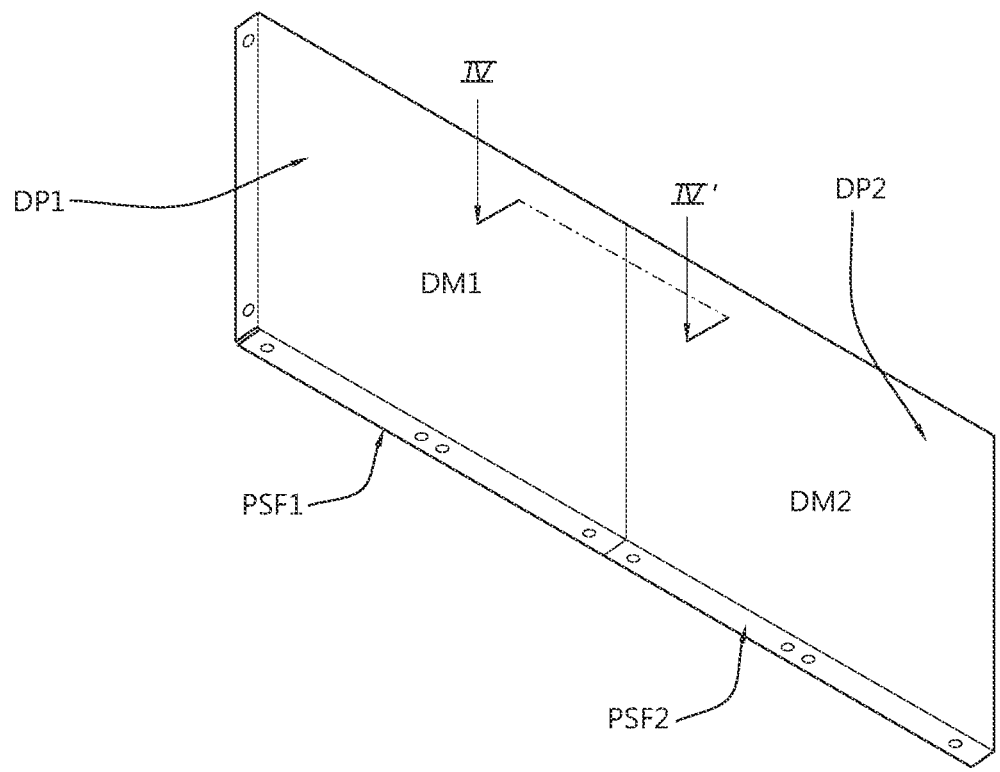
FIG. 16 shows two display tiles tiled together as known in the art.
Figure 17:
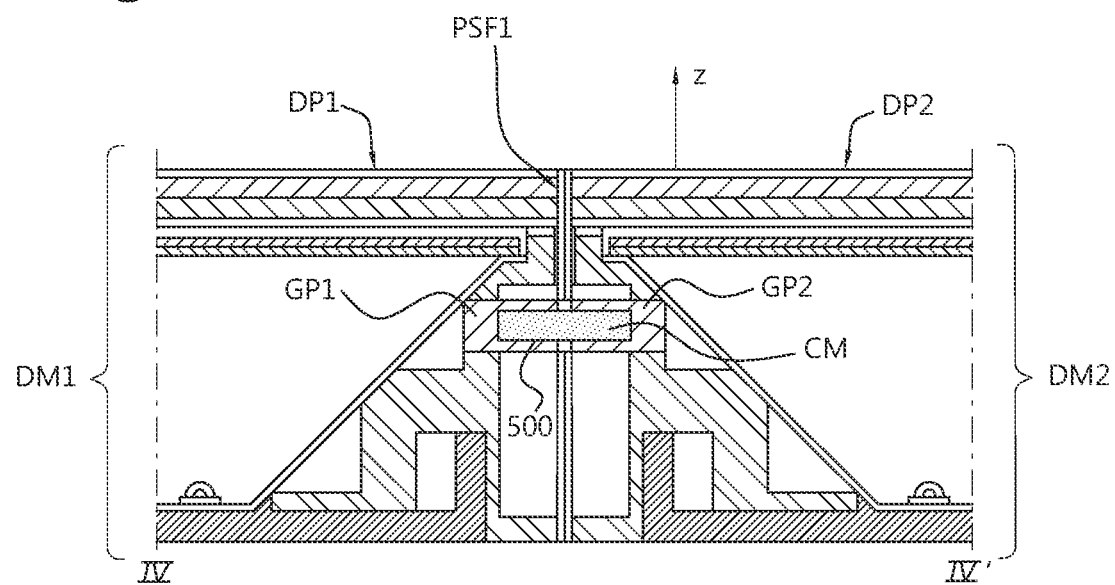
FIG. 17 shows a cross section of the tiled display on FIG. 16 and the alignment mechanism.
Figure 18:
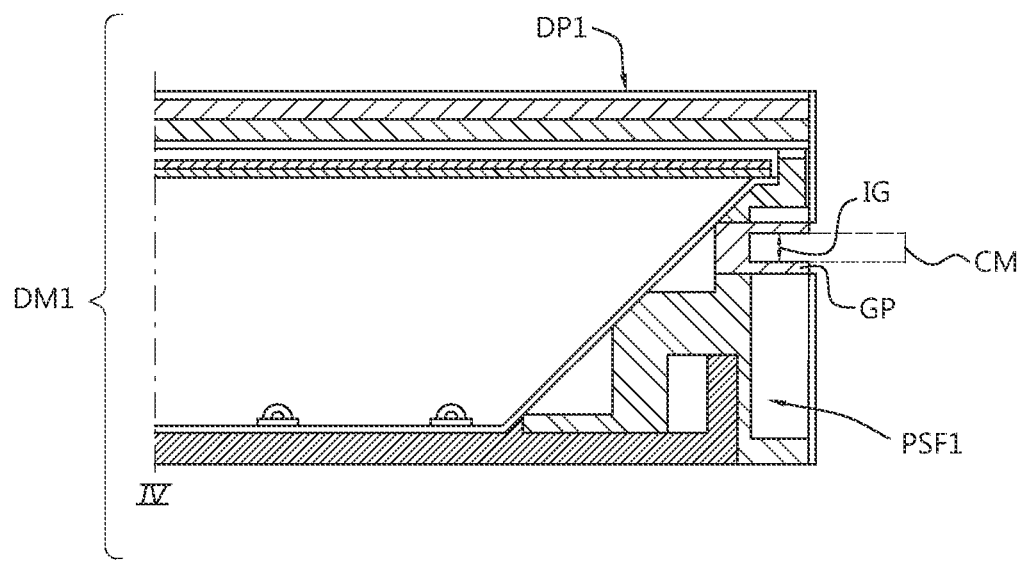
FIG. 18 shows a cross section of a display tile without the connection member.
Figure 19:
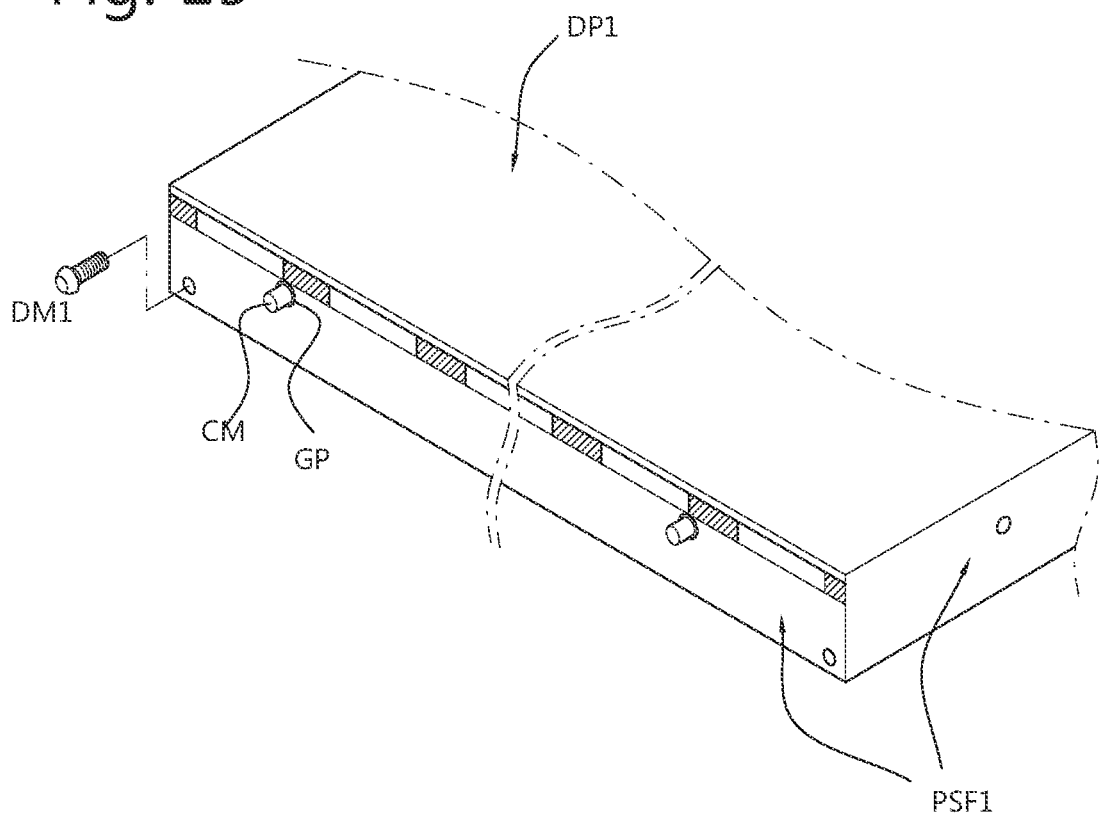
FIG. 19 shows a perspective view of a display tile known the art and the disposition of connection members and guide protrusions along a side of the display tile.
Figure 20:
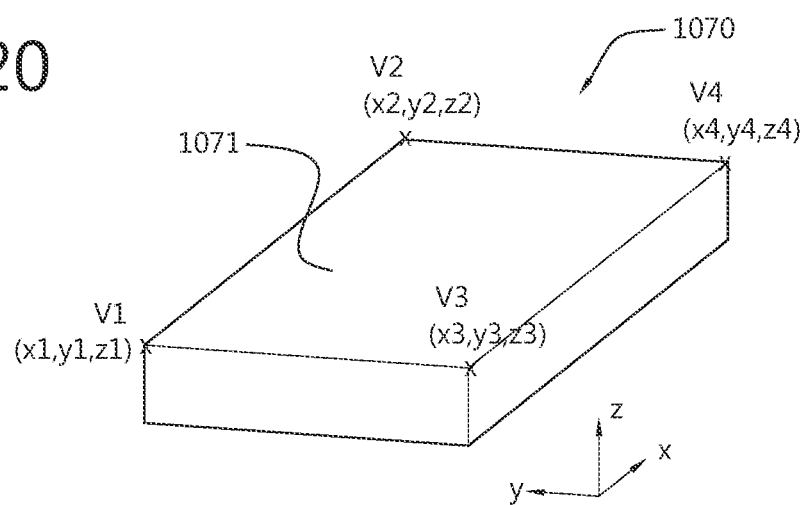
FIG. 20 shows a perspective view of a display tiled whose position is defined by 6 degrees of freedom.
Figure 21:
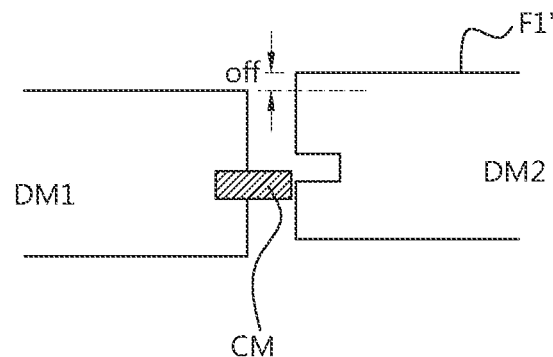
FIG. 21 illustrate a possible consequence of an overdefined tiled display.

As illustrated on FIGS. 15A and 15B, fastening a first support substructure 31 to the alignment mechanism 32 can be done with a single bolt 257 fastened in one of the geometries G211, G221, G231, G241, in particular if the first support substructure 31 has a mating section G120 corresponding to an arm e.g. 220 of the alignment mechanism 32. The walls G121 and G122 of the mating section on both sides of the arm 220 will prevent rotation of the arm 220 around the axis of the bolt 257. The pin shaped geometries on each arm (e.g. G222 on arm 220, see FIG. 13B) fit each into a hole in the extensions (130 and 140) of the first support substructure 31, thus positioning the support structure (100) in relation to the alignment mechanism (32) as well as in relation to possible adjacent support structures. Especially preferred is a geometry, where the hole for the bolt (257) in each of the arms (210, 220, 230, 240) is positioned within the pin shaped geometry (e.g. hole G221 within pin G222 in arm 220, see FIG. 13A). Alternatively, it is thinkable to substitute the pin shaped geometries (e.g. 222) on the alignment mechanism (32) with bolt shaped geometries fixed on top of the pins (like a fixing bolt) and to substitute the bolts (257) with nuts.

FIGS. 15A and 15B also indicate that for the preferred design of the alignment mechanism as illustrated in FIG. 13A, in case of a tiled display wall incorporating n*m display tiles 500 and preferably (n+1)*(m+1) alignment mechanisms 32, at the outer circumference of the tiled display wall at least two out of the four holes G211, G221, G231, G241 of each alignment mechanism are not used to keep a support structure (100) fixed. These can be used when adding further support structures (100) to the tiled display wall at a later stage.

Summarising the above, a support substructure is disclosed wherein the alignment mechanism 32 comprises an element with a central section, the central section having arms that are fastened to the central section, the arms radiating out from the central section. They radiate in a diverging manner. The arms can be positioned symmetrically around the central section and optionally two consecutive arms are separated by an angle of 90°. A hole in each of the arms can be used to receive a pin or screw to be fastened to the first support substructure. A first element 258 together with the alignment mechanism 32 can be screwed onto the first fastening bolt 250. The means for displacement of the alignment mechanism in the direction parallel to the axis of the first fastening bolt 250 is by rotation of the first fastening bolt 250. The alignment mechanism 32 can be made free to rotate around the first element 258 until a nut 253 is fastened.

The first fastening bolt 250 and the first element 258 can go through a spring loaded section G252 that allows movement in orthogonal directions of the alignment mechanism 32 around the first element (258) within the limits of an opening G251. The spring-loaded section G252, in absence of other higher forces enables self-centering of the alignment mechanism 32 around the first fastening bolt 250. The alignment mechanism 32 can be tilted with respect to the first fastening bolt as long as the nut 253 is not fastened.

The alignment mechanism 32 can be moveable relative to the first fastening bolt 250 with all 6 degrees of freedom before being fixed relatively to the first fastening bolt. The alignment mechanism 32 can be fastened relative to the first element 258 by a tightened nut 253 thus clamping discs 254, 255 in the central section G256 and in between first element 258 and nut 253 through the opening G251. The first element 258 can be fastened on the bolt with a counter nut which is put on the bolt 250 directly below the first element 258. The allowed translational and angular displacements of the first fastening bolt 250 within the opening G251 by the spring loaded section G252 allow installed adjacent tiles not to have an increase of the seam around panels in spite of tolerances on the position of the bolt holes used to fasten the tiles.

A first support substructure 31 can be fastened to the alignment mechanism 32 with a single bolt 257 fastened in one of geometries G211, G221, G231, G241. The first support substructure 31 has a mating section G120 corresponding to an arm (220) of the alignment mechanism (32). Walls G121 and G122 of the mating section on both sides of the arm 220 prevent rotation of the arm 220 around the axis of the single bolt 257. Pin shaped geometries on each arm (G222 on 220) fit each into a hole in extensions (130 and 140) of the first support substructure (31), thus positioning the support structure 100 in relation to the alignment mechanism 32 as well as in relation to any adjacent support structures. A geometry, wherein the hole for the single bolt 257 in each of the arms 210, 220, 230, 240 is positioned within the pin shaped geometry, e.g. G221 within pin G222 in arm 220. Bolt shaped geometries can be fixed on the alignment mechanism 32 on top of the pins and to substitute the single bolts 257 with nuts. In the case of a tiled display wall incorporating n*m display tiles 500 and (n+1)*(m+1) alignment mechanisms 32, at the outer circumference of the tiled display wall at least two out of the four holes G211, G221, G231, G241 of each alignment mechanism 32 are not used to keep a support structure 100 being fixed. The at least two out of the four holes can be used when adding further support structures 100 to the tiled display wall.

A tiled display can be connected to the support structure as disclosed above. The alignment element 32 can be used with a support substructure 31 for fastening a display tile 500 to a support structure of a tiled display, the support substructure 33 being characterized in that it is linked to the support structure by means of a first mechanism allowing movements of the display tile in a plane parallel to the nominal plane (XY) of the tiled display independently of the presence or absence of adjacent display tiles. The alignment element 32 can be used with a support substructure 31 each for fastening a display tile 500 to a support structure of a tiled display, adjacent display tiles in the tiled display being separated by a nominal seam, the support substructure 33 being characterized in that it is linked to the support structure by means of a first mechanism allowing movements of each display tile in a plane parallel to the nominal plane (XY) of the tiled display to form a gap (G) between adjacent display tiles obtained by moving one or more display tiles from a first position (P1) to a second position (P2) and a second mechanism fixing the position of the at least one support substructure 33 in the second position, wherein the gap (G) is larger than the nominal seam.

The alignment element 32 can be used with the first mechanism which can be driven by e.g. a motor or a hand crank or a key. The first mechanism can include means to transform a rotary movement into a translation of the at least one support substructure. The alignment element 32 can be used with the first mechanism when it comprises a quadrant gear 312 and a pin (331), the quadrant gear being for exerting a force on the support substructure (33) by the intermediary of the pin 331. The alignment element 32 can be used with the first mechanism when it comprises guiding means to help controlling the direction and/or amplitude of the movement of the support substructure. The alignment element 32 can be used with a release mechanism. The alignment element 32 can be used with a display tile that has one or more contact elements (510, 520, 530, and 540) for exerting a force on an adjacent display tile. The contact elements can be used to provide self-alignment when the tiles are close as possible to each other. The alignment element 32 can be used with a second mechanism which can fix the position of the at least one support substructure (33). The second mechanism can comprise a lever or hammer 316 that can take two positions and a pin 332 fastened to the support substructure 33: in a first position, the hammer cannot prevent free movement of the pin 332, and in a second position H2, the hammer prevents free movement of the pin 332. The alignment element 32 can be used with a display tile (500) which is fastened or mated to the support substructure 33 by the intermediary of another support substructure (34), the other support substructure 34 comprising a mechanism for moving the display tile outside of the display plane (XY).

Figure 22:
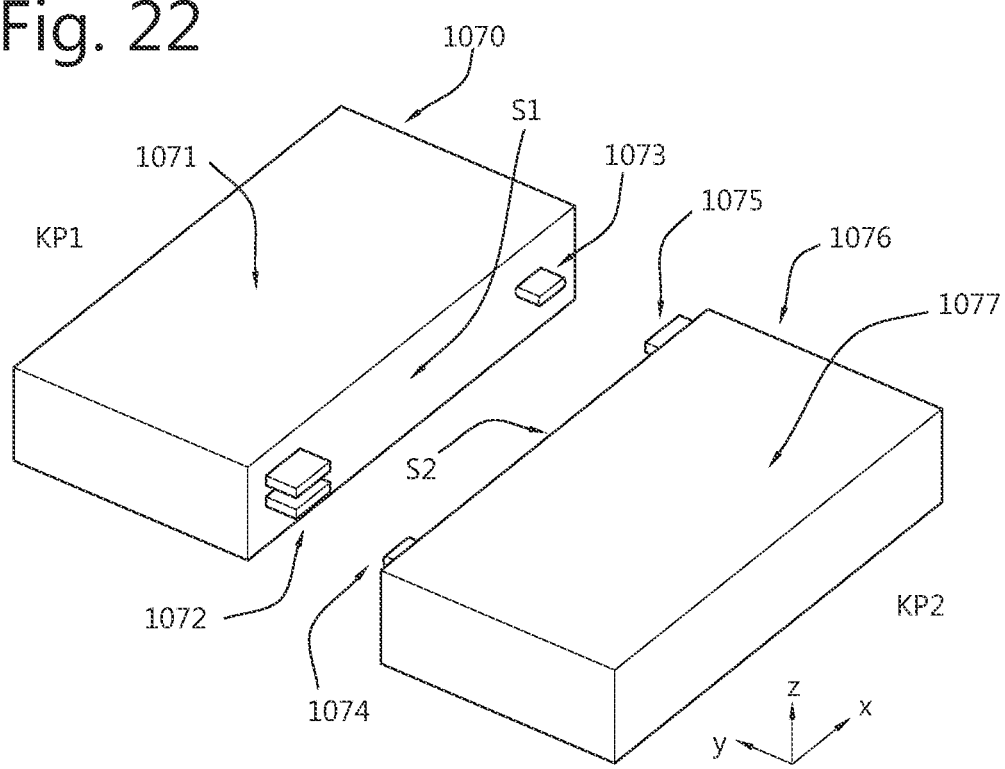
FIG. 22 shows an example of tiled display according to an embodiment of the present invention.

As described above, tiled displays according to embodiments of the present invention include an alignment element 32. FIG. 22 shows two display tiles which can be used in a tiled display according to a further dependent or independent embodiment of the present invention having an alignment in the Z direction. This embodiment and the later embodiments which are described with reference to FIGS. 22 to 32B can be used as a standalone Z direction alignment device and method in any suitable application. For example, the Z alignment device and method as described with reference to FIGS. 22 to 32B can be used in tiles of a tiled display, but not necessarily including features from FIGS. 1 to 21. Alternatively, any of the embodiments which are described with reference to FIGS. 22 to 32B can be included in any of the embodiments described with reference to FIGS. 1 to 15 as an alternative or as an additional alignment device for display tiles for alignment in the Z direction. In particular, embodiments of the present invention can provide a tiled display having an array of display tiles, comprising an alignment mechanism 32, the alignment mechanism 32 being for aligning adjacent display tiles in the Z direction. This alignment can be provided by an alignment device disclosed with reference to FIGS. 1 to 15 and/or FIGS. 22 to 32B.

For example, an application can be a support substructure for use in fastening a tiled display having an array of display tiles, to a support structure, the support substructure being for fastening to the support structure by means of an alignment mechanism. The alignment mechanism can be for aligning adjacent display tiles, further comprising a first fastening bolt perpendicular to the support structure, further comprising means for displacement of the alignment mechanism in the direction parallel to the axis of the first fastening bolt, i.e. in the Z direction.

Returning to FIG. 22, an alternative alignment device is shown for display tiles of a tiled display. This tiled display has a first and a second display tile 1070 and 1076, respectively which may also be described as modules. The display tiles shown are quadratic and may be square. The dimensions of the display tiles may be determined by known formats for displaying images and videos. The display tiles can be fixed format displays. The display tile 1070 has a display surface 1071 which is a major surface of the tile. The display tile 1076 has a display surface 1077 which is a major surface of the tile. A side S1 of the first display tile 1070 (e.g. S1 lies in a plane perpendicular to the display plane of the display surface 1071) has a first body 1072 of a first kinematic pair KP1 and a second body 1073 of a second kinematic pair KP2. A side S2 of the second display tile 1076 (e.g. S2 lies in a plane perpendicular to the display plane of the display surface 1077) has a second body 1074 of the first kinematic pair KP1 and a first body 1075 of the second kinematic pair KP2. The sides S1 and S2 face each other when installed in a tiled display. The tiled display is characterized in that the first and second kinematic pairs KP1 and KP2 can impose a constraint on the relative movement of their first and second bodies 1072 and 1074, respectively. This constrained movement can be in a direction perpendicular to the display plane and in that they can be deactivated independently of each other. The display plane is the plane which is parallel to the display surfaces 1071 and 1077 or in which the display surfaces 1071 and 1077 are located. In the example of FIG. 22, that direction (perpendicular to the display plane) is along the Z axis.

It is preferred to have at least two kinematic pairs located along each side S1 and S2. Preferably, the first and second kinematic pairs are located from each end respectively of sides S1 and S2 within one quarter or one third of the length of the sides S1 or S2. In this way, there is a spacing between the first and second kinematic pairs and these control the positions of one tile with respect to adjacent tiles in the Z direction.

Although the kinematic pairs are described as having two elements, they can have an even number of elements more than two. Hence, a kinematic pair on one side of a display tile may also have an odd number of elements which fit into an even number of elements on a side of an adjacent tile.

When a kinematic pair is active, it facilitates the alignment of the display surface 1071 with the display surface 1077. This alignment is at least in the Z direction and can be in the X and/or Y directions as well.

Figure 23:
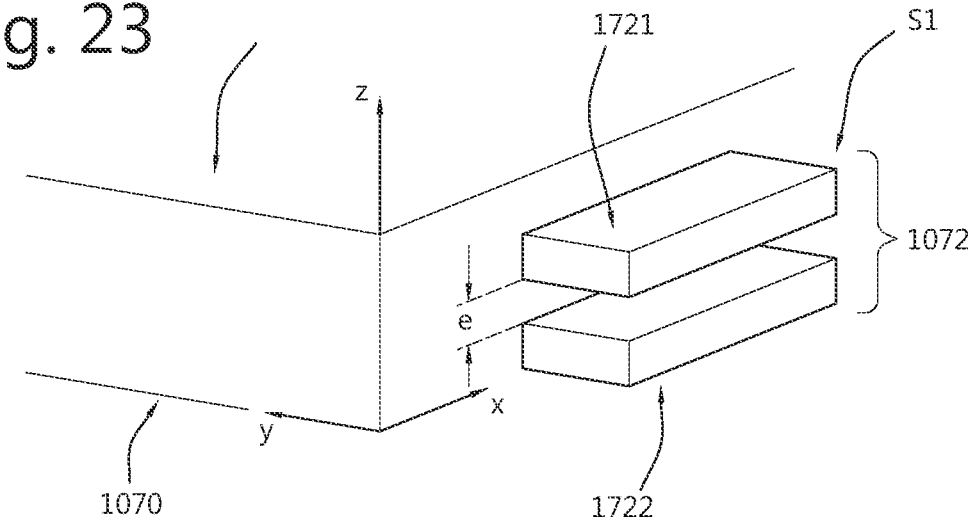
FIG. 23 shows a perspective view of an example of a first part of an alignment mechanism according to an embodiment of the present invention.

FIG. 23 shows a detail of the first body 1072 of the first kinematic pair KP1 of FIG. 22.

The first body 1072 has a first element 1721 and a second element 1722 on side S1 that delimit a space in between them, and into which space the second body 1074 can fit, as will be described later. Both elements 1721 and 1722 are fixed with respect to the first display tile 1070.

In the embodiment of FIG. 23, the first and second elements 1721 and 1722 are plate like elements (e.g. rectangular parallelepipeds) which extend away from the respective first and second sides S1 and S2. The first and second elements 1721 and 1722 e.g. both being parallelepipeds extend parallel to the display surface 1071, and both extend in a direction perpendicular to the direction Z. The distance between first and second elements is shown as "e".

Figure 24A:
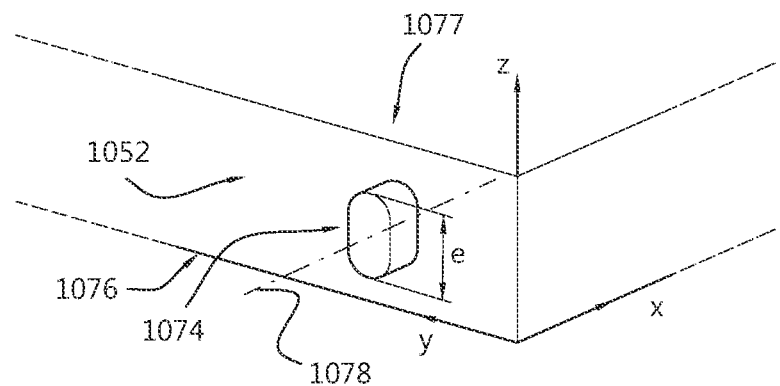
FIG. 24A shows a perspective view of an example of a second part an alignment mechanism according to an embodiment of the present invention when said second part is in a first or active state.

FIG. 24A shows a detail of the second body 1074 of the first kinematic pair KP1 of FIG. 22.

Figure 25A:
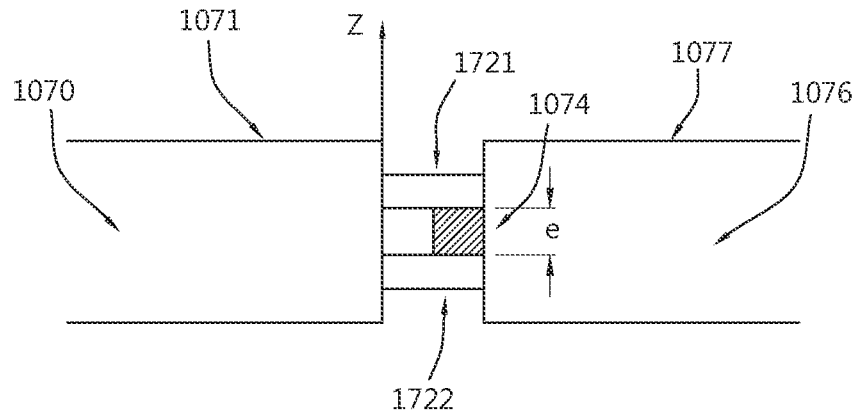
FIG. 25A shows the relative position of the first and second part of an alignment mechanism according to an embodiment of the present invention when said second part is in a first or active state.

The second body 1074 is shaped to fit in the space delimited by the first and second elements 1721, 1722 of the first body 1072 as illustrated on FIG. 25A. In that position, the kinematic pair not only prevents the relative motion of the display tiles 1070 and 1076 along the Z direction but also sets the positions of the display tiles relative to each other in the Z direction. Movements in other directions are still possible, in particular, as illustrated on FIG. 26, the tile 1076 can still move freely in at least a part of the XY plane e.g. along a direction at an angle such as 45° from the Ox axis. A preferred movement is at an angle to the vertical (Y axis) such as an angle in the range 10 to 80° or 20 to 70° or 30 to 60° or 40 to 50° e.g. 45°.

Figure 24B:
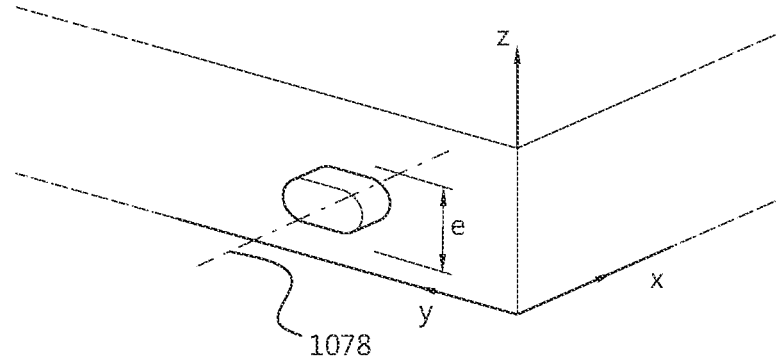
FIG. 24B shows a perspective view of an example of a second part an alignment mechanism according to an embodiment of the present invention when said second part is in a second or inactive state.

FIG. 24B shows a detail of the second body 1074 of the first kinematic pair KP1 when the second body 1074 is in a second position.

Figure 25B:
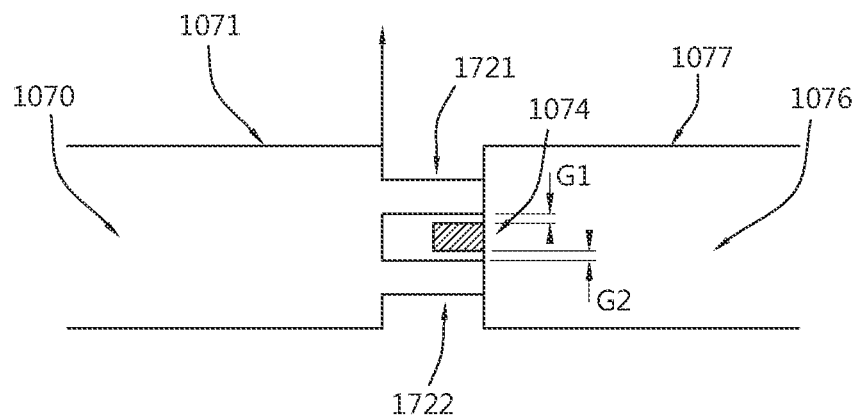
FIG. 25B shows the relative position of the first and second part of an alignment mechanism according to an embodiment of the present invention when said second part is in a second or inactive state.
Figure 26:
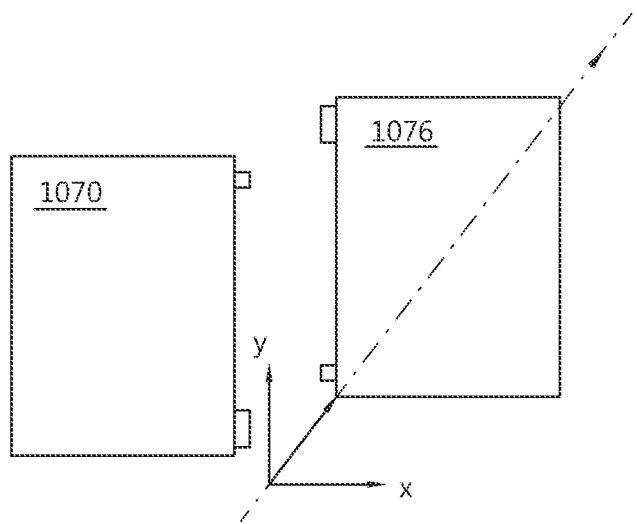
FIG. 26 shows an example of displacement of a display tile still allowed by an alignment mechanism according to an embodiment of the present invention.

FIG. 25B shows a cross section of the first kinematic pair KP1 with the second body 1074 in its second position. There is at least one gap and preferably two gaps G1 and G2 between the second body 1074 and the first and second elements 1721, 1722 of the first body 1072. These gaps each allow some movement along the Z axis. When it is necessary to relax the constraints introduced by a kinematic pair KP1, KP2, said kinematic pair can be deactivated by placing the second body 1074 in a second position.

In the embodiment of FIGS. 24A and 24B, the second body 1074 has a single degree of freedom. It can rotate around an axis 1078. The second body 1074 can be a pin e.g. a cylinder shaped body. The directrix of the cylinder can e.g. be an ellipse with a minor axis a with a length La and a major axis b with a length Lb.

The length Lb of the major axis b is equal to e or slightly smaller than e: $e-\Delta L < Lb < e$, where $\Delta L$. The length La of the minor axis a is smaller than Lb and preferably smaller than $e-\Delta L$: $La < e-\Delta L < Lb$. $\Delta L$ will vary in function of the tolerance affecting e and the length Lb. The value chosen for $\Delta L$ must guarantee that the pin 1074 when its great axis is aligned with the Z axis as seen on FIG. 25A can be positioned between the two parallelepipeds 1721 and 1722.

The position of the second body 1074 can be locked. The position of the second body 1074 can also be determined by an actuator such as e.g. an electric motor in the display tile. The electric motor can be remotely controlled. The position of the second body 1074 can also be determined by a simple mechanism in function of the orientation of said mechanism with respect to the local vertical (i.e. the direction of the local acceleration of gravitation being along the Y axis).

A purpose of the alignment mechanism of at least some embodiments of the present invention is to align adjacent display tiles and keep their respective display surface coplanar or at least keep the z-coordinate zA2 of a point of the first display surface of a tile in an interval [zA1−Δz, zA1+

Δz] where zA1 is the z coordinate of a point of the display surface of an adjacent tile and Δz is the difference in z-coordinate that can be tolerated between two adjacent tiles without causing unacceptable visual artefacts. A typical value for Δz is a millimeter or less (e.g. from 0.1 to 0.6 mm or 0.1 to 0.9 mm).

FIG. 27 illustrates a mechanism that can determine the position of the second body 1074 in function of its orientation and whether or not another kinematic pair already constrains the position of the display tile to which the second body 1074 is associated.

A user operable actuator such as a pushbutton 1120 can transmit a force F (when operated) to a first force transmitter such as a steel ball 1121 when the steel ball 1121 is in a first position POS1. The force is further transmitted to a second force transmitter such as a first lever means or lever 1122 which further transmits it to a rack 1123 at an angle such as perpendicular to the first lever 1122 by the intermediary of a lever 1100. The lever 1100 can rotate around an axis 1101 (the axis 1101 being fixed with respect to the corner element). A driver such as a pin 1122P on the lever 1122 fits in an opening in the lever 1100: when the lever 1122 translates under the action of the steel ball, it rotates the driver such as the lever 1100 around the axis 1101. A further driver such as a pin 1102 on the lever 1100 fits in an opening on rack 1123. When the further driver such as the pin 1102 rotates around the axis 1101 together with the lever 1100, it pushes on the rack 1123. When a force is applied to the rack 1123, it translates and forces the rotation of a pinion 1124. The pinion 1124 is coupled by means of a coupling preferably by a flexible coupling to the second body 1074 of a kinematic pair: if the pinion 1124 is rotated, the second body 1072 also rotates around the axis Ax. A resilient device such as a spring 1126 can return the second body 1074 to its initial position when no force is applied to the push button F.

Let us now look at the effect of gravity on the operation of the mechanism. In FIG. 27, the position of the first force transmitter such as the steel ball 1121 is its natural position under the effect of gravitation when gravitation is substantially parallel to the axis Oy as it is represented.

If the mechanism is rotated by 90 degrees to the right or to the left, the first force transmitter such as the steel ball 1121 will end up in position POS2 or POS3 and will not be able to transmit the force F applied on the actuator, e.g. by the user, such as the force applied to the push button 1120 will not be transmitted to the lever means or lever 1122. In that case, the second body 1074 will not rotate regardless of the force applied on the actuator such as push button 1120.

The mechanism is particularly advantageous when the first body and the second body of different kinematic pairs are coupled through the mechanism of FIG. 27 at the corner of a display tile as illustrated on FIGS. 28A-28F or for example on all four corners.

FIGS. 28A-28F show a perspective view of a rectangular display tile 1370 (FIG. 28A) as well as a top view (FIG. 28B) and four side views (FIGS. 28C, D, E, F) of the display tile 1370. Each display tile has four corners and four sides, two sides being parallel to each other and 90° to the remaining two parallel sides. A close up (FIG. 28G) of the top right corner of the display tile is also shown.

The close up (FIG. 28G) shows a corner element 1371 (like any of corner elements 1371B to D) that can be fastened to a corner of the display tile 1370.

The corner has a first side SC1 aligned with a side S1 of the display tile and a second side SC2 aligned with a side S2 of the display tile. The sides S1 and S2 are perpendicular to each other and meet to form a corner of the display tile.

The first side SC1 has the second body 1374 of a first kinematic pair and the side SC2 has the first body 1382 of another kinematic pair. The mechanism of FIG. 27 is built in the corner element 1371 (e.g. corner elements 1371, 1371B to D). The actuator such as the pushbutton 1120 of the mechanism is located within the first body 1382, i.e. in the space where the second body of the other kinematic pair can fit. The built-in mechanism determines the position of the second body 1374 as described earlier.

Each of the corner elements 1371, 1371B, 1371C and 1371D when fastened to the corners of the display tile 1370 has a first body and a second body of different kinematic pairs and a built-in mechanism to determine the position of the second body.

We will now describe how the corner elements 1371, 1371B to D and the alignment mechanism constrain the displacement of the display tile in a direction perpendicular to the display tile. This is possible without overdefining the tiling of two or more display tiles identical to 1370.

Figure 29A:
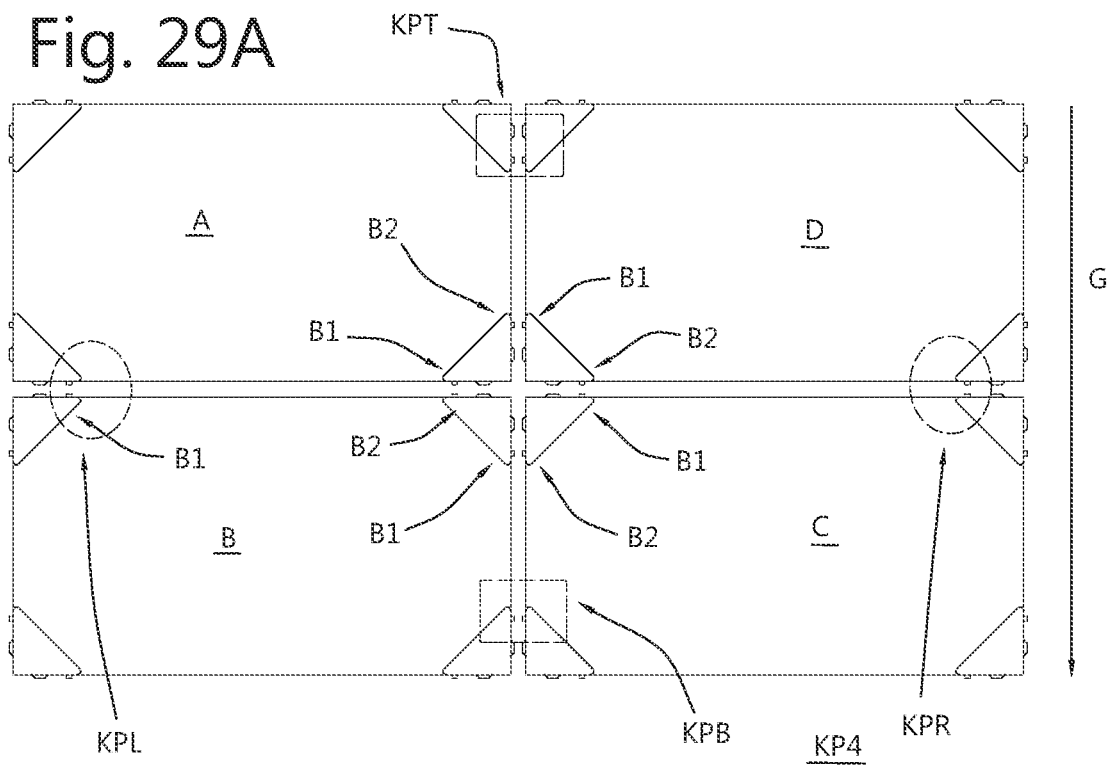
FIG. 29A shows an example of tiled display according to an embodiment of the present invention.

FIG. 29A shows a 2 by 2 tiled display as well as the position of the first and second bodies for the relevant corner elements.

Figure 29B:
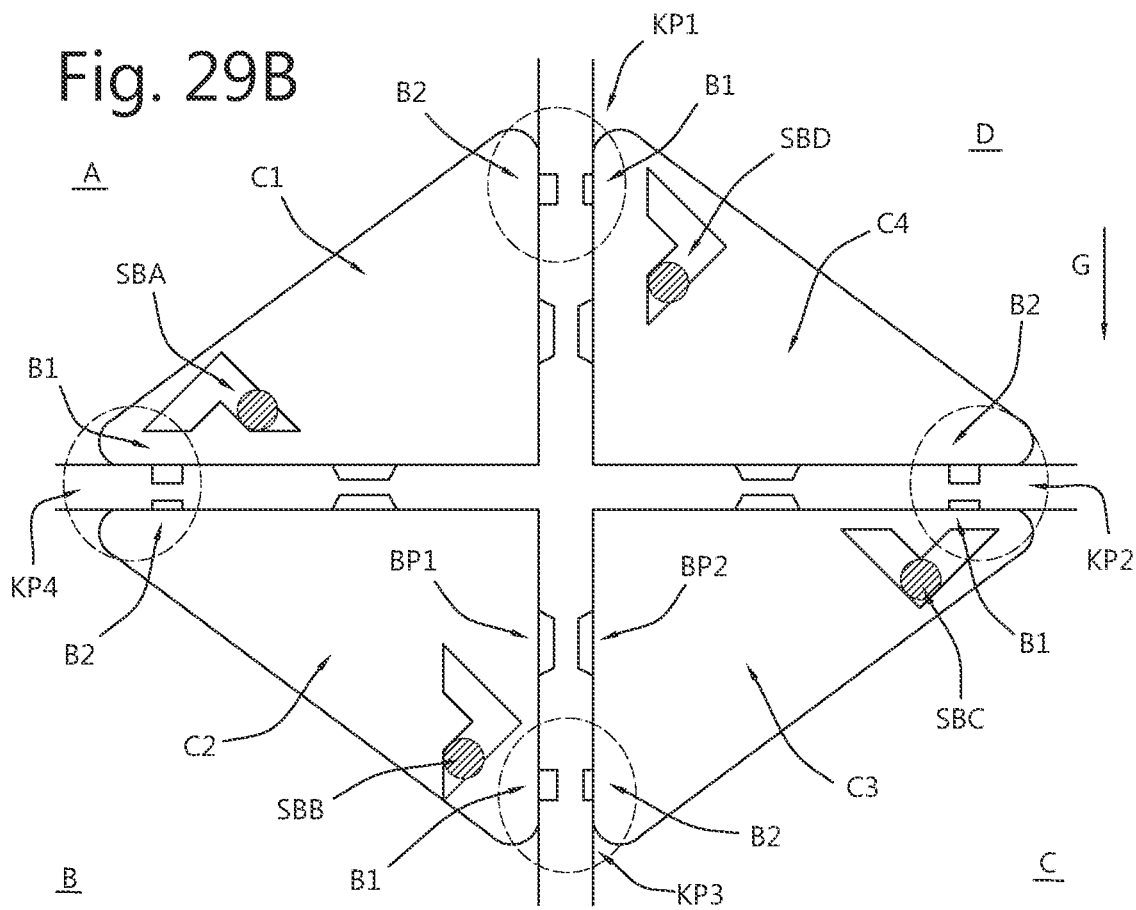
FIG. 29B shows part of the tiled display according to the embodiment of the present invention of FIG. 29A.

FIG. 29B is a close-up on the center of the tiled display where the four tiles A, B, C and D meet. The close-up shows the four kinetic pairs KPT, KPR, KPB, KPL (top, right, bottom and left) formed by the first body (B1) and second body (B2) of each corner element (C1, C2, C3, C4).

Let us turn our attention to the first force transmitter such as the steel ball SBA of the corner element C1: under the action of gravity, the first force transmitter such as the steel ball SBA occupies either POS2 or POS3 (see FIG. 27 for a definition of POS1, POS2 and POS3). The actuator such as the press button associated with the first body B1 of corner element C1 cannot transmit a force and therefore the second body B2 of the corner element C1 is in the active position: the kinematic pair KPT restricts the relative movement of tile A with respect to tile D.

Let us turn our attention to the first force transmitter such as the steel ball SBD of the corner element C4: under the action of gravity, the first force transmitter such as the steel ball SBD occupies either POS2 or POS3 (see FIG. 27 for a definition of POS1, POS2 and POS3). The actuator such as the press button associated with the first body B1 of corner element C4 cannot transmit a force and therefore the second body B2 of the corner element C1 is in the active position: the kinematic pair KPR restricts the relative movement of tile D with respect to tile C.

Let us turn our attention to the first force transmitter such as the steel ball SBC of the corner element C3: under the action of gravity, the first force transmitter such as the steel ball SBC occupies POS1 (see FIG. 27 for a definition of POS1, POS2 and POS3). The first force transmitter such as the press button associated with the first body B1 of corner element C3 can transmit a force. The second body B2 of the corner element C4 exerting a force on the user operable actuator such as the press button associated with the first body B1 of C3 and therefore the second body B2 of the corner element C1 is rotated in the inactive position: the kinematic pair KPB does NOT restrict the relative movement of tile C with respect to tile B.

Let us turn our attention to the first force transmitter such as the steel ball SBB of the corner element C2: under the action of gravity, steel ball SBB occupies either POS2 or POS3 (see FIG. 27 for a definition of POS1, POS2 and POS3). The user operable actuator such as the press button associated with the first body B1 of corner element C2 cannot transmit a force and therefore the second body B2 of the corner element C2 is in the active position: the kinematic pair KPL restricts the relative movement of tile C with respect to tile A.

The kinematic pairs KPR, KPL, KPB and KPT are active as well, i.e. no force being applied on the user operable actuator such as the press button 1120 of the corner elements on the external sides of the tiled display.

Without the proposed mechanism, the display tiles B and C would have each been constrained at four non collinear points instead of 3 thereby over-determining the system.

With the proposed mechanism, one of the kinetic pairs (e.g. KPB) between the tile B and the tile C is deactivated.

Bumpers are also visible on the corner elements (in particular, on FIG. 29B, two such bumpers have been highlighted: BP1 and BP2). As disclosed in PCT/EP2018/072352 "Adjustable Support Structure for Display Tile" which is incorporated herewith in its entirety, the bumpers in embodiments of the present determine the size of the seam (i.e. the minimum space between two adjacent tiles when they are assembled to form a tiled display). In FIG. 29B, a space larger than the nominal seam has been left for purpose of clarity only.

Figure 30A:
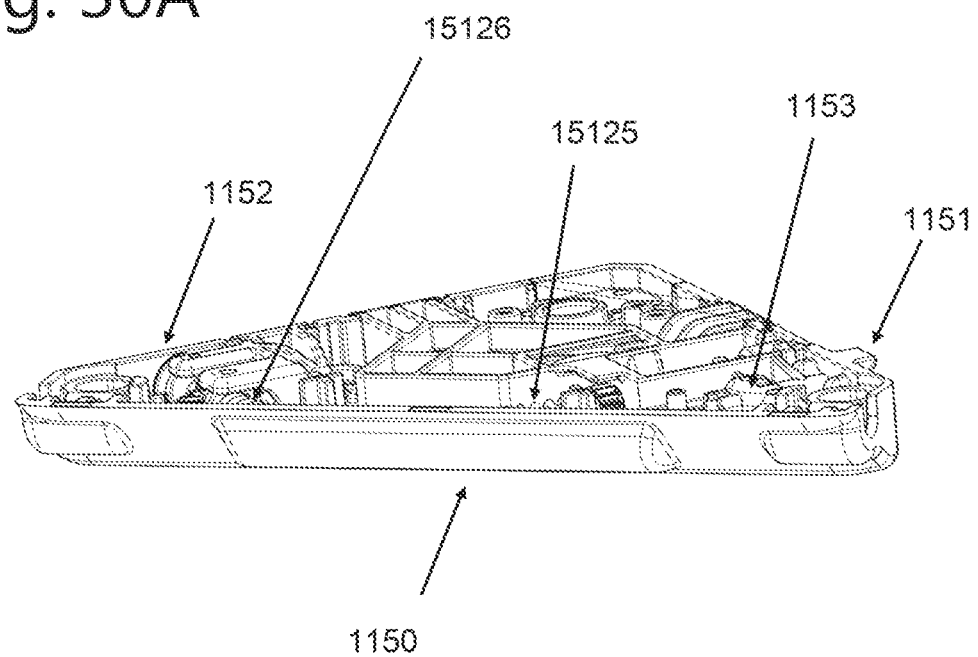
FIG. 30A shows a perspective view of a corner element mechanism according to an embodiment of the present invention in which a mechanism similar to the one illustrated of FIG. 27 can be mounted.

FIG. 30A shows a perspective view of (part of) a corner element 1150 and in which a mechanism (similar to the one illustrated on FIG. 27) can be mounted. The perspective view shows the first body 1151 of a first kinematic pair and (the position) of the second body 1152 of another kinematic pair. It also shows the cavity 1153 wherein the first force transmitter such as the steel ball 1121 is contained as well as the spring and flexible transmission 15125 and 15126 that can be used to change the state or position of the second body 1152.

Figure 30B:
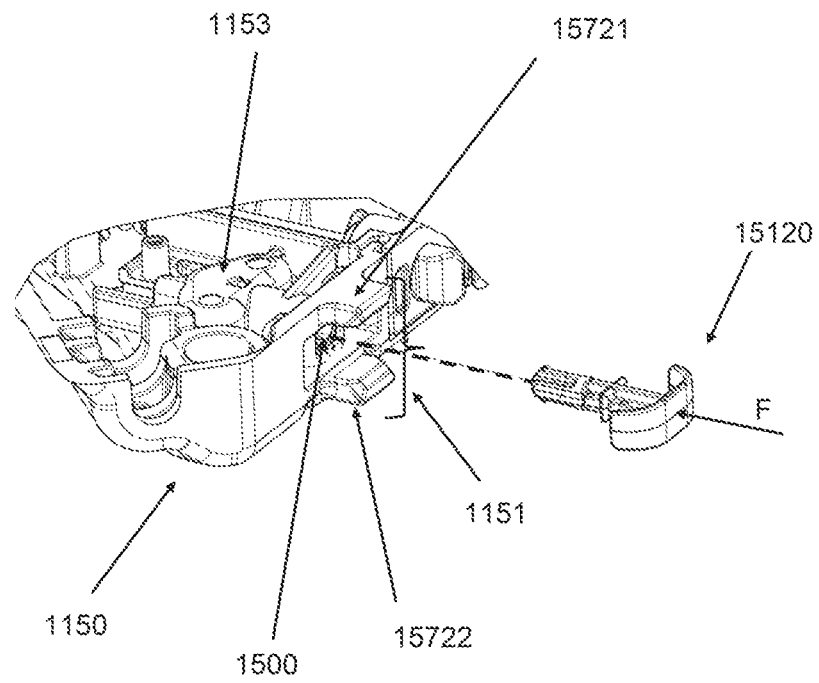
FIG. 30B shows a perspective view of a part of the same corner element of FIG. 30a from a different perspective.

FIG. 30B shows a perspective view of part of the same corner element 1150 from a different perspective. The first body 1151 of the first kinematic pair is shown with tapered first and second elements 15721 and 15722. As will be understood by the one skilled in the art, the tapering can help with the correct positioning of the second body of a kinematic pair between the first and second elements 15721 and 15722 when two tiles are aligned with each other. FIG. 30B is also a partially exploded view that shows the first force transmitter such as the push button 15120 and the opening 1500 in which the push button is fitted between the first and second elements. The V-shaped cavity 1153 that contains the steel ball that can transmit the force F exerted on the push button 15120 to the rest of the mechanism is also visible.

Figure 30C:
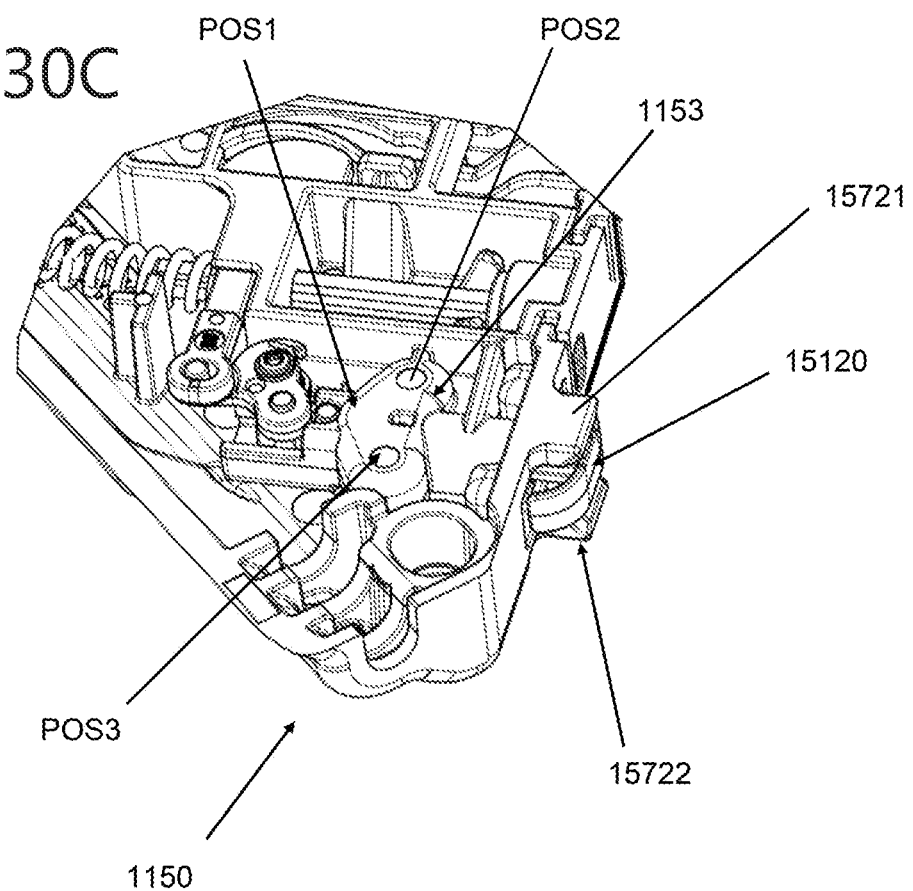
FIG. 30C shows a perspective view of a part of the same corner element as in FIG. 30a with the pushbutton engaged in an opening.

FIG. 30C shows a perspective view of part of the same corner element 1150 with the user operable actuator such as a pushbutton 15120 engaged in the opening 1500 (visible in FIG. 30B). The three main positions of user operable actuator such as the steel ball (POS1, POS2, POS3) in the V-shaped cavity 1153 are indicated (the arrows are only indicative: the positions POS1, POS2 and POS3 being inside the cavity 1153).

Figure 30D:
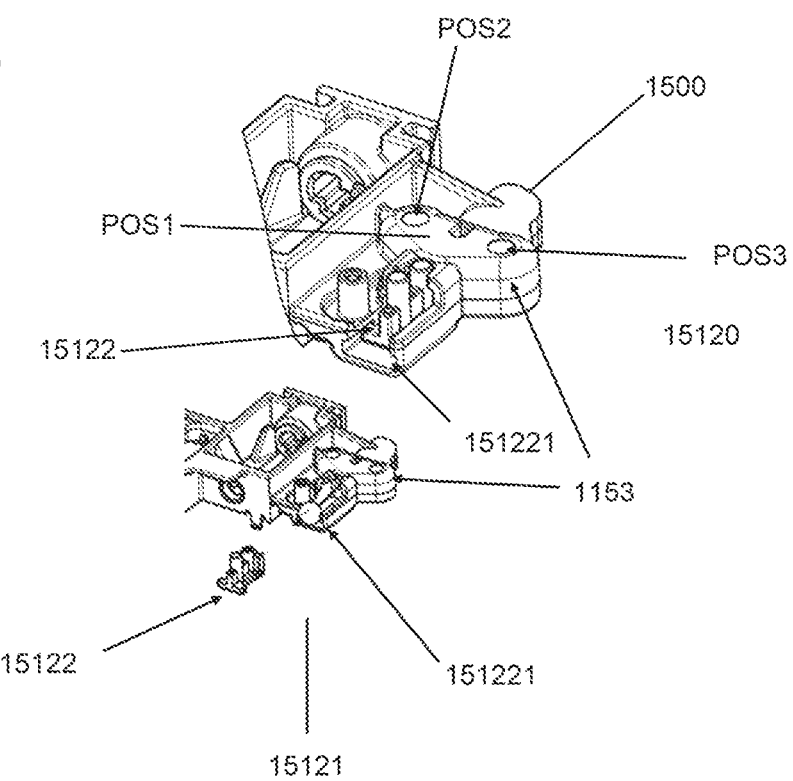
FIG. 30D in the lower part shows a partially exploded view of a mechanism according to an embodiment of the present invention with a steel ball and a first lever. The upper part of FIG. 15d shows the lever when it has been inserted in guiding rails leading to a cavity.

The lower part of FIG. 30D shows a partially exploded view of the mechanism with the first force transmitter such as the steel ball 15121 and the first lever 15122.

The upper part of FIG. 30D shows the lever when it has been inserted in guiding rails 151221 leading to the cavity 1153. As described earlier, when a force is applied to the user operable actuator such as the push button 15120, it glides into the cavity. If the steel ball 15121 is in its first position POS1 (i.e. on an axis joining the user operable actuator such as the pushbutton and the first lever (1122 in FIG. 27 and 15122 in FIG. 30D), it will transmit the force applied on the push button 15120 to the first lever 15122.

Figure 30E:
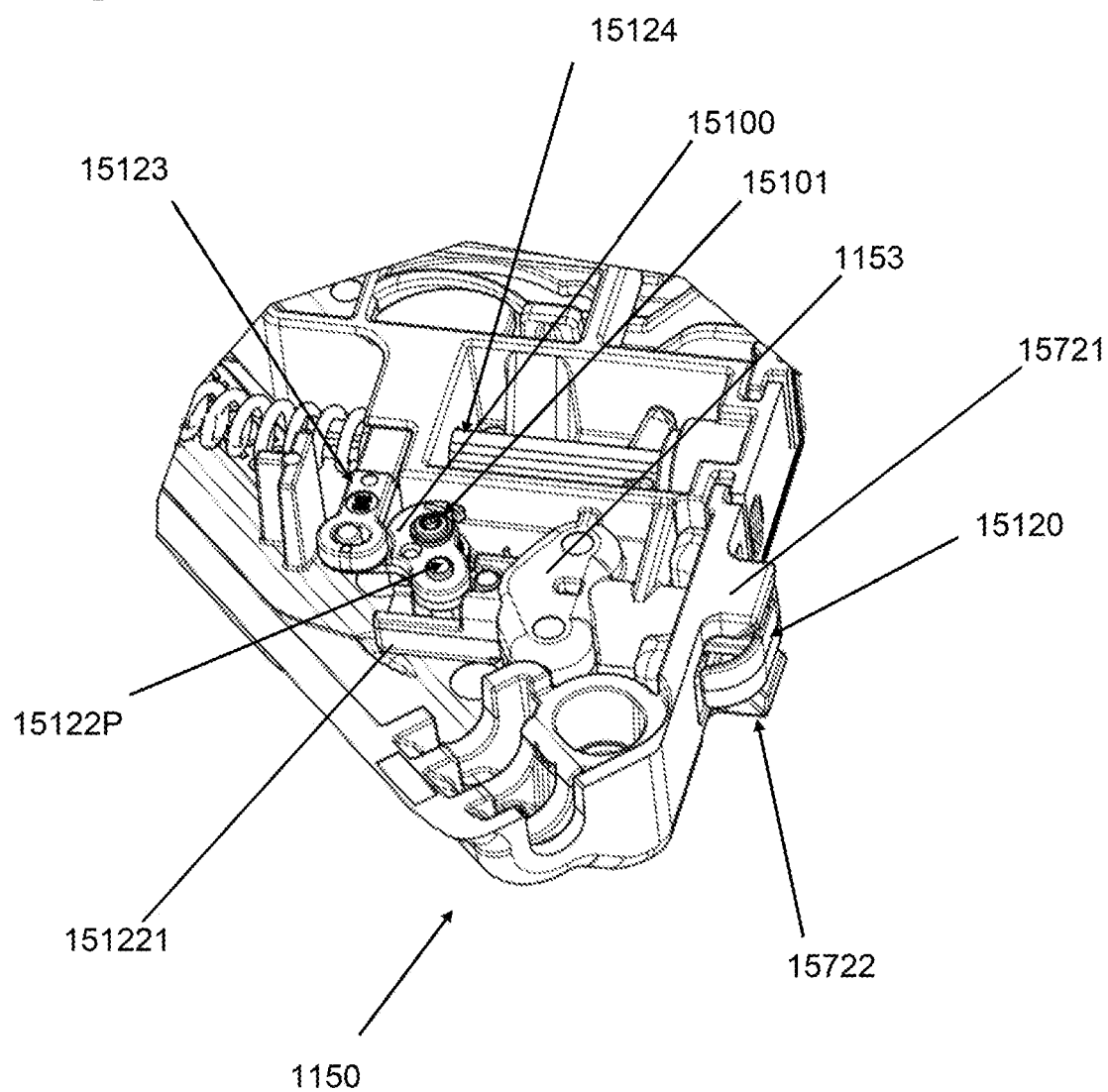
FIG. 30E shows how a force is transmitted to a rack and pinion by means of an intermediary lever according to an embodiment of the present invention.

FIG. 30E shows how the force is transmitted to a rack 15123 and pinion 15124 by means of an intermediary lever 15100 that rotates around an axis 15101 (fix with respect to the corner element 150). The first lever 15122 interacts with the intermediary lever 15100 by means of a further driver such as a pin 15122P that fits in an opening in the intermediary lever 15100. The intermediary lever 15100 transmits the force to the rack 15123 by means of a pin 15102 (see FIG. 30F) that fits in an opening 151231 (see FIG. 30F) on the rack 15123.

Figure 30F:
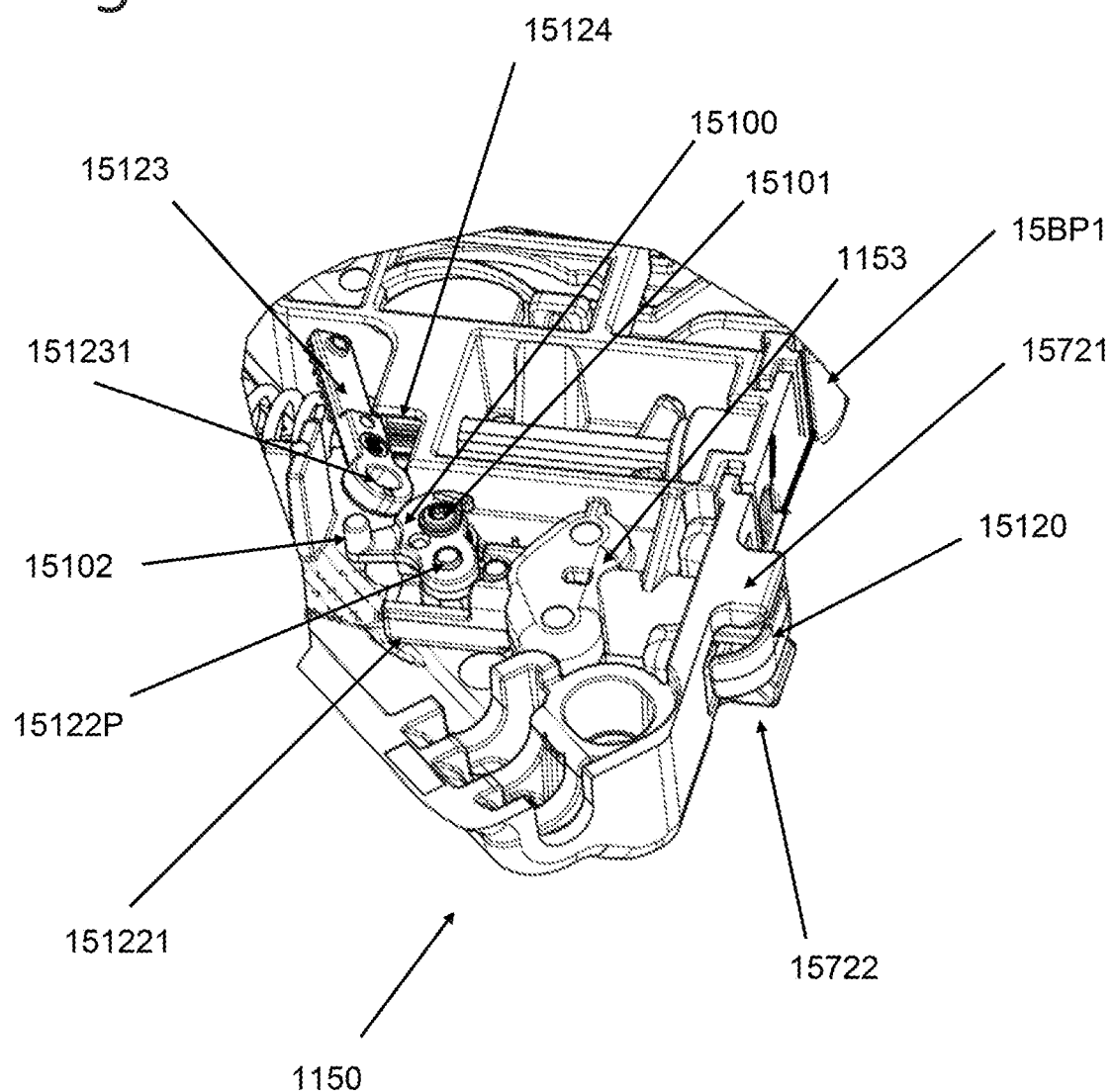
FIG. 30F shows a partially exploded view with a rack removed from its nominal operational position in the mechanism according to an embodiment of the present invention.

FIG. 30F shows a partially exploded view with the rack 15123 removed from its nominal position in the mechanism.

Figure 30G:
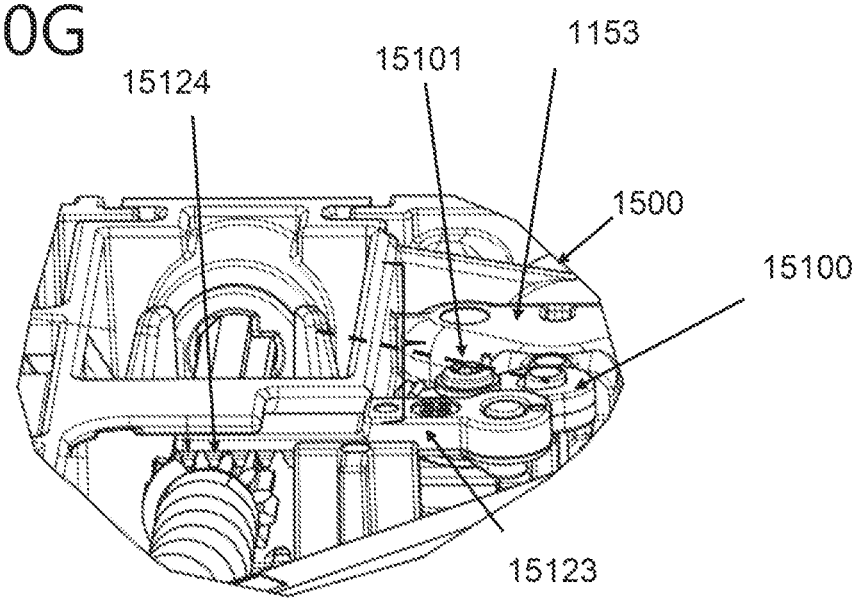
FIG. 30G shows a detail of a rack and pinion mechanism according to an embodiment of the present invention.

FIG. 30G shows a detail of the rack 15123 and pinion 15124 mechanism.

Figure 30H:
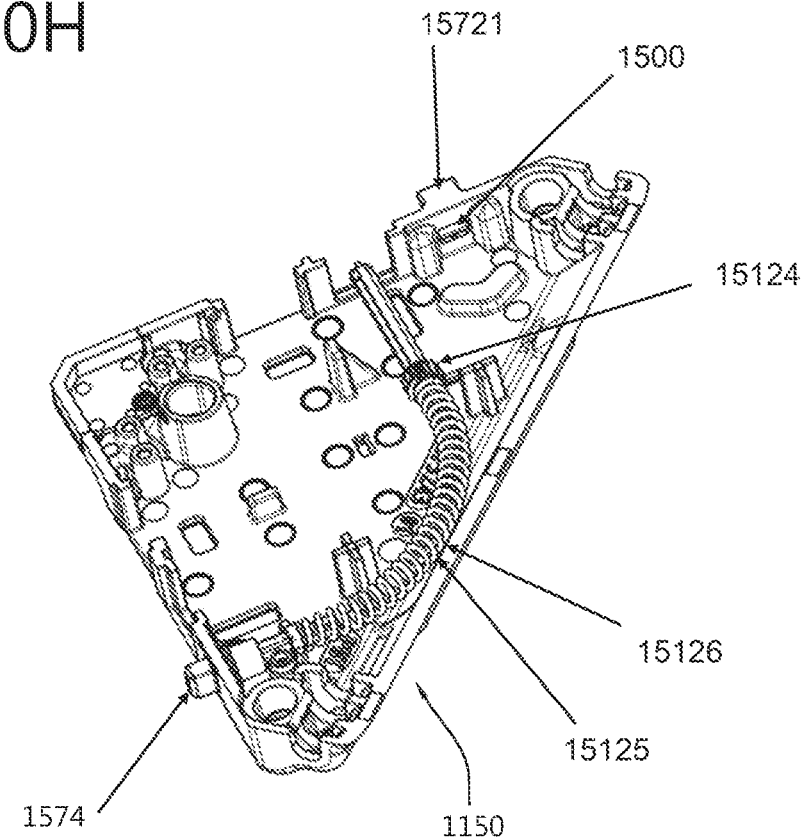
FIG. 30H shows part of a mechanism according to an embodiment of the present invention in a corner element from a different perspective.

FIG. 30H shows part of the mechanism in the corner element from a different perspective. The second body 1574 of another kinematic pair can be seen coupled to the flexible connection 15125 and a resilient element such as a spring 15126. The opening 1500 is visible as well as element 15721 of the first body 1151 of a first kinematic pair.

FIG. 30I shows a different perspective of the entire mechanism. Bumper element 15BP2 is visible on the same side as the second body 1574.

Figure 31A:
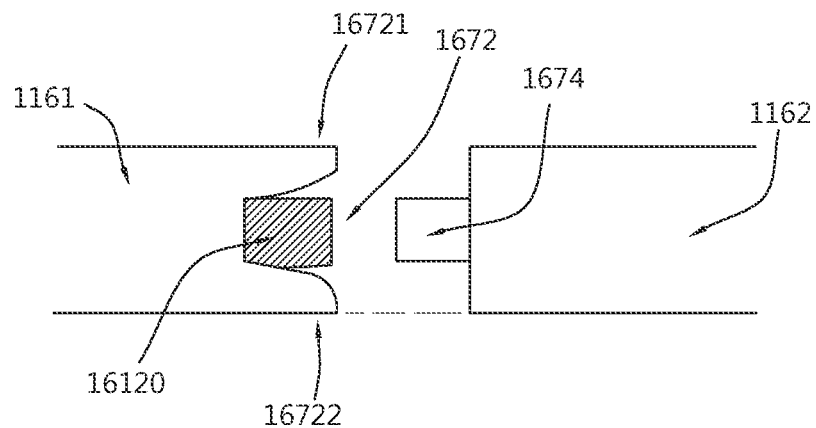
FIGS. 31A and 31B illustrate how the second body of a first corner element interacts with the first body of a second corner element and the push button of the second corner element according to an embodiment of the present invention.
Figure 31B:
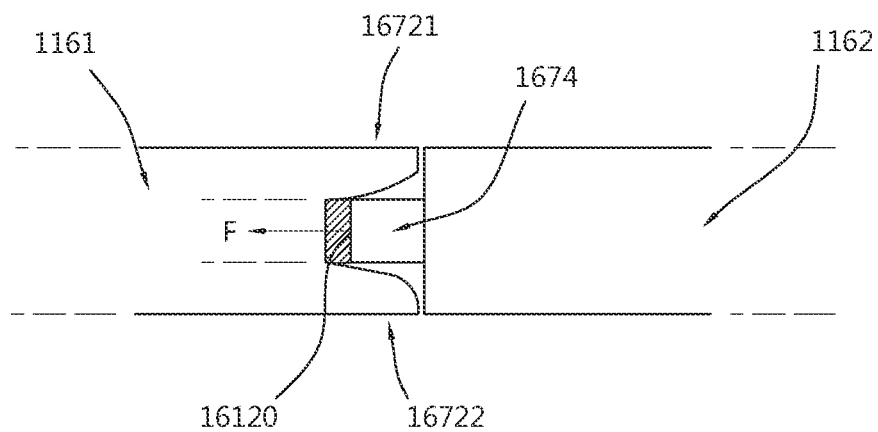

FIGS. 31A and 31B further illustrate how the second body 1674 of a second corner element 1162 interacts with the first body 1672 of a first corner element 1161 and the user operable push button 16120 of the first corner element.

FIG. 31A shows the situation before the second body 1674 engages in the first body 1672 (i.e. before it occupies the space between first element 16721 and second element 16722).

Passive or active resilient devices such as springs (an example of a passive device) not shown on the figures can return the user operable actuator such as the pushbutton and lever elements to its starting position when no external force is applied. This can be adopted in any of the embodiments described with reference to FIGS. 22 to 32B.

FIG. 31B illustrates the interaction between the user operable actuator such as the pushbutton 16120 of the first corner element 1161 and the second body 1674 of the second corner element 1162, the second body 1674 pushes on the user operable actuator such as the pushbutton 16120 with a force F and as a result, the user operable actuator such as the pushbutton enters further into the first corner element 1161.

Figure 32A:
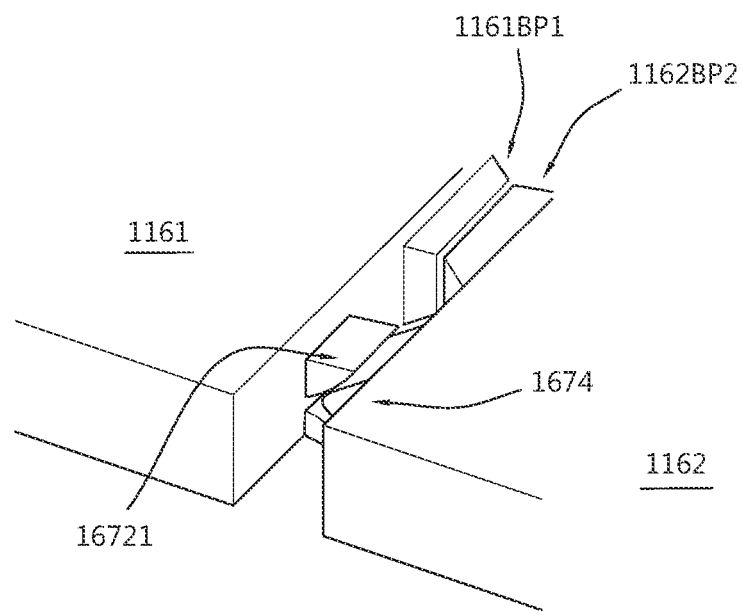
FIGS. 32A and 32B show how the minimum distance between corner elements can be determined by bumper elements according to an embodiment of the present invention.
Figure 32B:
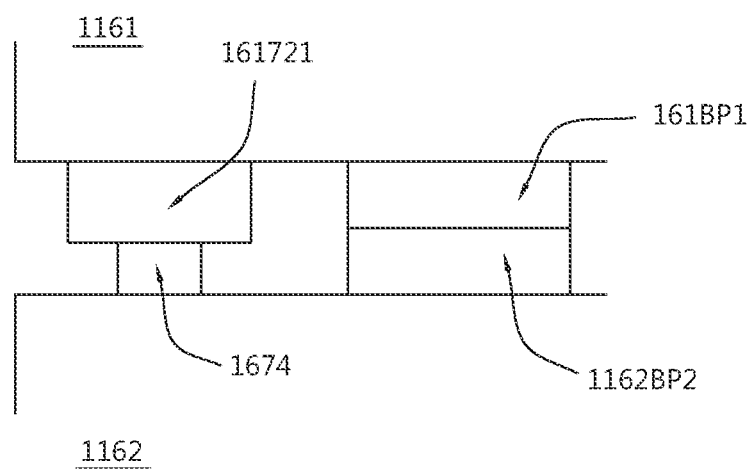

The minimum distance between the corner elements 1161 and 1162 is determined by the bumper elements as sketched on FIGS. 32A and 32B.

The invention claimed is:

1. A method of constructing a tiled display having an alignment mechanism, the tiled display having a first and a second display tile, the first and second display tiles lying in a display plane and each having a first and second side respectively, wherein a first body of a first kinematic pair and a second body of a second kinematic pair are formed in the first side of the first display tile and a second body of the first kinematic pair and a first body of the second kinematic pair are formed in the second side of the second display tile, the tiled display is characterized in that the first and second kinematic pairs are able to impose a constraint on a relative movement of the first body of the first kinematic pair or the second kinematic pair with the corresponding second body in a direction perpendicular to the display plane,
   wherein the first display tile and the second display tile are rectangular having four corners and a display surface, each corner of the four corners of the first display tile and the second display tile having one of first to fourth corner elements that are fastened to back sides of one of the first to fourth corners of the display tile, the rectangular display tile having sides (S1) and (S2) that are perpendicular to each other and meet to form one of the first to fourth corners of the respective display tile; and one of the first to fourth corner elements has a first side (SC1) aligned with the side (S1) of the respective display tile and a second side (SC2) aligned with the side (S2) of the respective display tile, the first side (SC1) of the corner element having the second body of the first kinematic pair and the second side (SC2) of the corner element has the first body of the second kinematic pair, each of the first to fourth corner elements when fastened to one of the first to fourth corners of the respective display tile has the first body and the second body of different kinematic pairs of the first kinematic pair and the second kinematic pair and a built-in mechanism to determine a position of the second body, the method comprising:

aligning the first display tile and the second display tile using the first kinematic pair and the second kinematic pair, wherein the built-in mechanism has an actuator located within the first body, in a space where the second body of the other kinematic pair is configured to fit, wherein the actuator is a user operable actuator for transmitting a force when operated to a first force transmitter when the actuator is in a first position; and further comprising transmitting the force to a second force transmitter which further transmits the force to a rack, the rack being adapted to translate and to force the rotation of a pinion.

2. The method according to claim 1, wherein first to fourth corner elements and an alignment mechanism constrain the displacement of each display tile in a direction perpendicular to the plane of the surfaces of the display tiles without overdefining the tiling of two or more display tiles.

3. The method according to claim 1, wherein the first body is made with a first element and a second element on the first side, the first and second elements delimiting a space in between them, and into which space the second body fits.

4. The method according to claim 3, wherein the first and second elements are formed as plate like elements or rectangular parallelepipeds, which extend away from the respective first and second sides, or wherein the first and second elements are formed extending parallel to a display surface of a first tile, and also extending in a direction perpendicular to the Z direction.

5. The method according to claim 1, further comprising coupling the pinion to the second body of a kinematic pair, or comprising rotating the pinion, so that the second body also rotates around an axis.

6. The method according to claim 1, further comprising a resilient device for returning the second body to its initial position when no force is applied to the actuator, or further comprising deactivating a kinematic pair by placing the second body in a second position.

7. The method according to claim 1, wherein when the position of the first force transmitter is in a second or third position it cannot transmit the force applied on the actuator and the second body will not rotate, or wherein under the action of gravity, the first force transmitter occupies either a second or third position and the actuator cannot transmit a force and the second body of a corner element is in the active position, a kinematic pair restricts the relative movement of a first tile and an adjacent second tile, or adapted so that under the action of gravity, the first force transmitter occupies its natural position and can transmit a force and a kinematic pair does not restrict the relative movement of first and second tiles.

8. A method of constructing a tiled display having an alignment mechanism, the tiled display having a first and a second display tile, the first and second display tiles lying in a display plane and each having a first and second side respectively, wherein a first body of a first kinematic pair and a second body of a second kinematic pair are formed in the first side of the first display tile and a second body of the first kinematic pair and a first body of the second kinematic pair are formed in the second side of the second display tile, the tiled display is characterized in that the first and second kinematic pairs are able to impose a constraint on a relative movement of the first body and the second body in a direction perpendicular to the display plane, each display tile being fastened to a support structure of a tiled display using a first substructure, adjacent display tiles in the tiled display being separated by a nominal seam, the first support substructure being mechanically linked to the support structure, the method comprising:

moving one or more display tiles in a first movement in a plane parallel to the nominal plane (XY) of the tiled display to form a gap (G) between adjacent display tiles obtained by moving one or more display tiles from a first position (P1) to a second position (P2) and fixing the position of the first support substructure in the second position, wherein the gap (G) is larger than the nominal seam.

9. The method according to claim 1, wherein the first and second kinematic pairs can be deactivated independently of each other.

10. The method according to claim 8, wherein the first movement is driven by a motor or a hand crank or a key.

11. The method according to claim 8, wherein the first movement includes a transform from a rotary movement into a translation of the first support substructure.

12. The method according to claim 8, further comprising self-aligning the display tile using one or more contact elements for exerting a force on an adjacent display tile.

13. The method according to claim 8, further comprising fastening or mating the display tile to the first support substructure by the intermediary of a second support substructure, further comprising a further movement for moving the display tile outside of the display plane.

14. The method according to claim 13, wherein the first support substructures is fastened to the support structure by the intermediary of a third support substructure which is fastened to the support structure by means of an alignment mechanism, the alignment mechanism aligning adjacent display tiles in the Z direction.

15. A method of constructing a tiled display having an alignment mechanism, the tiled display having a first and a second display tile, the first and second display tiles lying in a display plane and each having a first and second side respectively, wherein a first body of a first kinematic pair and a second body of a second kinematic pair are formed in the first side of the first display tile and a second body of the first kinematic pair and a first body of the second kinematic pair are formed in the second side of the second display tile, the tiled display is characterized in that the first and second kinematic pairs are able to impose a constraint on a relative movement of the first body and the second body in a direction perpendicular to the display plane,
- further comprising support substructures each for fastening a display tile to a support structure of a tiled display, adjacent first and second display tiles in the tiled display being separated by a nominal seam, the method comprising:
- aligning the first display tile and the second display tile using the first kinematic pair and the second kinematic pair,
- wherein a first support substructure is linked to the support structure by means of a first mechanism allowing movements of each display tile in a plane parallel to the nominal plane (XY) of the tiled display to form a gap (G) between adjacent display tiles obtained by moving one or more display tiles from a first position (P1) to a second position (P2) and a second mechanism fixing the position of the first support substructure in the second position, wherein the gap (G) is larger than the nominal seam.

16. The method according to claim 15, wherein the first mechanism comprises an actuator and a driver, the actuator being for exerting a force on the first support substructure by the intermediary of the driver.

17. The method according to claim 16, wherein the actuator is a quadrant gear and/or the driver is a pin.

18. The method according to claim 15, wherein the second mechanism comprises a lever or hammer that can take two positions and a second driver pin fastened to the first support substructure: in a first position, the hammer cannot prevent free movement of the second driver pin; and in a second position (H2), the hammer prevents free movement of the second driver pin.

* * * * *